United States Patent
Nitayama et al.

(12) 
(10) Patent No.: US 6,720,606 B1
(45) Date of Patent: Apr. 13, 2004

(54) DYNAMIC SEMICONDUCTOR MEMORY DEVICE HAVING A TRENCH CAPACITOR

(75) Inventors: Akihiro Nitayama, Kawasaki (JP); Katsuhiko Hieda, Yokohama (JP); Shigeru Ishibashi, Yokohama (JP); Yusuke Kohyama, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/660,390

(22) Filed: Sep. 12, 2000

Related U.S. Application Data

(63) Continuation-in-part of application No. 08/982,478, filed on Dec. 2, 1997, now Pat. No. 6,236,079.

(51) Int. Cl.[7] .................. H01L 27/108; H01L 29/76; H01L 29/94; H01L 31/119
(52) U.S. Cl. ........................ 257/306; 257/301
(58) Field of Search ................. 257/301, 305

(56) References Cited

U.S. PATENT DOCUMENTS

| | | |
|---|---|---|
| 4,763,179 A | 8/1988 | Tsubouchi et al. |
| 4,801,988 A | 1/1989 | Kenney |
| 4,816,884 A | 3/1989 | Hwang et al. |
| 4,830,978 A | 5/1989 | Teng et al. |
| 4,830,981 A | 5/1989 | Baglee et al. |
| 4,833,516 A | 5/1989 | Hwang et al. |
| 4,853,348 A | 8/1989 | Tsubouchi et al. |
| 4,942,554 A | 7/1990 | Kircher et al. |
| 4,953,125 A | 8/1990 | Okumura et al. |
| 4,988,637 A | 1/1991 | Dhong et al. |
| 5,034,787 A | 7/1991 | Dhong et al. |
| 5,065,273 A | 11/1991 | Rajeevakumar |
| 5,107,459 A | 4/1992 | Chu et al. |

(List continued on next page.)

FOREIGN PATENT DOCUMENTS

| | | |
|---|---|---|
| JP | 6204429 A | 7/1994 |
| JP | 8064779 A | 3/1996 |

OTHER PUBLICATIONS

"Fabricating One Semiconductor Contact Stud Borderless to Another", Sep. 1991, IBM Technical Disclosure Bulletin, vol. 34, No. 4B, pp. 277–279.*

*Primary Examiner*—Wael Fahmy
*Assistant Examiner*—Howard Weiss
(74) *Attorney, Agent, or Firm*—Banner & Witcoff, Ltd.

(57) ABSTRACT

A semiconductor memory device has a semiconductor substrate, a first semiconductor region of a first conduction type formed on the semiconductor substrate, a second semiconductor region of a second conduction type opposite to the first conduction type, formed on the first semiconductor region. A trench capacitors having a trench extends through the first semiconductor region and the second semiconductor region, and is formed such that its top does not reach a top surface of the second semiconductor region, and the trench is formed therein with a conductive trench fill. A pair of gate electrodes is formed on the second semiconductor region, overlying the trench capacitor. A pair of insulating layers is formed to cover each of the pair of gate electrodes. A conductive layer is formed between the pair of insulating layers to self-align to each of the pair of insulating layers. The conductive layer has a leading end insulated from the second semiconductor region and reaching the interior of the second semiconductor region, and electrically connected to the conductive trench fill of the trench capacitor. A pair of third semiconductor regions of the first conduction type are formed in the second semiconductor region, and positioned opposite to each other with respect to the conductive layer. Each of the third semiconductor regions is directly in contact with the conductive layer, and constitutes either a source or a drain of transistors having one of the pair of gate electrodes, respectively. The pair of third semiconductor regions is formed substantially to a uniform depth.

12 Claims, 54 Drawing Sheets

U.S. PATENT DOCUMENTS

| | | |
|---|---|---|
| 5,177,576 A | 1/1993 | Kimura et al. |
| 5,216,266 A | 6/1993 | Ozaki |
| 5,250,831 A * | 10/1993 | Ishii .......................... 257/305 |
| 5,316,962 A | 5/1994 | Matsuo et al. |
| 5,336,912 A | 8/1994 | Ohtsuki |
| 5,372,966 A | 12/1994 | Kohyama |
| 5,395,770 A | 3/1995 | Miki et al. |
| 5,462,767 A | 10/1995 | Yamazaki et al. |
| 5,519,236 A | 5/1996 | Ozaki |
| 5,521,115 A * | 5/1996 | Park et al. ................ 438/243 |
| 5,563,085 A | 10/1996 | Kohyama |
| 5,576,566 A | 11/1996 | Kenney |
| 5,606,188 A * | 2/1997 | Bronner et al. ............ 257/301 |
| 5,675,176 A * | 10/1997 | Ushiku et al. .............. 257/415 |
| 5,698,878 A | 12/1997 | Miyashita et al. |
| 5,843,820 A | 12/1998 | Lu |
| 5,930,107 A | 7/1999 | Rajeevakumar |
| 6,236,079 B1 * | 5/2001 | Nitayama et al. .......... 257/304 |

* cited by examiner

Prior Art

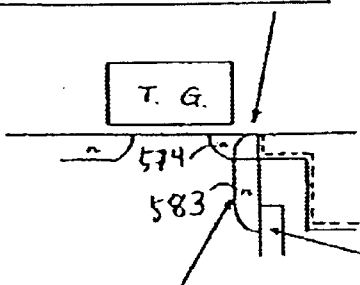
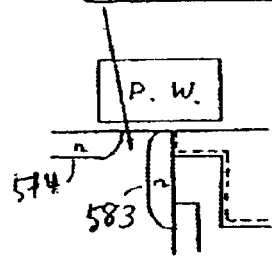
Figure 2A — Effect Of SN Junction On T.G.
Figure 2B — Discontinuity Of XA-SN By P.W.
BS Junction Leak Caused By Defects, Stress & Interface
Defects & Stress Caused By AA Ox & Collar Ox Volume Expansion At DT-AA Intersection @ AA Ox, Sac.Ox, GateOx, SWox
Prior Art

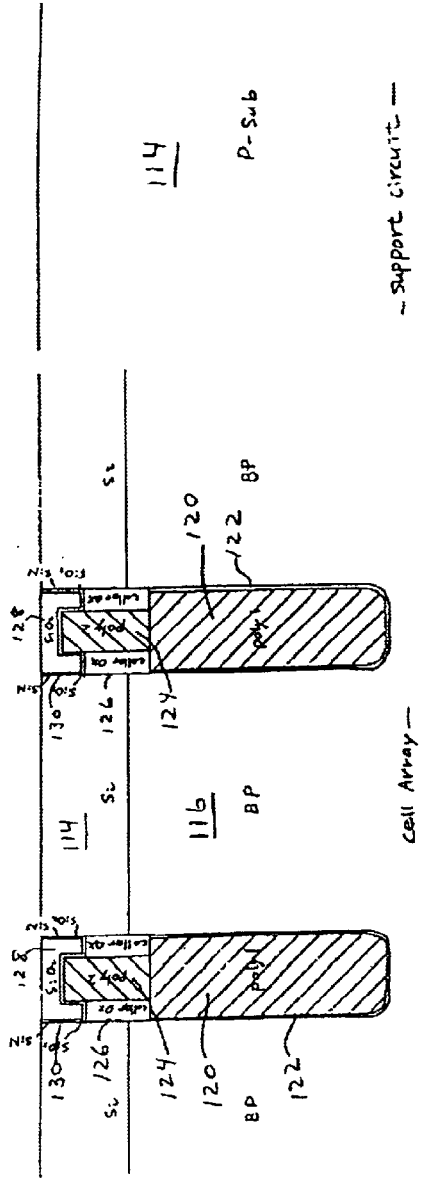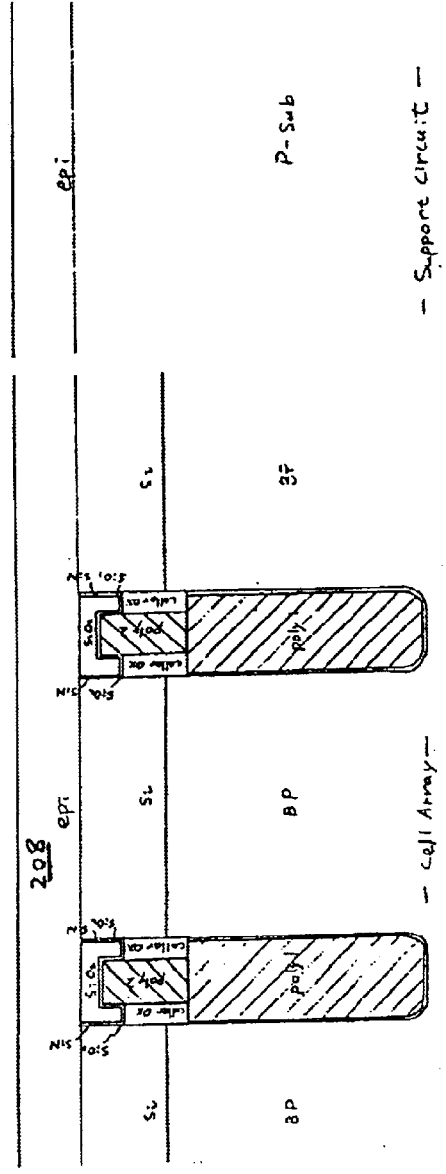

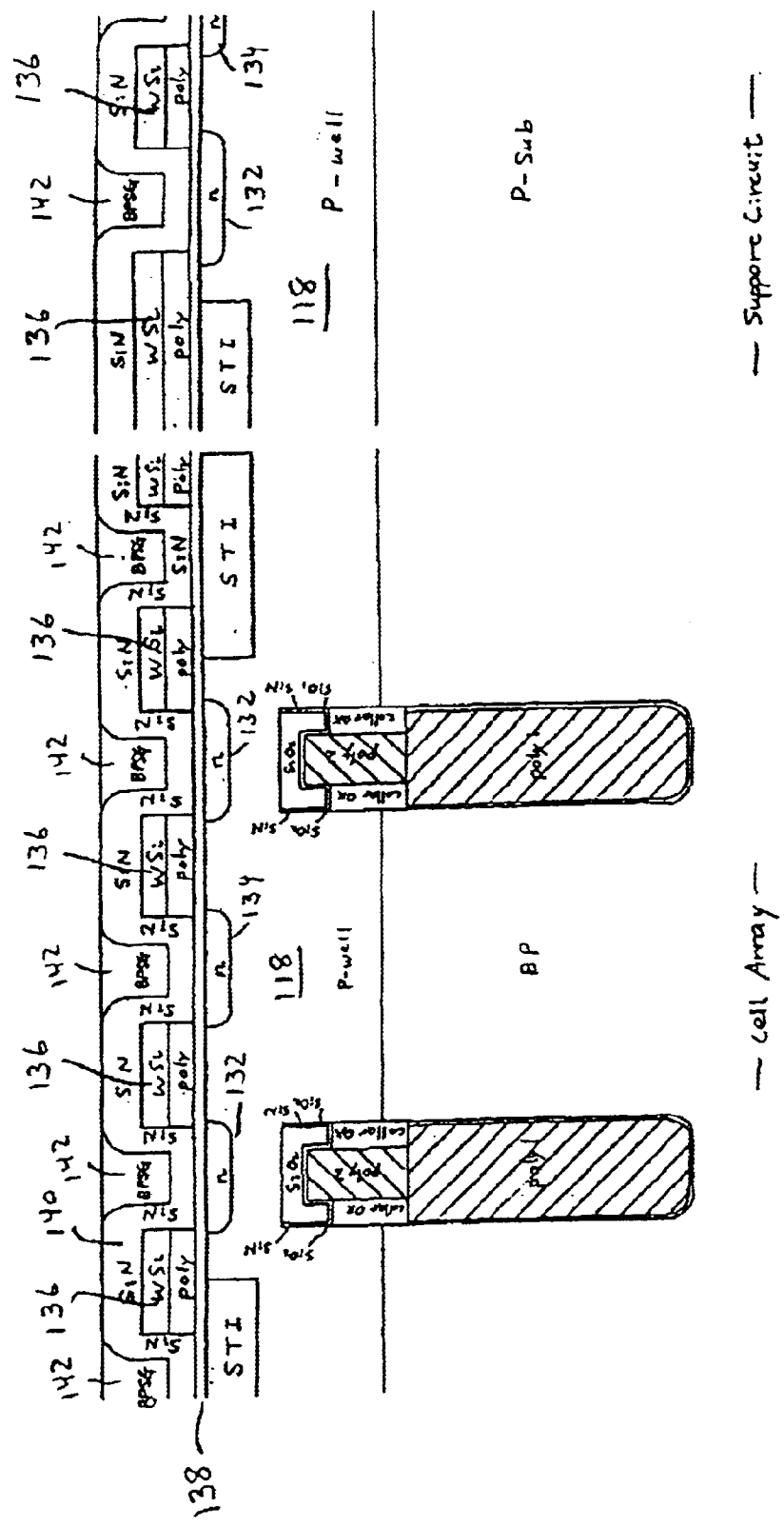

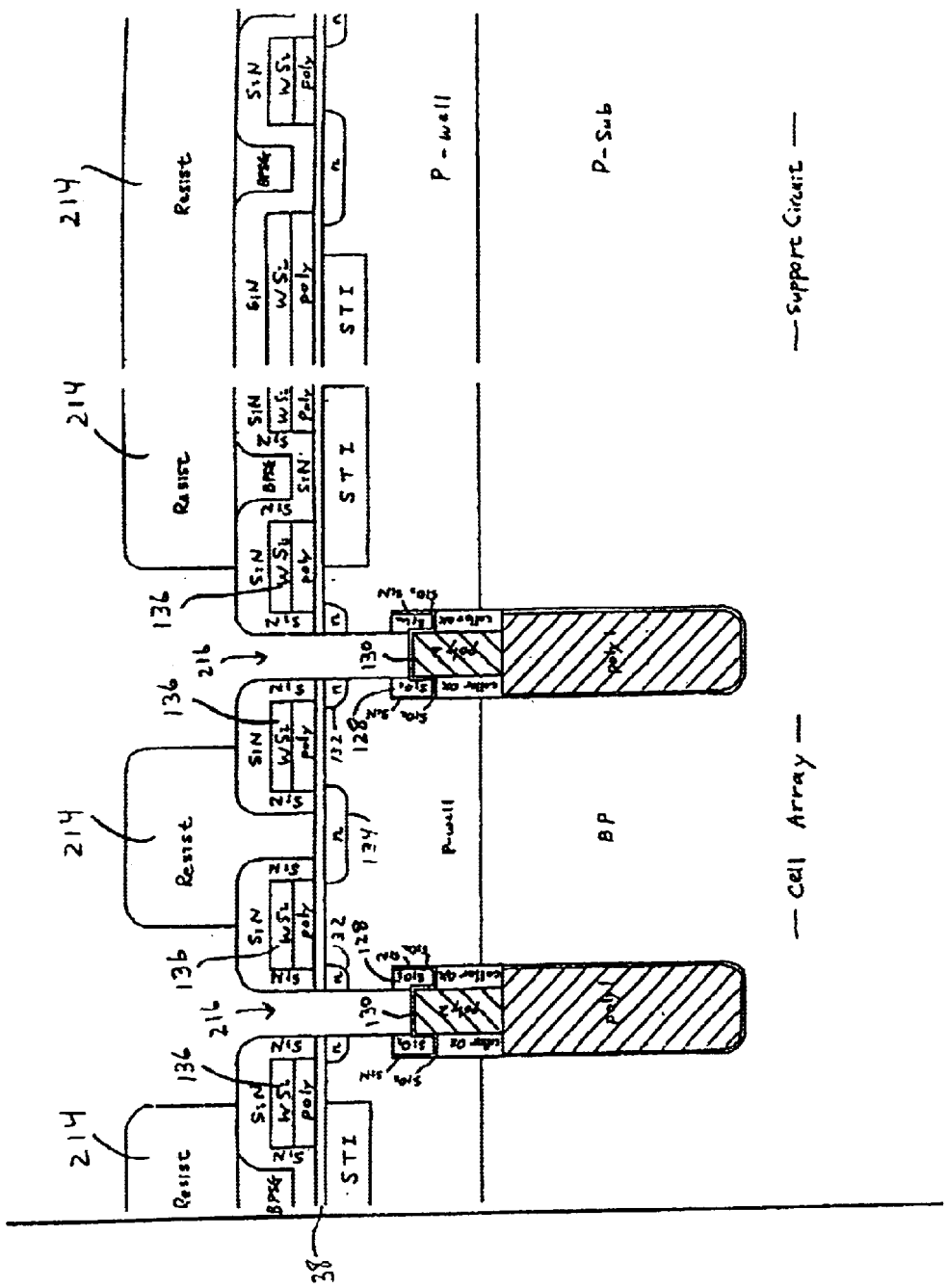

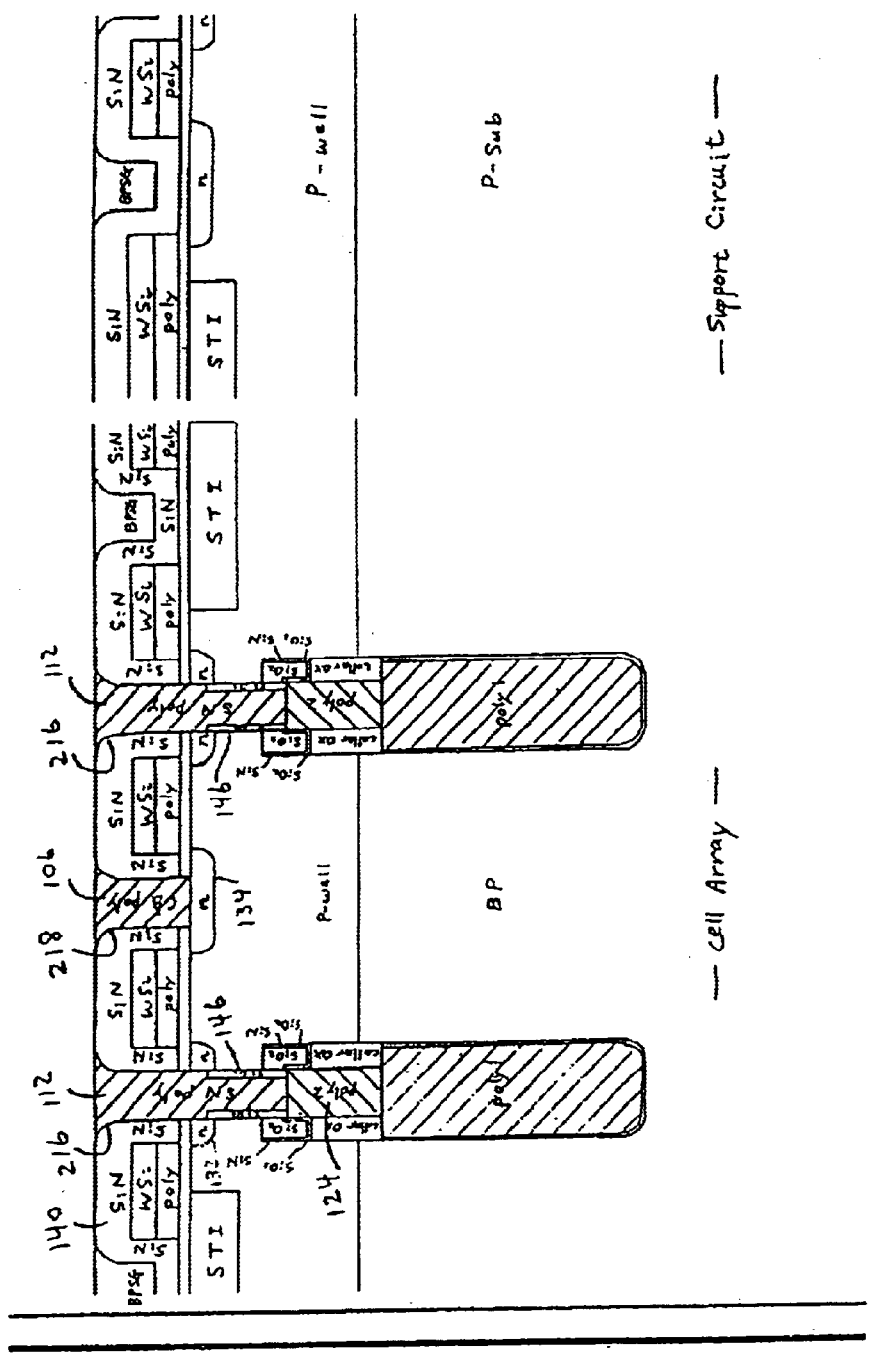

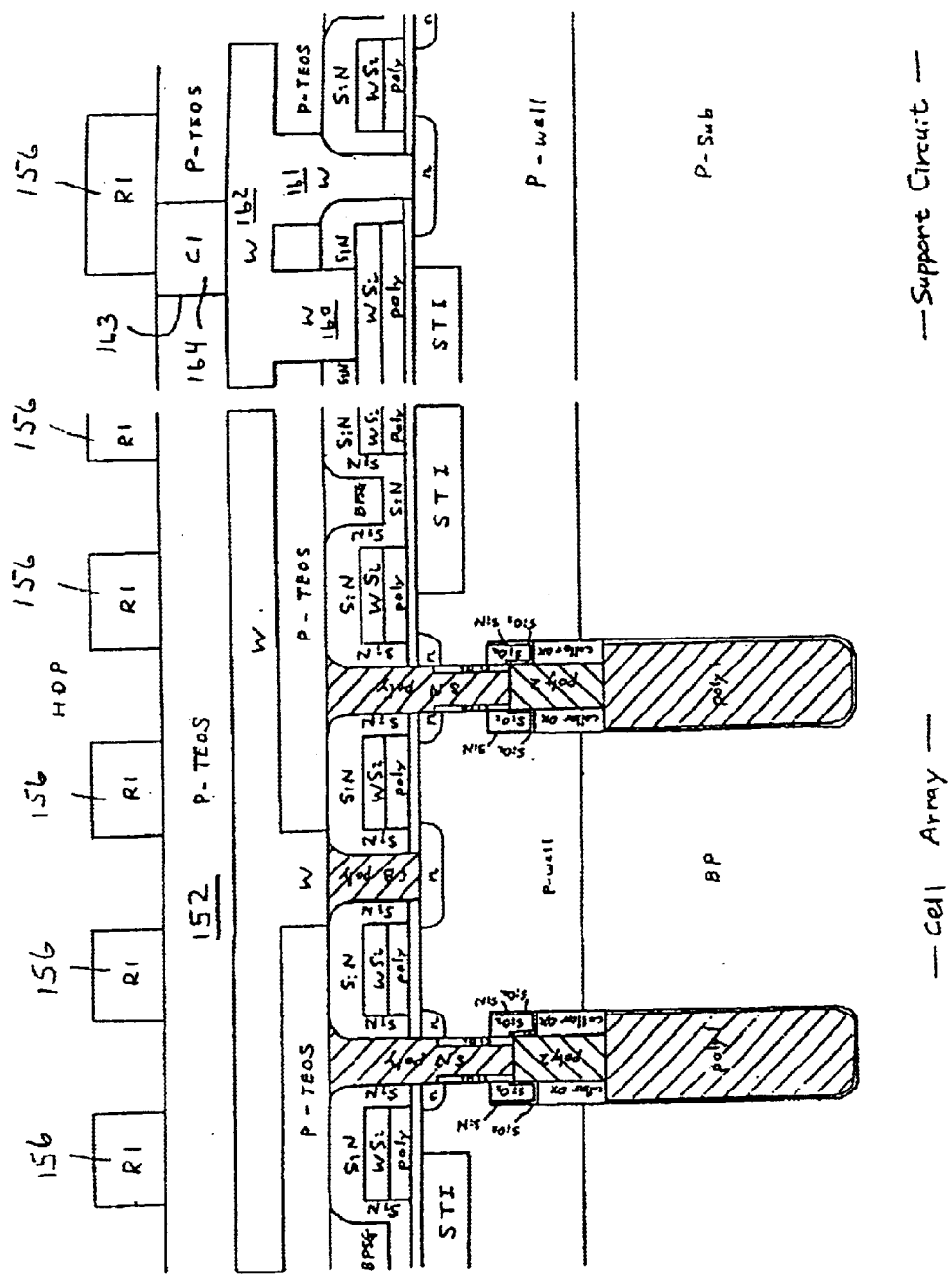

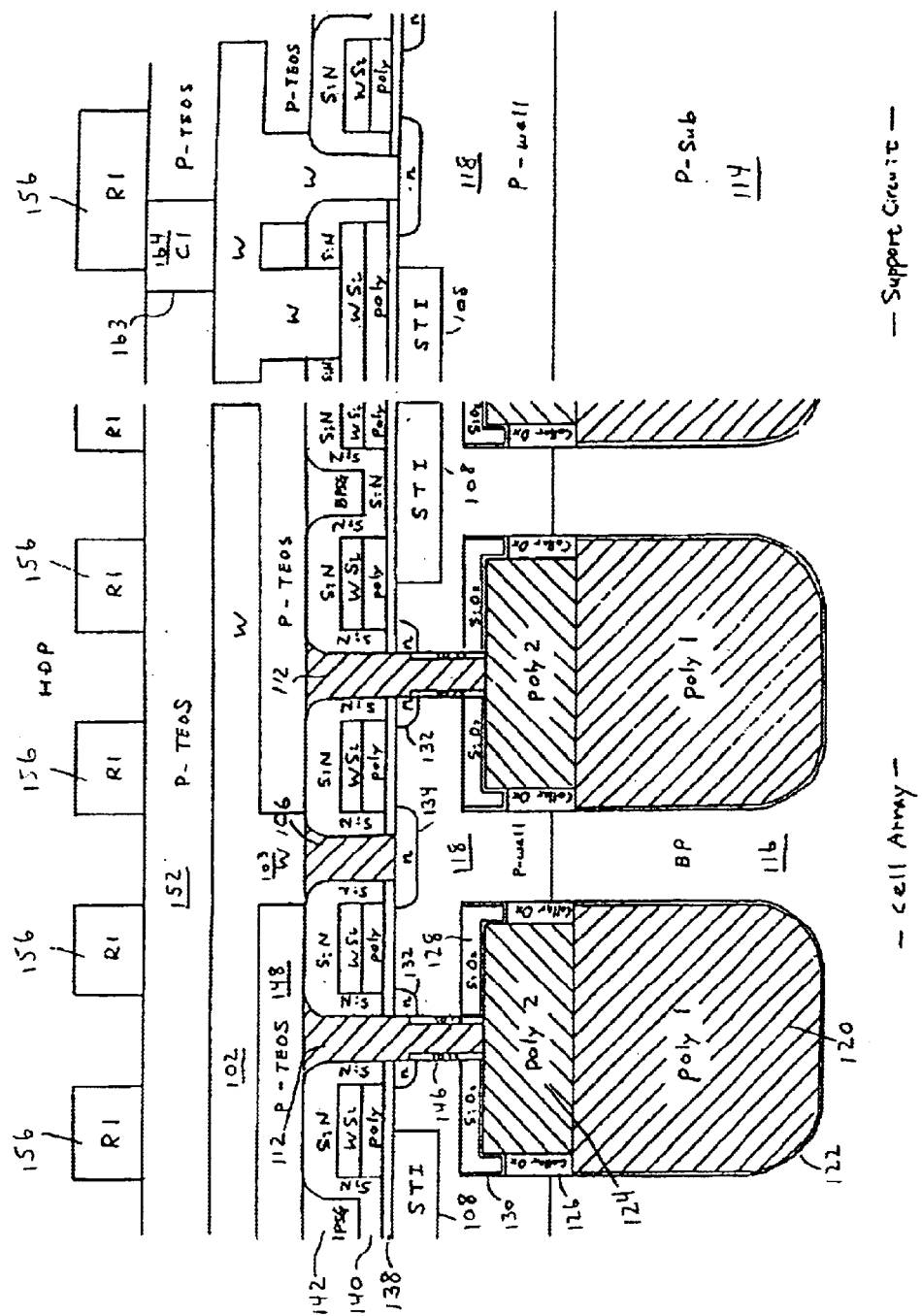

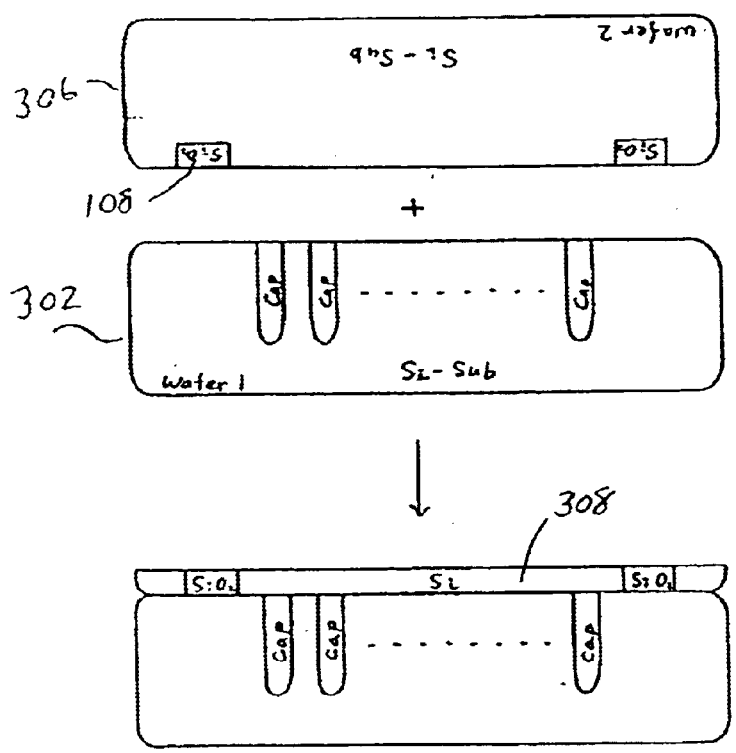

US 6,720,606 B1

DYNAMIC SEMICONDUCTOR MEMORY DEVICE HAVING A TRENCH CAPACITOR

CROSS-REFERENCE TO RELATED APPLICATION

This is a Continuation-In-Part application of U.S. patent application Ser. No. 08/982,478, filed Dec. 2, 1997, now U.S. Pat. No. 6,236,079, the entire contents of which are incorporated herein by reference.

TECHNICAL FIELD

The present invention generally relates to semiconductor memory devices and methods of manufacturing the same and, more particularly, to highly integrated dynamic memory devices and methods of manufacturing the same.

DESCRIPTION OF THE RELATED ART

FIGS. 1A and 1B illustrate a memory cell having a MINT architecture and a 0.25 micron design rule which is usable in a 256 Mbit dynamic random access memory (DRAM) device. Specifically, FIG. 1A is a top-down view of the trench memory cell and FIG. 1B is a cross-sectional view taken along line A–A' of FIG. 1A. DRAM cell 550 includes a trench capacitor 555 and a MOS transfer gate 560. Trench capacitor 555 includes a first N+-type polycrystalline silicon fill 565, a second polycrystalline silicon fill 567, and a collar oxide 571. Transfer gate 560 includes N-type source/drain and drain/source regions 573 and 574 formed in P-type well 575 and a WSix/polycrystalline silicon gate 577 insulatively spaced from the channel region between source/drain region 573 and drain/source region 574. A bit line contact 579 formed in an opening in an insulating layer 80 (of BPSG, for example) and in insulating layer 578 (of silicon nitride, for example) electrically connects source/drain region 573 to bit line 581. A shallow trench isolation (STI) structure 590 electrically isolates DRAM cell 550 from an adjacent DRAM cell and passing word line 592. Passing word line 592 has a WSix/polycrystalline silicon structure. A dielectric layer 587 is formed on bit line 581 and aluminum wirings 589 are formed on dielectric layer 587. One of the aluminum wirings 589 is connected to bit line 581 by a contact stud 591 of tungsten, for example. A diffusion region 583 electrically connects third polycrystalline silicon fill 569 and drain/source region 574 of MOS transfer gate 560. This diffusion region is formed by outdiffusing dopants from the highly doped polycrystalline silicon fill in the storage trench into P-well 575. Diffusion region 583 and third polycrystalline silicon fill 569 constitute a buried strap for connecting trench capacitor 555 to transfer gate 560.

While the memory cell structure of FIGS. 1A and 1B has been successfully applied to 256 Mbit DRAM devices, certain problems can adversely impact the manufacturing yield of such devices. With reference to FIG. 2A, the outdiffusion of dopants to form diffusion region 583 must be carefully controlled. If the dopants diffuse too far into the semiconductor substrate, the operation of transfer gate 550 can be adversely affected. This, for example, places certain limitations on the thermal processes used in the manufacturing process since long, high temperature processes will cause a greater outdiffusion of the dopants. In addition, various crystal defects can be generated at the intersection of the active area (transfer gate) and the deep trench. For example, various oxidation processes during the manufacturing process can cause expansion of the collar oxide 571. This expansion can lead to dislocations in the silicon. In addition to contributing to the adverse operation of the transfer gate, such dislocations can cause junction leakage from the buried strap diffusion layer 583. Still further, as shown in FIG. 2B, in some cases, there can be a discontinuity between the cell array junction and the buried strap caused by ion implantation shadowing due to a passing word line.

Problems are also associated with the scaling-down of the DRAM cell of FIGS. 1A and 1B to form more highly integrated memory devices (e.g., 1 Gbit and 4 Gbit DRAM devices). In particular, the scaled-down memory cell must nonetheless provide a capacitor having a size (i.e., a capacitance) for storing a charge which is sufficient to ensure that data may be correctly written to and read out from the memory cell. Since scaling-down generally results in a shrinking of the horizontal dimensions of the memory cell, one possible way to provide a sufficiently-sized capacitor would be to increase the depth of the trench within which the capacitor is formed. In this way, the horizontal dimensions of capacitor may be scaled down while providing a capacitor of the same size or at least scaled down to a lesser degree. However, the high aspect ratios associated with such deep trenches create difficulties in the processes needed to fill the trenches. In short, to increase the size of trench capacitor 555 during scale-down, either the depth of the trench or the horizontal dimensions of the trench must be increased. Since increasing the depth suffers from processing problems as described above and since increasing the horizontal dimensions is contrary to scaling-down goal, it is difficult to increase the integration density of memory cells having the memory cell structure shown in FIGS. 1A and 1B for new generations memory devices.

One solution to this scaling-down problem is to overlap the transistor area and the deep trench area. Such a transistor over capacitor (TOC) arrangement is shown in U.S. Pat. No. 4,649,625 to Lu, which is incorporated herein by reference. In this structure, the transfer gate is formed on epitaxial silicon which has been laterally grown over an insulator formed on the deep trench. Such laterally grown epitaxial silicon often suffers from defects which can adversely affect the operating characteristics of the transistor and thus of the memory cell itself.

It would be desirable to provide semiconductor memory devices and methods of manufacturing the same which overcome these and other problems.

SUMMARY OF THE INVENTION

A semiconductor memory device according to a first aspect of the present invention includes a semiconductor substrate, a first semiconductor region of a first conduction type formed on the semiconductor substrate, and a second semiconductor region of a second conduction type opposite to the first conduction type, formed on the first semiconductor region. A trench capacitor having a trench extending through the first semiconductor region and the second semiconductor region is formed such that its top does not reach a top surface of the second semiconductor region, the trench being formed therein with a conductive trench fill. A pair of gate electrodes are formed on the second semiconductor region, each positioned overlying the trench capacitor. A pair of insulating layers are formed to cover each of the pair of gate electrodes. A conductive layer is formed between the pair of insulating layers to self-align to each of the pair of insulating layers. The conductive layer has a leading end insulated from the second semiconductor region and reaching the interior of the second semiconductor region, and is electrically connected to the conductive trench fill of the trench capacitor. A pair of third semiconductor regions of the first conduction type are formed in the second semiconductor region, and positioned opposite to each other with respect to the conductive layer. Each of the third semiconductor regions is directly in contact with the conductive layer, and constitutes either a source or a drain of transistors having one of the pair of gate electrodes, respectively. The pair of third semiconductor regions is formed substantially to a uniform depth.

A semiconductor memory device according to a second aspect of the present invention includes a semiconductor substrate, a plurality of trench capacitors formed in the semiconductor substrate and arranged at a regular pitch, and a semiconductor layer formed on the semiconductor substrate in which the trench capacitors are formed. A element isolation insulating film is buried in the semiconductor layer to define a plurality of active element areas each spreading over two adjacent trench capacitors. A plurality of transistors are formed two by two in each of the active element areas, such that two transistors share one of source/drain diffusion layers, and the other of the source/drain diffusion layers is positioned over regions of two adjacent trench capacitors. Each of the transistors has a gate connected to a word line continuous in one direction. A contact layer is provided for connecting the other of the source/drain diffusion layers of each of the transistors to a capacitor node layer of corresponding one of the trench capacitors. A bit line is provided to intersect the word lines and connected to one of the source/drain diffusion layers of the transistor.

In the present invention, specifically, (a) the trench capacitors are shaped substantially in a square having one side sized to be 2F, where F is a minimum processing dimension, the diagonals of the squares are oriented in two orthogonal directions of the word line and the bit line, and the trench capacitors are arranged at a regular pitch of 1F or less in directions of two orthogonal sides of the squares, or (b) the trench capacitors are shaped substantially in a square having one side sized to be 2F, where F is a minimum processing dimension, the sides of the squares are oriented in two orthogonal directions of the word line and the bit line, and the trench capacitors are arranged at a regular pitch of 2F in the bit line direction, and shifted sequentially at a one-half pitch on adjacent bit lines.

In the trench capacitors arranged in either (a) or (b) pattern, the active element areas are arranged at a regular pitch in the bit line direction and sequentially shifted at a one-quarter pitch on adjacent bit lines.

In the present invention, the contact layer is buried in the semiconductor layer for connecting a diffusion layer of a transistor to a capacitor node layer of a trench capacitor. For a specific form of the contact, the following approaches may be used.

(1) The contact layer is formed such that it is buried to reach the capacitor node layer, extending through the transistor diffusion layer, after the transistor has been formed;

(2) The semiconductor layer forming the active element areas includes first and second epitaxially grown layers. Then, the contact layer is formed such that it is buried in the first epitaxially grown layer to reach the capacitor node layer before the second epitaxially grown layer is formed. The transistor diffusion layer is formed after the second epitaxially grown layer has been formed such that its bottom surface is connected to the top surface of the contact layer.

(3) The contact layer is formed such that it is buried in the semiconductor layer to reach the capacitor node layer before the transistor is formed. The transistor diffusion layer is connected to the contact layer through a buried diffusion layer formed in an upper side portion of the contact layer.

(4) The contact layer is formed such that it is buried in the semiconductor layer to reach the capacitor node layer before the transistor is formed. The transistor diffusion layer is connected to the top surface of the contact layer through a connection conductor formed on the surface thereof.

In the second aspect of the present invention, the trench capacitor specifically includes a buried plate comprised of a conductive layer having the conduction type opposite to that of the semiconductor substrate, formed in the substrate by diffusion from a trench surface. When the buried plate is formed such that its top end is positioned below the surface position of the semiconductor substrate, a collar insulating film must be formed over the trench capacitor to prevent a parasitic transistor or the like from operating. Accordingly, the capacitor contact layer must also be buried in two stages.

Alternatively, the buried plate may be formed up to the surface of the semiconductor substrate. In this structure, the trench capacitor may be implemented in a simple structure in which a capacitor insulating film is formed over the entire inner wall of the trench and a contact layer is buried in one step. This simplifies the process, and increases the effective area of the trench capacitor, so that a larger allowance can be provided for misalignment when contact holes are subsequently formed.

When the surface strap feature (4) is employed, a constant positional offset must be provided between the contact layer buried on the capacitor node layer and the transistor diffusion layer formed thereon such that they partially overlap. For this purpose, when the active element area is laid out such that its center passes the center of the corresponding trench capacitor, by way of example, the contact layer is formed at a position shifted from the center of the trench capacitor in the word line direction. Alternatively, when the contact layer is positioned at the center of the trench capacitor, the active element area is disposed such that its center is shifted from the center of the trench capacitor in the word line direction.

Also, in the present invention, the trench capacitors are covered with a cap insulating film when a semiconductor layer is epitaxially grown thereon. For this reason, a polycrystalline semiconductor layer is grown on the trench capacitor region. Thus, when wells are formed in the active element areas prior to the formation of transistors, it is preferable that the boundary between the wells does not come in contact with the polycrystalline semiconductor layer. Specifically, a junction leakage can be reduced by forming a pn junction surface formed between a well and the buried plate of the trench capacitor above the polycrystalline layer region.

In the present invention, the semiconductor layer may be comprised of a bulk semiconductor layer of another semiconductor substrate bonded to the semiconductor substrate in which capacitors are formed, and an epitaxially grown layer formed on the bulk semiconductor layer. In this case, a contact layer for connecting the transistor diffusion layer to the capacitor node layer is formed such that it is buried in the bulk semiconductor layer to reach the capacitor node layer before the epitaxially grown layer is formed. Then, the source/drain diffusion layers are formed after the epitaxially grown layer has been formed, such that the bottom surface thereof is connected to the top surface of the contact layer.

Also, when the substrate bonding technique is used, a substrate isolation insulating film is preferably interposed between the bonding surfaces of the substrates. Then, the element isolation insulating film is comprised of a first element isolation insulating film buried in element isolation regions in the bit line direction to a depth at which the first element isolation insulating film reaches the substrate isolation insulating film; and a second element isolation insulating film partially overlapping the first element isolation insulating film and buried in the element isolation regions in the bit line direction and word line direction to a depth shallower than the first element isolation insulating film.

A semiconductor device according to a third aspect of the present invention includes a semiconductor substrate, an element isolation insulating film including a first insulating film buried to define active element areas on the semiconductor substrate, and a second insulating film shallower than the first insulating film; and elements formed in the active element areas defined by the element isolation insulating film.

A method of manufacturing a semiconductor memory device according to a fourth aspect of the present invention includes the steps of forming a plurality of trench capacitors arranged at a regular pitch on a semiconductor substrate with a capacitor node layer being covered with a cap insulating film, wherein the cap insulating film has a surface positioned below a surface of the semiconductor substrate, epitaxially growing a semiconductor layer on the semiconductor substrate on which the trench capacitors have been formed, forming an element isolation insulating film on the semiconductor layer to define a plurality of active element areas such that each active element area spreads over two adjacent trench capacitors, forming two transistors in each of the active element areas such that two transistors share one of source/drain diffusion layers, the other of the source/drain diffusion layers is positioned over regions of two adjacent trench capacitors, and gate electrodes serve as word lines continuous in one direction, burying a contact layer between the gate electrodes, extending through the other of the source/drain diffusion layers to reach the capacitor node layer, and forming bit lines connected to one of the source/drain diffusion layers to intersect the word lines.

A method of manufacturing a semiconductor memory device according to a fifth aspect of the present invention includes the steps of forming a plurality of trench capacitors arranged at a regular pitch on a semiconductor substrate with a capacitor node layer being covered with a cap insulating film, wherein the cap insulating film has a surface positioned below a surface of the semiconductor substrate, epitaxially growing a first semiconductor layer on the semiconductor substrate on which the trench capacitors have been formed, burying a contact layer in the first semiconductor layer to reach the capacitor node layer, epitaxially growing a second semiconductor layer on the first semiconductor layer in which the contact layer is buried, forming an element isolation insulating film on the second semiconductor layer to define a plurality of active element areas such that each of the active element areas spreads over two adjacent trench capacitors, forming two transistors in each of the active element areas such that two transistors share one of source/drain diffusion layers, the other of the source/drain diffusion layers is connected to a top surface of the contact layer, and gate electrodes serve as word lines continuous in one direction, and forming bit lines connected to one of the source/drain diffusion layers to intersect the word lines.

A method of manufacturing a semiconductor memory device according to a sixth aspect of the present invention includes the steps of forming a plurality of trench capacitors arranged at a regular pitch on a semiconductor substrate with a capacitor node layer being covered with a cap insulating film, wherein the cap insulating film has a surface positioned below a surface of the semiconductor substrate, epitaxially growing a semiconductor layer on the semiconductor substrate in which the trench capacitors have been formed, burying a contact layer in the semiconductor layer to reach a capacitor node layer of the trench capacitors, the contact layer having an upper end portion connected to an impurity diffusion layer formed in the semiconductor layer, forming an element isolation insulating film on the semiconductor layer to define a plurality of active element areas such that each of the active element areas spreads over two adjacent trench capacitors, forming two transistors in each of the active element areas such that two transistors share one of source/drain diffusion layers, the other of the source/drain diffusion layers is connected to the contact layer through the impurity diffusion layer, and gate electrodes serve as word lines continuous in one direction, and forming bit lines connected to one of the source/drain diffusion layers to intersect the word lines.

A method of manufacturing a semiconductor memory device according to a seventh aspect of the present invention includes the steps of forming a plurality of trench capacitors arranged at a regular pitch on a semiconductor substrate with a capacitor node layer being covered with a cap insulating film, wherein the cap insulating film has a surface positioned below a surface of the semiconductor substrate, epitaxially growing a semiconductor layer on the semiconductor substrate on which the trench capacitors have been formed, burying a contact layer in the semiconductor layer to reach a capacitor node layer of the trench capacitors, forming an element isolation insulating film on the semiconductor layer to define a plurality of active element areas such that each of the active element areas spreads over two adjacent trench capacitors, forming two transistors in each of the active element areas such that two transistors share one of source/drain diffusion layers, the other of the source/drain diffusion layers is positioned on the trench capacitor region, and gate electrodes serve as word lines continuous in one direction, forming a surface connection conductor for connecting the other of the source/drain diffusion layers to the contact layer corresponding thereto, the surface connection conductor being self-aligned to the word lines, and forming a bit line connected to one of the source/drain diffusion layers to intersect the word line.

A method of manufacturing a semiconductor memory device according to an eighth aspect of the present invention includes the steps of forming a plurality of trench capacitors arranged at a regular pitch on a semiconductor substrate with a capacitor node layer being covered with a cap insulating film, forming a first semiconductor layer by bonding another semiconductor substrate through a substrate isolation insulating film to the semiconductor substrate in which the trench capacitors are formed, burying a contact layer in the first semiconductor layer to reach the capacitor node layer, epitaxially growing a second semiconductor layer on the first semiconductor layer in which the contact layer is buried, forming an element isolation insulating film on the first and second semiconductor layers to define a plurality of active element areas such that each of the active element areas spreads over two adjacent trench capacitors, forming two transistors in each of the active element areas such that two transistors share one of source/drain diffusion layers, the other of the source/drain diffusion layers is connected to a top surface of the contact layer, and gate electrodes serve as word lines continuous in one direction, and forming a bit line connected to one of the source/drain diffusion layers to intersect the word line.

According to the present invention, the formation of transistors in a semiconductor layer formed on a substrate, in which trench capacitors are buried, enables the trench capacitors to be most closely populated to maximally increase the area occupied thereby. This also results in a lower aspect ratio when the trench capacitors are formed, increased capacitor areas, and a resulting larger allowance for misalignment of a transistor to a connection.

These and other features and advantages of the present invention will be better understood from a reading of the following detailed description in conjunction with the accompanying drawings.

BRIEF DESCRIPTION OF THE SEVERAL VIEWS OF THE DRAWING

FIGS. 2A and 2B are used to illustrate various problems associated with the memory cell structure shown in FIGS. 1A and 1B.

FIGS. 5A–5J are cross-sectional views corresponding to FIG. 4A which illustrate a method of manufacturing the semiconductor memory device of FIGS. 3, 4A, and 4B.

FIG. 7 is a cross-sectional view taken along line 7–7' of FIG. 6.

FIG. 8 illustrates a wafer-bonding technique which may be used in the process of forming the semiconductor memory device of FIG. 6.

DETAILED DESCRIPTION OF THE INVENTION

Figure 3:
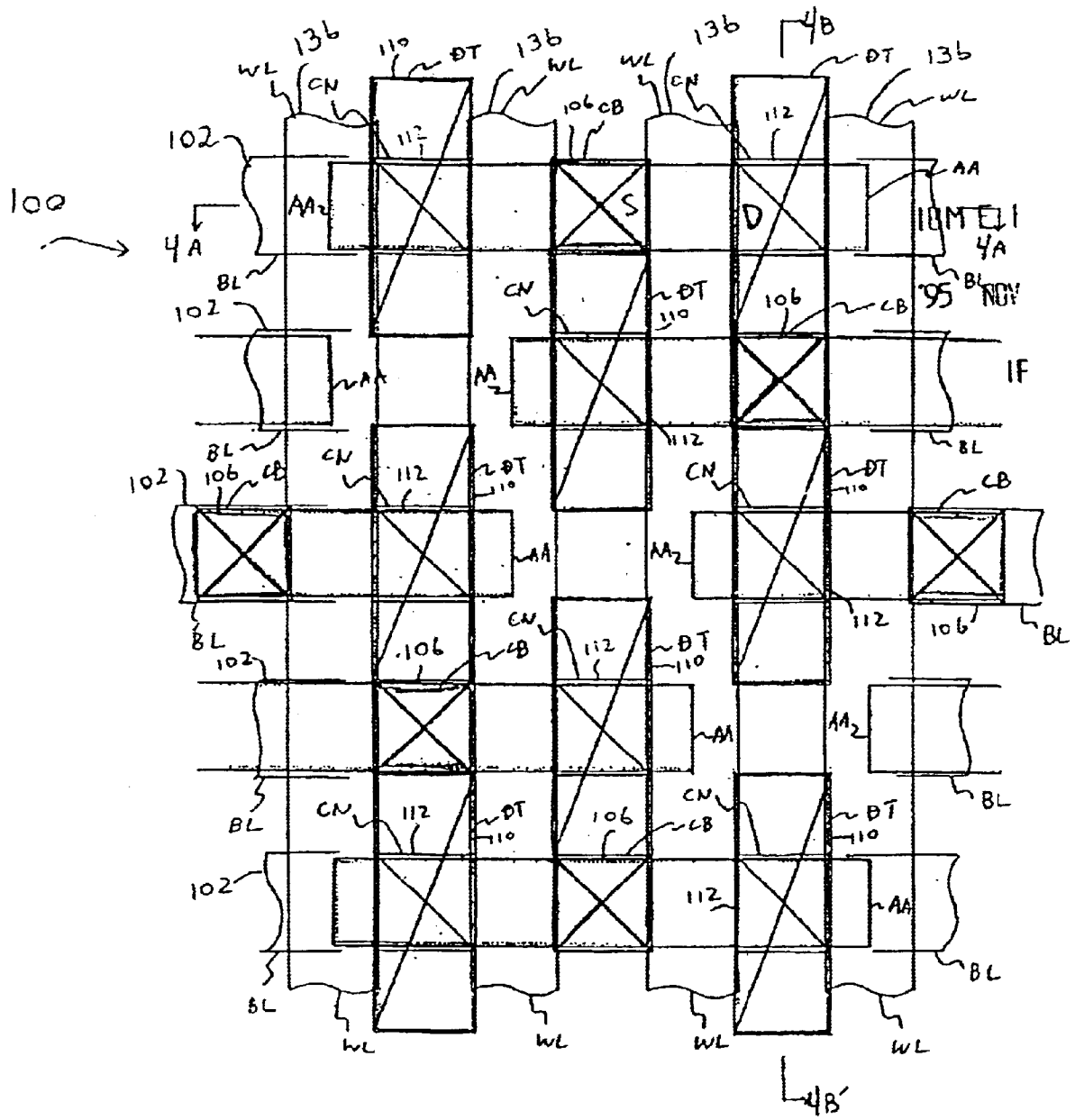
FIG. 3 is a top-down view of a semiconductor memory device in accordance with a first embodiment of the present invention.
Figure 4A:
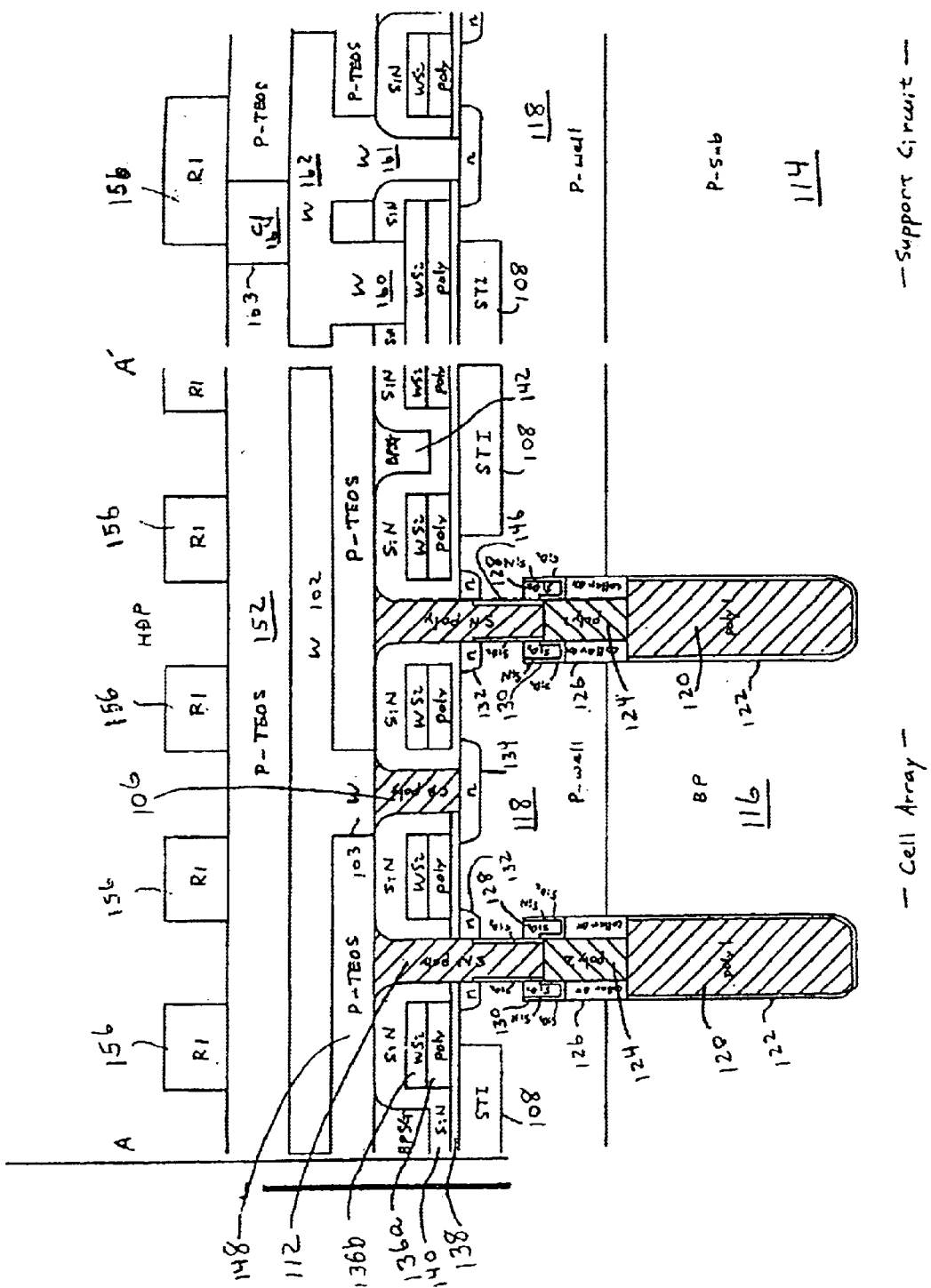
FIGS. 4A and 4B are cross-sectional views taken along lines 4A–4A' and 4B–4B' of FIG. 3, respectively.
Figure 4B:
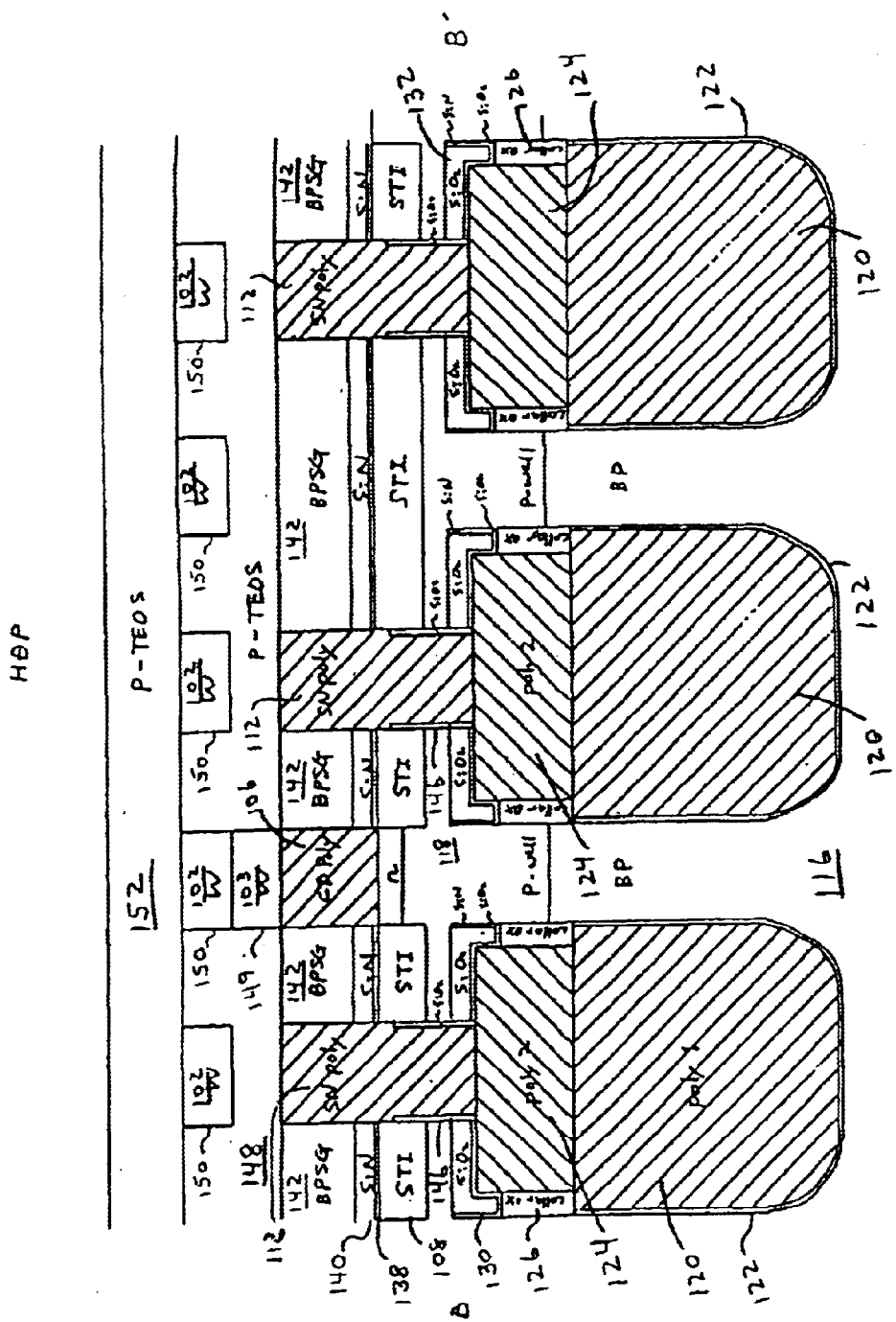

FIG. 3 is a top-down view of a semiconductor memory device 100 in accordance with a first embodiment of the present invention. FIG. 4A is a cross-sectional view taken along line 4A–4A' of FIG. 3 and FIG. 4B is a cross-sectional view taken along line 4B–4B' of FIG. 3. The cross-sectional view of FIG. 4A is extended to a support circuit region of the semiconductor memory device which is not shown in FIG. 3. Generally, circuits such as decoders, sense amplifiers, and the like are formed in the support circuit region. With reference to FIG. 3, memory device 100 includes bit lines 102 formed to extend in a first direction (i.e., horizontally in FIG. 3) and word lines 136 formed to extend in a second direction (i.e., vertically in FIG. 3). The portions of the word lines which extend over the channel regions of the transfer transistors constitute the gate electrodes of the transfer transistors. Bit line contacts 106 are arranged at a one-quarter pitch. That is, the bit line contacts for every fourth bit line are vertically aligned. A plurality of active areas AA are defined by shallow trench isolation (STI) structures 108 (see FIGS. 4A and 4B). Active areas AA have a width extending in the word line direction and a length extending in the bit-line direction. The trench capacitors (storage nodes) of the memory cells are formed in deep trenches 110. Deep trenches 110 have a width extending in the bit line direction and a length extending in the word line direction. Storage node contacts 112 are located between adjacent ones of the word lines and provide an electrical connection between the trench capacitors and the transfer gates.

As can be seen with reference to FIGS. 4A and 4B, an N-type diffusion region 116 and a P-type well region 118 are provided in the memory cell array region of a P-type silicon substrate 114. P-type well region 118 is also provided in the support circuit region of the silicon substrate 114. N-type diffusion region 116 has an impurity concentration (e.g., more than $1\times10^{17}$ $cm^{-3}$ at the peak) which is higher than the impurity concentration of the silicon substrate 114 and serves as a buried plate electrode for the memory cells of the memory device 100. P-type well region 118 has an impurity concentration of approximately $1\times10^{17}$ $cm^{-3}$ to $1\times10^{18}$ $cm^{-3}$. The trench capacitors include a first trench fill 120 which is insulated from the buried plate electrode 116 by a storage node insulating layer 122. Storage node insulating film 122 may, for example, be a nitride/oxide (NO) film including a layer of silicon nitride ($Si_3N_4$) and a layer of silicon dioxide ($SiO_2$). A second trench fill 124 is insulated from P-well 118 and buried plate electrode 116 by a collar oxide film 126. Collar oxide film 126 may, for example, be a silicon dioxide ($SiO_2$) film. A silicon dioxide ($SiO_2$) layer 128 is formed at the upper portion of deep trenches 110 and is spaced from P-well region 118, from collar oxide film 126, and from second trench fill 124 by a silicon dioxide ($SiO_2$)/silicon nitride ($Si_3N_4$) liner layer 130. Each transfer gate includes spaced apart N-type source and drain regions 132 and 134. As shown in FIG. 4A, adjacent transfer transistors formed in a given active area have a common N-type drain region 134. Each transfer transistor further includes a gate electrode 136 which is insulatively spaced from a channel region between the N-type source and drain regions 132 and 134 by a gate insulating layer 138 of, for example, silicon dioxide ($SiO_2$). Gate electrode 136 is a polycide gate electrode including a polysilicon layer 136a and a silicide layer 136b (e.g., tungsten silicide) formed on the polysilicon layer, and a cap nitride layer (not shown) formed on silicide layer 136b. A conformal barrier layer 140 of, for example, silicon nitride ($Si_3N_4$), is formed on gate insulating layer 138 and the gate electrodes 136 and a BPSG layer 142 fills in the depressions in the barrier layer 140. Self-aligned storage node contacts (strap layers) 112 of polysilicon, for example, electrically connect the trench capacitors (via an opening formed in insulating layer 128 and liner layer 130) to the source regions 132 of the transfer transistors. AS can be seen in FIG. 4A, storage node contacts 112 are formed between adjacent gate electrodes 136 and are insulated from P-well region 118 by an insulating layer 146. Bit line contacts 106 of, for example, polysilicon, are formed to contact the common drain region between adjacent transfer transistors. A first interlayer insulating film 148 of, for example, P-TEOS, is formed on the upper surfaces of barrier layer 140, BPSG layer 142, storage node contacts 112, and bit line contacts 106. Bit lines 102 and contacts 103 are formed in the memory cell region by a dual damascene process in which vias 149 and trenches 150 are formed in insulating layer 148, a metal such as tungsten is deposited on insulating layer 148 and in the vias and the trenches, and the deposited metal is planarized so as to be substantially level with the upper surface of insulating layer 148 (see FIG. 4B). Similarly, in the support circuit region, damascene and/or dual damascene processes may be utilized to form contacts 160, 161 to gates and diffusion regions and to form wiring 162. A second interlayer insulating film 152 of, for example, P-TEOS, is formed on first interlayer insulating film 148. A metallization layer is formed on the second interlayer insulating film 152 and is patterned to form wirings 156. As shown in FIG. 4A, in the support circuit region, a contact 164 formed in an opening 163 in second interlayer insulating film 152 connects one of the wirings 156 to wiring 162.

Figure 5A:
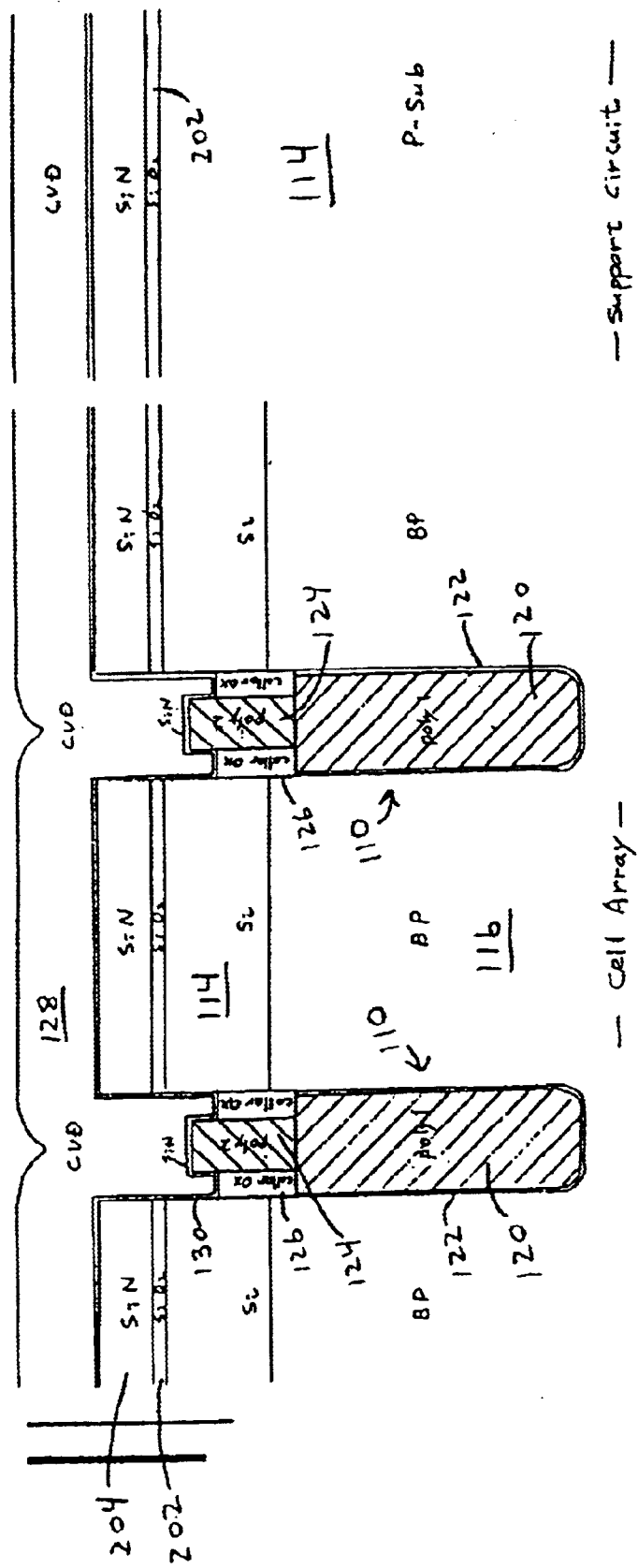

A method for manufacturing the above-described semiconductor memory device will be described with reference to FIGS. 5A–5J. Turning to FIG. 5A, the surface of a P-type silicon substrate 114 is thermally oxidized to form a first pad oxide layer 202 of silicon dioxide ($SiO_2$) having a thickness of about 10 nanometers. The thermal oxidation is performed at about 900° C. in an atmosphere of dry $O_2$. Substrate 114 may be a silicon wafer or an epitaxial layer formed on a silicon wafer. A pad silicon nitride ($Si_3N_4$) layer 204 having a thickness of about 100 nanometers is then formed on pad oxide layer 202 by, for example, chemical vapor deposition (CVD). A second pad oxide layer (not shown in FIG. 5A) having a thickness of approximately 400 nanometers is then formed by the evaporation of TEOS ($Si(OC_2H_5)_4$). Deep trenches 110 each having a depth of approximately 4.9 micrometers, a width (in the bit line direction) of approximately 0.20 micrometers, and a length (in the word line direction) of approximately 0.60 micrometers are formed in silicon substrate 114 in the memory cell region using a patterned resist (not shown) and an etching process such as reactive ion etching (RIE). Deep trenches 110 have an aspect ratio (width/depth) of 25. An N-type diffusion region 116 is then formed in substrate 114 in the memory cell region by implanting impurities and AsG diffusion. The implant may be performed using a dose of $1\times10^{13}$ $cm^{-2}$ of phosphorus and an acceleration voltage of 1.5 MeV. The ASG diffusion may be performed by the deposition of an ASG layer and an ASG layer recess process down to a level which is deeper by the diffusion length than the intended top of region 116, followed by annealing at about 1050° C. for 30 minutes to form diffusion region 116. The buried N-type well may be formed by other methods, e.g., P-well implantation into an N-type semiconductor substrate or by epitaxy, and the invention is not limited in this respect.

An insulating layer 122 such as a nitride-oxide (NO) layer or an oxide-nitride layer is then formed on the entire surface. For example, insulating layer 122 may include a silicon nitride ($Si_3N_4$) layer of about 6 nanometers deposited using a low pressure chemical vapor deposition method and a silicon dioxide ($SiO_2$) layer of about 2 nanometers formed by oxidation of the silicon nitride layer at 900° C. in an atmosphere of wet $O_2$. The target thickness of the insulating layer 122 ($T_{effective}$) is about 4–5 nm silicon dioxide equivalent. After insulating layer 122 is formed, first conductive regions are formed by filling deep trenches 110 with an impurity-doped first conductive material such as $N^+$-type polycrystalline silicon. The doping concentration of the first conductive material is greater than $3\times10^{17}$ $cm^{-3}$. The filling step may be carried out using chemical vapor deposition of silane or disilane, for example. The $N^+$-type polycrystalline silicon is then etched back to a first level within deep trenches 110 using an isotropic etch process such as reactive ion etching to form first trench fills 120. Specifically, the $N^+$-type polycrystalline silicon is etched back to a level which is about 1 micrometer ($\mu m$) below the surface of the semiconductor substrate. The second pad oxide layer is removed before the etch-back of the first fill in the deep trench and after a blanket etch back of the deposited polycrystalline silicon to the top surface of the second pad oxide layer by RIE. Insulating layer 122 is then etched by wet etching to remain at the lower portion of the trench so as to form a storage node insulating layer which insulates the first trench fill from the semiconductor substrate. A collar oxide film 126 is then formed on the sidewalls of the portions of deep trenches 110 opened by the etching back of the N+-type polycrystalline silicon using low pressure chemical vapor deposition (LPCVD) or plasma-enhanced chemical vapor deposition (PECVD) TEOS over the entire surface followed by an etch back using reactive ion etching.

Second conductive regions are then formed by filling in the remainder of deep trenches 110 with a second conductive material. The second conductive material may be, for example, N+-type polycrystalline silicon or undoped polycrystalline silicon and may be formed by chemical vapor deposition (CVD). The second conductive material is etched back by reactive ion etching or some other chemical dry etching process to a level which is about 0.1 micrometer ($\mu$m) below the surface of the semiconductor substrate. The collar oxide 126 is etched by a wet etch and remains as shown in FIG. 5A. Next, a very thin oxide layer having a thickness of approximately 5 nanometers and a silicon nitride ($Si_3N_4$) layer having a thickness of approximately 5 nanometers are formed on the upper surface of pad silicon nitride layer 204, on the sidewalls of deep trenches 110, and on the exposed portions of collar oxide film 126 and second trench fill 124. The thin oxide layer is formed, for example, by a rapid thermal oxidation at 1050° C. and the silicon nitride layer is formed, for example, by CVD. For purposes of clarity, the thin oxide layer and the silicon nitride layer are shown as a single liner layer 130 in FIG. 5A. A TEOS layer 128 is then formed by LPCVD, for example, on the upper surface of layer 130 and to fill in deep trenches 110 as shown in FIG. 5A.

TEOS layer 128 is then recessed by chemical mechanical polishing and RIE to be substantially level with the surface of substrate 114. Liner layer 130 is then removed from the upper surface and the sidewall of pad silicon nitride layer 204 and from the sidewall of pad oxide layer 202, and pad silicon nitride layer 204 and pad oxide layer 202 are removed from the surface of the substrate as shown in Figure 5B. The silicon nitride is etched, for example, by $H_3PO_4$ and the silicon oxide is etched, for example, by an HF solution.

An epitaxial silicon layer 208 having a thickness of about 0.2 micrometers ($\mu$m) is then grown by a solid phase epitaxial growth method on the surface of semiconductor substrate 114 in the memory cell region and in the support circuit region as shown in FIG. 5C. The portion of the epitaxial layer 208 above silicon substrate 114 in the memory cell region, on which the transfer transistor will be formed as described below, is high-quality single crystal silicon. The portion of the epitaxial layer 208 above the trench structures in the memory cell region is formed by horizontal epitaxial growth and thus may have twin boundaries. However, as will become evident, this portion of the epitaxial layer will be removed during the steps for forming the storage node contacts 112.

Figure 5D:
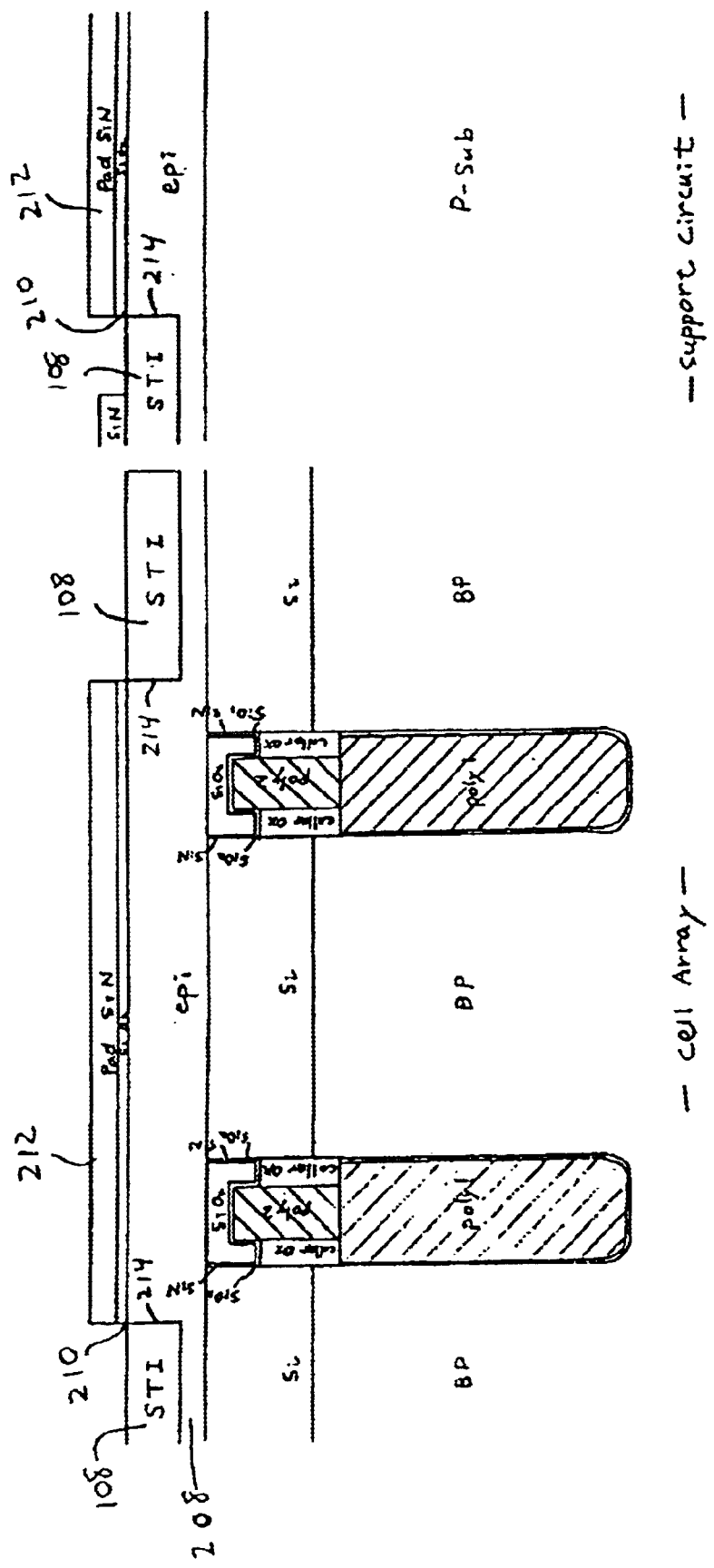

With reference to FIG. 5D, a pad oxide layer 210 of silicon dioxide ($SiO_2$) and a pad nitride layer 212 of silicon nitride ($Si_3N_4$) are successively formed on the surface of epitaxial silicon layer 208. Pad oxide layer 210 may be formed by thermal oxidization (e.g., 900° C. in an atmosphere of dry $O_2$) and may have a thickness of about 10 nanometers. Pad nitride layer 212 may be formed by chemical vapor deposition and may have a thickness of about 100 nanometers. Shallow trenches 214 are then formed in epitaxial layer 208 using a patterned resist (not shown) and an etching process such as reactive ion etching (RIE). The dimensions of the shallow trenches are dependent upon feature size. For example, for a 1 Gbit DRAM, shallow trenches 214 may have a width of 0.15 micrometers ($\mu$m) and a depth of 0.15 micrometers ($\mu$m). An insulating layer of, for example, TEOS, is then blanket deposited over the surface of pad nitride layer 212 and in shallow trenches 214. The insulating layer is then etched back using, for example, CMP and RIE, with pad nitride layer 212 serving as a stopper layer, whereby shallow trench isolation structures 108 which define the active areas AA are formed.

With reference to FIG. 5E, pad nitride layer 212 and pad oxide layer 210 are removed and a sacrificial oxide (not shown) having a thickness of about 6 nanometers (nm) is then formed by furnace oxidation or rapid thermal oxidation (RTO) on the surface of epitaxial layer 208. P-type well region 118 is formed by implanting P-type impurities into the entire surface of the substrate. For example, boron is implanted at a dose of about $1\times10^{13}$ $cm^{-2}$ and acceleration voltages of 10 keV to 300 keV (a retrograde P-well is formed by several acceleration voltages). If desired, a step of implanting impurities into portions of the substrate which will constitute the channel regions of the transfer transistors in the memory cell region and other transistors in the support circuit region may be performed. This implanting of impurities into the channel regions permits a tailoring of the threshold voltage of the transistors. The sacrificial oxide layer is then removed and a gate insulating layer 138 is formed on the surface of the substrate. Gate insulating layer 138 has a thickness of about 6 nanometers (nm) and may be formed by thermal oxidation at a temperature of approximately 850° C. Alternatively, gate insulating layer 138 may be formed by chemical vapor deposition (CVD) and the invention is not limited in this respect. Gate electrodes 136 for the transfer transistors in the memory cell region and for transistors in the support circuit region are then formed by depositing a polysilicon layer which is doped with N+-type impurities, followed by a layer of metal silicide such as tungsten silicide (WSi). After the WSi deposition, a cap silicon nitride layer (not shown) having a thickness of about 15 nanometers (nm) is formed on the WSi layer. The cap silicon nitride layer is provided so that a self-aligned contact may be formed while maintaining isolation between the gate electrodes 136 and bit line contacts 106 and storage node contacts 112. Then, using a patterned photoresist (not shown) and an etching process such as RIE, the cap silicon nitride layer, the silicide layer and the polysilicon layer are etched to form gate electrodes (word lines) 136 in the memory cell region and gate electrodes 136 in the support circuit region. Next, N-type impurities such as phosphorus or arsenic are ion-implanted using gate electrodes 136 as a mask to form N-type source regions 132 and drain regions 134 for the transfer transistors in the memory cell region and to form N-type source and drain regions for the N-channel transistors in the support circuit region. To form P-type source and drain regions for P-channel transistors in the support circuit region, $BF_2$ or B is implanted. Then, a barrier layer 140 of, for example, silicon nitride ($Si_3N_4$) having a thickness of approximately 30 nanometers (nm) is deposited by CVD. Next, an insulating layer 142 of BPSG, for example, is deposited on barrier layer 140. Insulating layer 142 is planarized by chemical mechanical polishing using barrier layer 140 as a stopper layer, resulting in the structure shown in FIG. 5E.

Figure 5F:
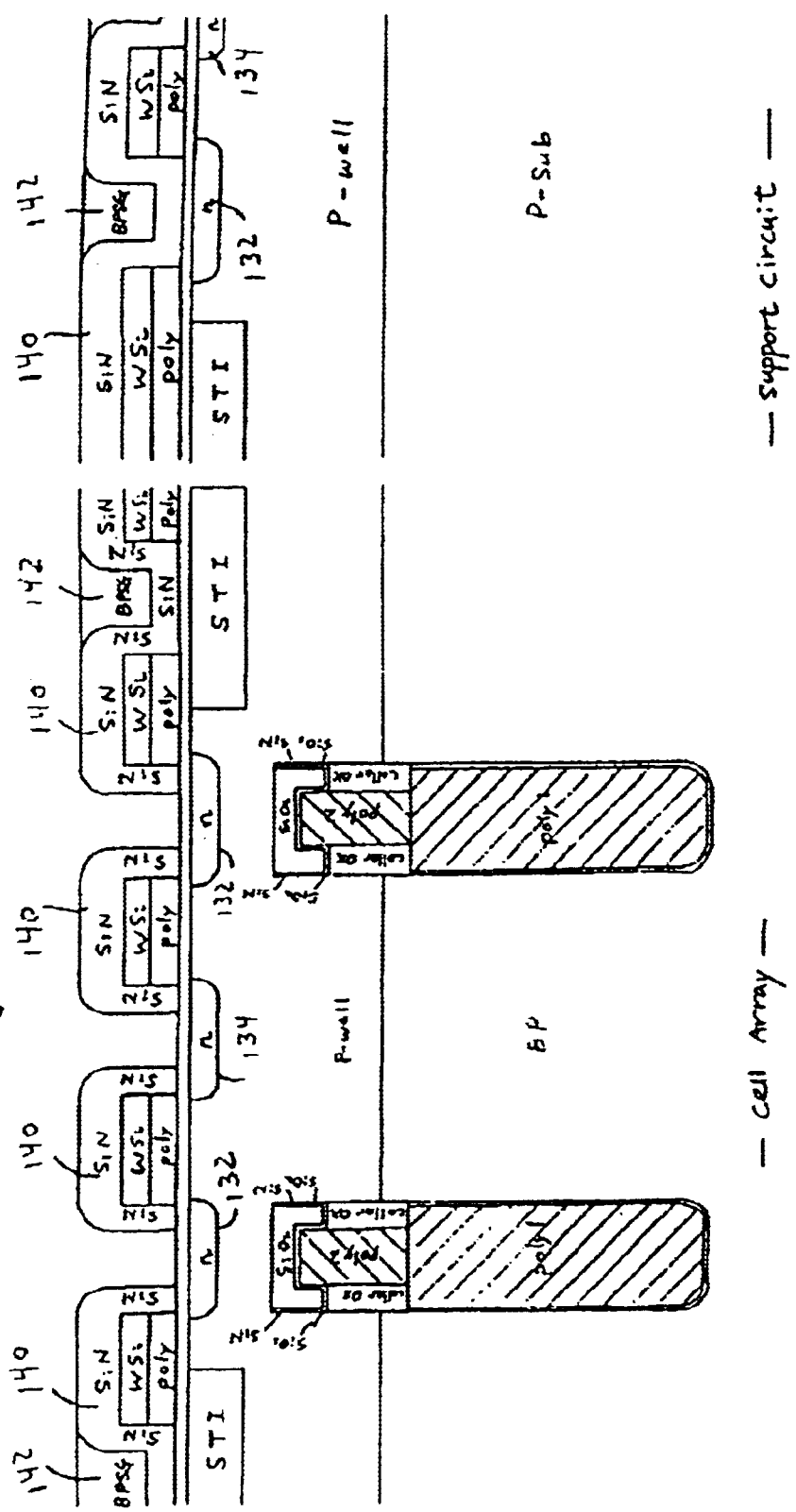

With reference to FIG. 5F, a photoresist (not shown) is deposited. The photoresist is patterned and is used as a mask for selectively etching the portions of insulating layer 142 and barrier layer 140 above source regions 132 and drain regions 134 in the memory cell region. Specifically, using the photoresist as a mask, a selective etch is used to etch insulating layer 142, and then barrier silicon nitride layer 140 is etched by a silicon nitride etching process to open contact regions.

With reference to FIG. 5G, a patterned photoresist 214 is formed for providing contacts to the storage nodes in deep trenches 110 in the memory cell region. Gate insulating layer 138, the silicon substrate, and TEOS layer 128 are etched by an etching process such as reactive ion etching using the patterned photoresist 214 and the gate electrodes 136, with the barrier layer 140 on the top and sidewalls thereof, as a mask to form storage node contact openings 216. The silicon nitride layer which is part of liner layer 130 is then etched. Since gate electrodes 136 are part of the etching mask, the etching process is a self-aligned etching process. Specifically, gate insulating layer 138 is etched by RIE (or by wet etching); the silicon substrate is etched by RIE; and TEOS layer 128 is etched by RIE. The etching of the silicon nitride which is part of liner 130 is accomplished by using wet etching (e.g. $H_3PO_4$) or dry etching.

With reference to FIG. 5H, the patterned photoresist 214 is removed and the gate insulating film 138 above drain region 134 is etched to form contact openings 218. An insulating layer 146 of, for example, silicon dioxide having a thickness of about 10 nanometers is deposited over the entire surface and then etched using RIE to expose second trench fill 124. Any remaining portion of the oxide layer of liner 130 on the surface of second trench fill 124 is also etched at this time. Next, a photoresist (not shown) is deposited and recessed to a predetermined depth within storage node contact openings 216. Using the recessed resist as a mask, the unmasked portions of insulating layer 146 are removed by, for example, wet etching so that the upper portion of insulating layer 146 is about 50 nanometers (nm) below the surface of the semiconductor substrate. The recessed resist is then removed and an in-situ phosphorus-doped polysilicon layer is deposited by, for example, chemical vapor deposition, to fill in storage node contact openings 216 and bit line contact openings 218, thereby forming storage node contacts 112 and bit line contacts 106. It will be apparent that insulating layer 146 must be etched-back to a level which permits connection between storage node contact 112 and source region 132, but no connection between storage node contact 112 and P-well 118. The bit line contacts 106 and storage node contacts 112 are then planarized by chemical mechanical polishing to be substantially level with the upper surface of barrier layer 140 as shown in FIG. 5H.

Figure 5I:
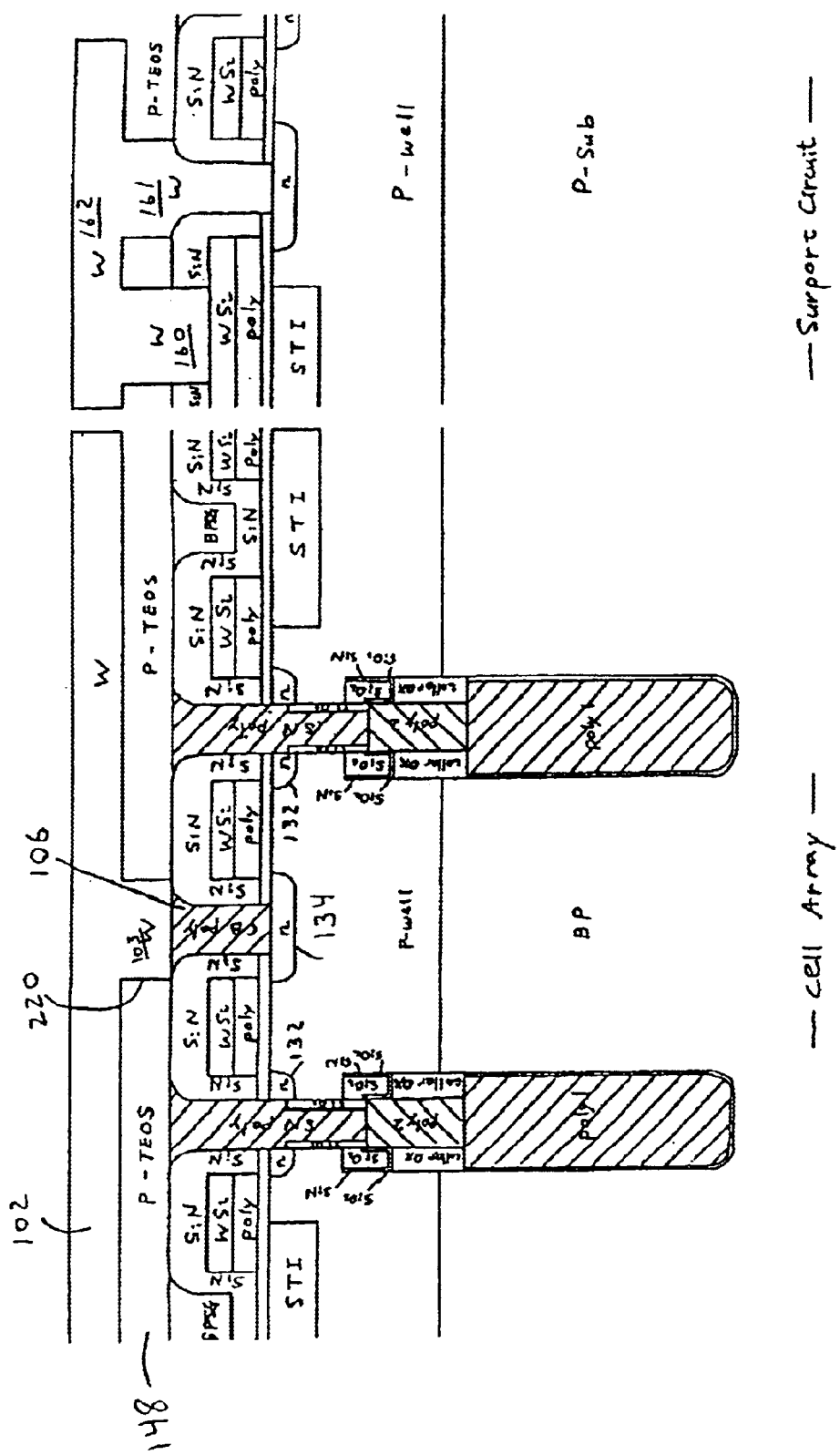

With reference to FIG. 5I, a first interlayer insulating film 148 of, for example, P-TEOS is then deposited. Bit lines 102 and contacts 103 to bit line contacts 106 in the memory cell region and wiring 162 and contacts 160 and 161 to the transistors and diffusion regions in the support circuit region may be formed by a so-called dual damascene process. A "damascene" process refers to a process in which a trench or via is formed and then filled in with a conducting material, followed by planarization. A dual damascene process involves the simultaneous fabrication of a conductive via and a conductive wiring. Such a process reduces the number of process steps and eliminates an interface between the conductive via and the conductive wiring. In the present method, vias and trenches for the contacts 103 and bit lines 102 in the memory cell region are formed in P-TEOS layer 148 by conventional photolithography and RIE processing. Vias and trenches are similarly formed for the contacts 160, 161 and wiring 162 in the support circuit region. Then, tungsten is deposited by CVD. The tungsten is then planarized by chemical mechanical polishing down to the top of the P-TEOS layer 148, i.e., P-TEOS layer 148 acts as a stopper layer for the CMP process. An adhesion/barrier layer such as titanium nitride may be formed, for example, by sputtering prior to the deposition of the tungsten. A second interlayer insulating film 152 of, for example, P-TEOS is then deposited and an opening 163 is formed therein to expose wiring 162 in the support circuit region. A contact 164 to wiring 162 is formed in opening 163 using a damascene process in which opening 163 is formed by conventional lithography and etching processing, followed by the deposition and planarization of a conductive material such as tungsten. A conductive layer is then deposited and patterned to form wirings 156 as shown in FIG. 5J.

Figure 1A:
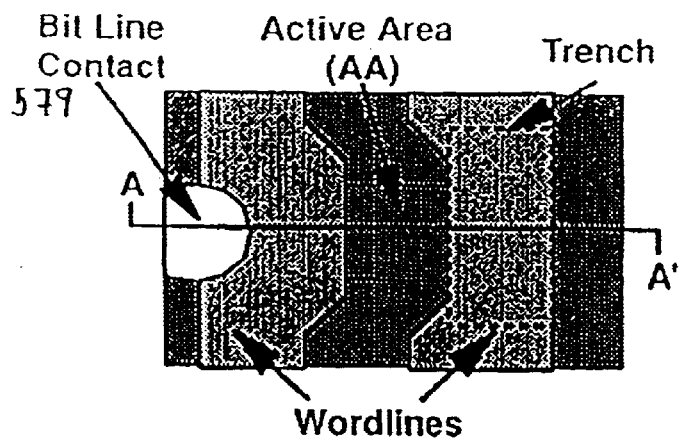
FIGS. 1A and 1B are a cross-sectional view and a top-down view, respectively, of a dynamic random access memory cell having a MINT architecture.
Figure 1B:
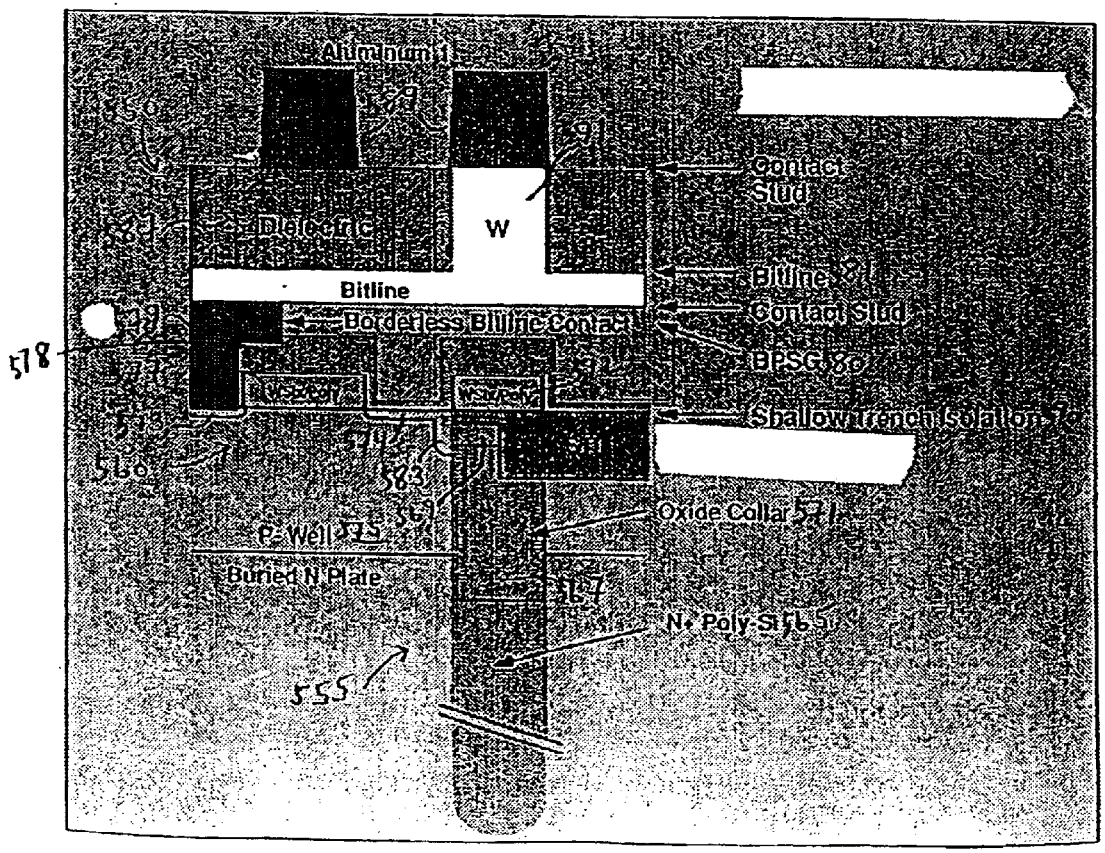

The memory device shown in FIGS. 3, 4A, and 4B and manufactured in accordance with the method explained with reference to FIGS. 5A–5J includes highly integrated memory cells having capacitors for storing a charge which is sufficient to ensure that data may be correctly written to and read out from the memory cell. This memory cell has a compact cell size of $8F^2$, where F is a feature size and the cell size is 2F×4F. In addition, the memory cell overcomes many of the disadvantages associated with the MINT architecture. For example, as can be seen with reference to FIGS. 5G and 5H, the steps for forming the storage node contact (strap) do not affect the transfer transistor. In addition, there is no discontinuity of the cell array junction to the strap junction caused by ion implantation shadowing due to a passing word line. Still further, there is no volume expansion of the active area oxide and the collar oxide at the deep trench-active area intersection. This serves to reduce the incidence of defects and stress. Yet further, there is no deep trench-shallow trench isolation intersection. Thus, the process for forming the shallow trench isolation structures does not adversely affect the deep trench capacitor. The process provides for long and high temperature stress relief anneal when the gate conductors are formed since the strap is formed after the gate conductor process. In addition, the transfer transistor is formed on a high-quality silicon layer and therefore possesses good operating characteristics. Specifically, with reference to FIG. 5G, it can be seen that the storage node contact is formed by etching the epitaxial silicon above the deep trenches and that the transfer transistor is formed in the high-quality epitaxial silicon formed above the substrate 114. Thus, the memory device of the present invention offers the possibility of being applied to 1 GBit DRAMs and beyond. Still further, the trench capacitor and the transfer transistor are connected using a self-aligned process. Specifically, the gate electrode functions as part of a mask for the etching process for forming the opening for the connecting strap. By using such a self-aligned process, misalignment errors can be avoided and the strap between trench capacitor and the transfer transistor can be accurately formed. In addition, as can be seen with reference to Tables 1 & 2 below, a large deep trench having horizontal dimensions of approximately $3F \times F = 3F^2$ is available, resulting in a shallower deep trench depth than the MINT cell of FIGS. 1A and 1B. This simplifies the deep trench processing and reduces manufacturing costs. Still further, a well-controlled shallow trench isolation process is realized since the STI depth is shallower than in the MINT cell and can be more easily filled, active area patterning is easier than in a MINT cell, and STI height control is better than in a MINT cell due to enhanced uniformity of the pad silicon nitride since the pad silicon nitride is not affected by the deep trench processes in the invention.

Figure 6:
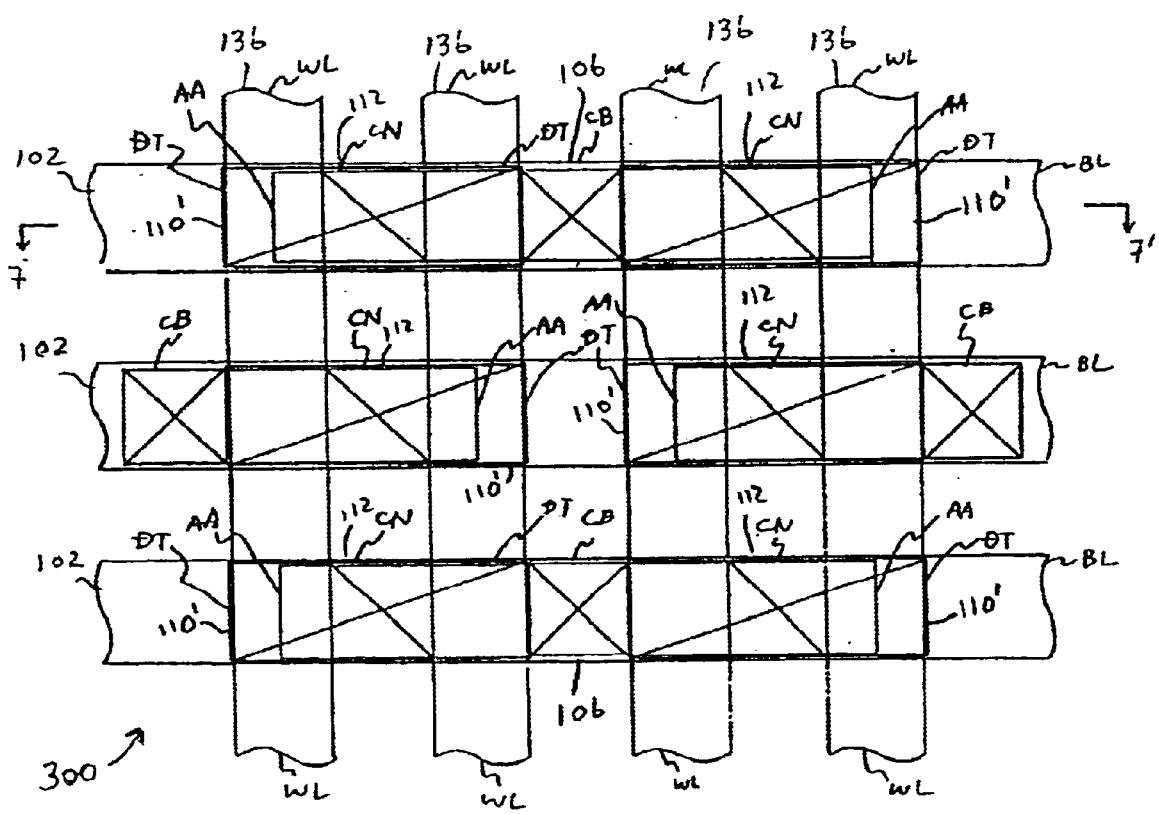
FIG. 6 is a top-down view of a semiconductor memory device in accordance with a second embodiment of the present invention.

FIG. 6 is a top-down view of a memory device in accordance with a second embodiment of the present invention. FIG. 7 is a cross-sectional view taken along line 7–7' of FIG. 6. The portions of the memory device of FIGS. 6 and 7 which are the same as in the first embodiment are denoted by the same reference numbers. With reference to FIG. 6, memory device 300 includes bit lines 102 formed to extend in a first direction (i.e., horizontally in FIG. 6) and word lines 136 formed to extend in a second direction (i.e., vertically in FIG. 6). Bit line contacts 106 are arranged at a one-half pitch. That is, the bit line contacts for every other bit line are vertically aligned. A plurality of active areas AA are defined by shallow trench isolation (STI) structures 108 (see FIG. 7). Active areas AA have a width extending in the word line direction and a length extending in the bit-line direction. The trench capacitors (storage nodes) of the memory cells are formed in deep trenches 110'. Deep trenches 110' have a width extending in the word line direction and a length extending in the bit line direction. Storage node contacts 112 are located between adjacent ones of the word lines and provide an electrical connection between the trench capacitors and the transfer gates.

In the second embodiment, deep trenches 110' are oriented in a direction which is orthogonal to the direction in which the deep trenches 110 are oriented in the first embodiment. Because of this, forming the semiconductor memory device of FIGS. 6 and 7 using the method described with respect to FIGS. 5A–5J will cause the transfer transistors to be formed in the portion of the epitaxial layer over the deep trench. As noted above, this portion of the epitaxial layer may have defects which could adversely affect the operation of the transfer transistors. In order to provide a high quality epitaxial layer in which to form the transfer transistors, the epitaxial layer may be subjected to a high temperature annealing process (e.g., at a temperature of about 1100° C. in an atmosphere of $N_2$). Alternatively, a laser or an electron beam anneal may be used. In still another alternative embodiment, a wafer bonding technique such as that shown in FIG. 8 may be utilized. Specifically, a first silicon wafer 302 having the trench capacitors formed therein is bonded to a second silicon wafer 306 having shallow trench isolation regions 108 formed therein. Second silicon wafer 306 is then polished by, for example, chemical mechanical polishing (CMP) to provide a silicon layer 308 having a thickness of, for example, about 0.15 micrometers ($\mu$m) for a 1 Gbit DRAM. The process steps of FIGS. 5E–5J may then be carried out to form the semiconductor memory device of FIGS. 6 and 7. In this way, the problems associated with low quality epitaxial films grown over the deep trenches can be avoided.

Figure 9A:
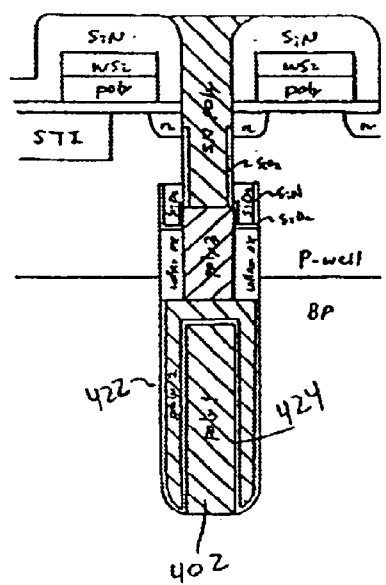
FIGS. 9A and 9B are storage node cross-sections corresponding to the views of FIGS. 4A and 4B for a semiconductor memory device in accordance with a third embodiment of the present invention.
Figure 9B:
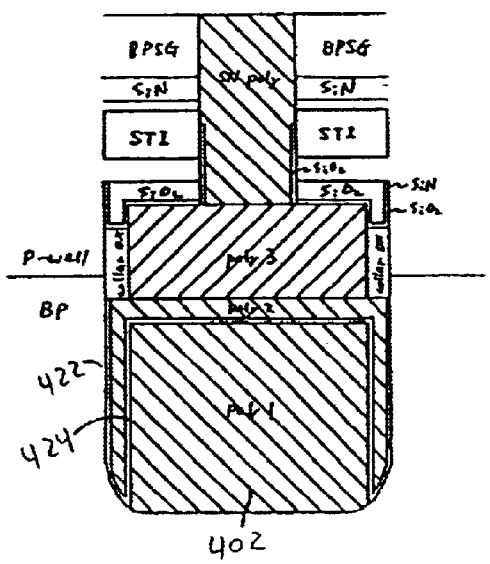

FIGS. 9A and 9B show a cross-section of a memory cell in accordance with a third embodiment of the present invention. In the embodiment of FIGS. 9A and 9B, first trench fill 402 has a cylindrical shape. In this way, the depth of the trench in which the capacitor is formed can be decreased. A memory cell of this embodiment can be formed by performing the steps as in the first embodiment for forming the deep trenches. After the deep trench etch, an oxide layer 422 having a thickness, for example, of 50 nanometers (nm) is deposited and etched by reactive ion etching so as to remain on the deep trench sidewall. Then an $N^{\pm}$ type polycrystalline silicon layer is deposited and etched back to a level which is about 1 micrometer ($\mu$m) below the surface of the semiconductor substrate. Then, a node dielectric film 424 is formed. Next, a second polysilicon layer is deposited and etched back to a level which is 0.1 higher than the first polysilicon layer 402. After this, the process is the same as the process for the first embodiment.

TABLE 1

| Cell Type | MINT | First Embodiment/ Second Embodiment | Third Embodiment |
|---|---|---|---|
| Design Rule, F | 0.18 $\mu$m | 0.18 $\mu$m | 0.18 $\mu$m |
| Cell Size | 0.36 × 0.72 $\mu$m$^2$ = 0.2592 $\mu$m$^2$ | 0.36 × 0.72 $\mu$m$^2$ = 0.2592 $\mu$m$^2$ | 0.36 × 0.72 $\mu$m$^2$ = 0.2592 $\mu$m$^2$ |
| Trench Size | 0.22 × 0.36 $\mu$m$^2$ = 0.0792 $\mu$m$^2$ | 0.20 × 0.60 $\mu$m$^2$ = 0.12 $\mu$m$^2$ | 0.20 × 0.60 $\mu$m$^2$ = 0.12 $\mu$m$^2$ |
| Cs | 30 fF | 30 fF | 30 fF |
| $T_{ox}$ effective | 4 nm | 4 nm | 4 nm |
| Total Trench Depth | 7.0 $\mu$m | 4.9 $\mu$m | 3.0 $\mu$m |
| Aspect ratio of Trench | 32 | 25 | 15 |

Table 1 provides a cell comparison for the first generation of 1 Gbit DRAM devices having a 0.18 micron design rule. As can be seen from the data set forth in Table 1, DRAM devices manufactured in accordance with the embodiments of the present invention provide the same capacitance as scaled down cells manufactured in accordance with the MINT architecture shown in FIGS. 1A and 1B of this patent application, while at the same time providing trenches with smaller aspect ratios within which the capacitors are formed. Specifically, 1 Gbit memory cells in accordance with the first and second embodiments of the present invention have trench capacitors formed in trenches with aspect ratios which are 28% less than the aspect ratio of the trenches for 1 Gbit memory cells based on scaling down the current MINT architecture. Memory cells in accordance with the third embodiment of the present invention have trench capacitors formed in trenches with aspect ratios which are more than 50% less than the aspect ratios of the trenches for the scaled down MINT architecture. As noted above, the ability to achieve a high capacitance for trench capacitors formed in trenches with small aspect ratios provides for easier manufacturing.

TABLE 2

| Cell Type | MINT | First Embodiment/ Second Embodiment | Third Embodiment |
|---|---|---|---|
| Design Rule, F | 0.12 $\mu$m | 0.12 $\mu$m | 0.12 $\mu$m |
| Cell Size | 0.24 × 0.48 $\mu$m$^2$ = 0.1152 $\mu$m$^2$ | 0.24 × 0.48 $\mu$m$^2$ = 0.1152 $\mu$m$^2$ | 0.24 × 0.48 $\mu$m$^2$ = 0.1152 $\mu$m$^2$ |
| Trench Size | 0.15 × 0.26 $\mu$m$^2$ = 0.039 $\mu$m$^2$ | 0.14 × 0.38 $\mu$m$^2$ = 0.0532 $\mu$m$^2$ | 0.14 × 0.38 $\mu$m$^2$ = 0.0532 $\mu$m$^2$ |
| Cs | 25 fF | 25 fF | 25 fF |
| $T_{ox}$ effective | 3 nm | 3 nm | 3 nm |
| Total Trench Depth | 7.4 $\mu$m | 5.5 $\mu$m | 3.5 $\mu$m |
| Aspect ratio of Trench | 49 | 39 | 25 |

Table 2 provides a cell comparison for the first generation of 4 Gbit DRAM devices having a 0.12 micron design rule. AS can be seen from the data set forth in Table 2, DRAM devices manufactured in accordance with the embodiments of the present invention provide the same capacitance as scaled-down cells manufactured in accordance with the MINT architecture shown in FIGS. 1A and 1B of this patent application, while at the same time providing trenches with smaller aspect ratios within which the capacitors are formed. Specifically, 4 Gbit memory cells in accordance with the first and second embodiments of the present invention have trench capacitors formed in trenches with aspect ratios which are about 25% less than the aspect ratio of the trenches for 4 Gbit memory cells based on scaling down the current MINT architecture. Memory cells in accordance with the third embodiment of the present invention have trench capacitors formed in trenches with aspect ratios which are almost 50% less than the aspect ratios of the trenches for the scaled-down MINT architecture. As noted above, the ability to achieve a high capacitance for trench capacitors formed in trenches with small aspect ratios provides for easier manufacturing.

Next, a fourth embodiment of the present invention will be described.

Figure 10:
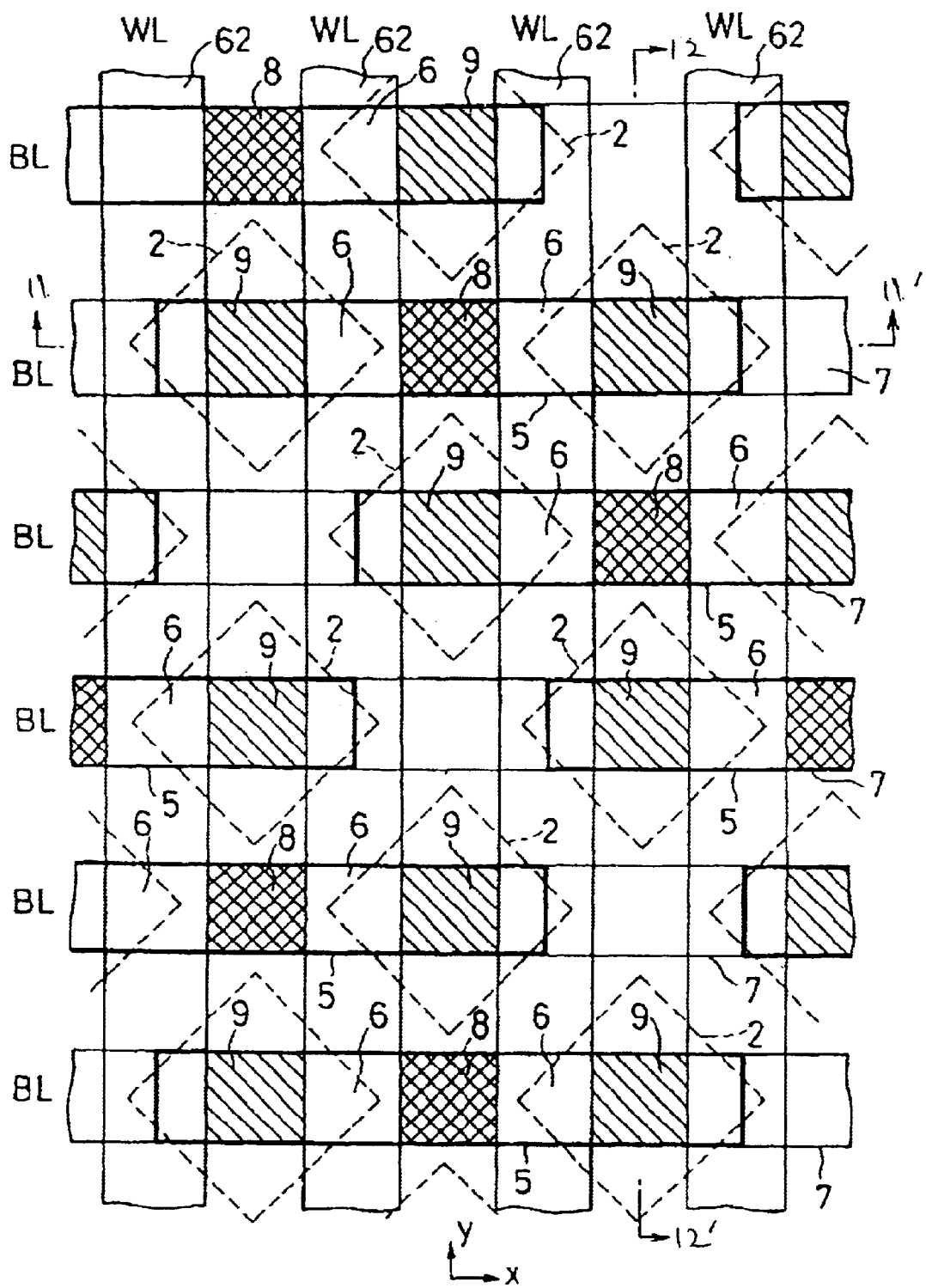
FIG. 10 is a top-down view of a semiconductor memory device in accordance with a fourth embodiment of the present invention.
Figure 11:
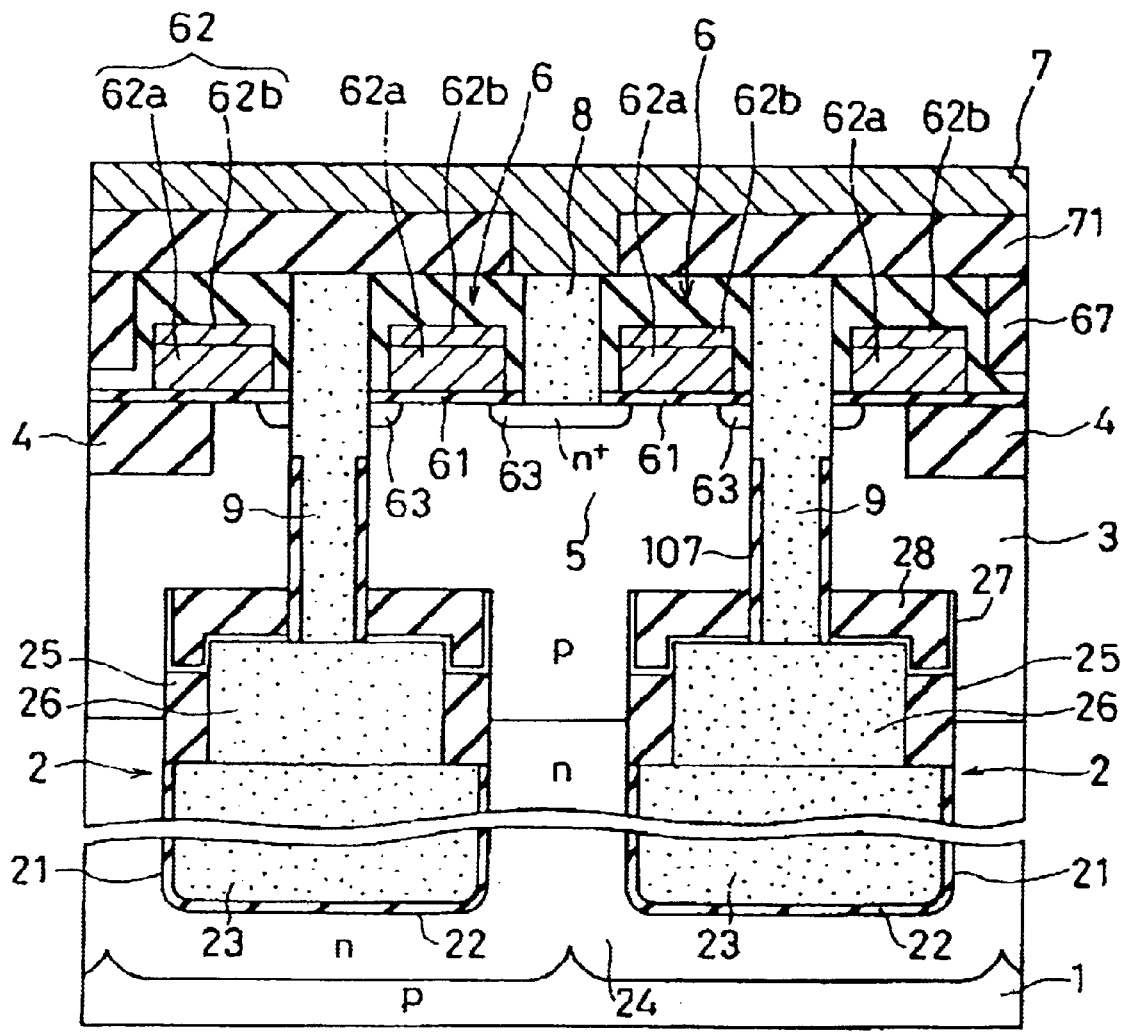
FIG. 11 is a cross-sectional view taken along line 11–11' of FIG. 10.
Figure 12:
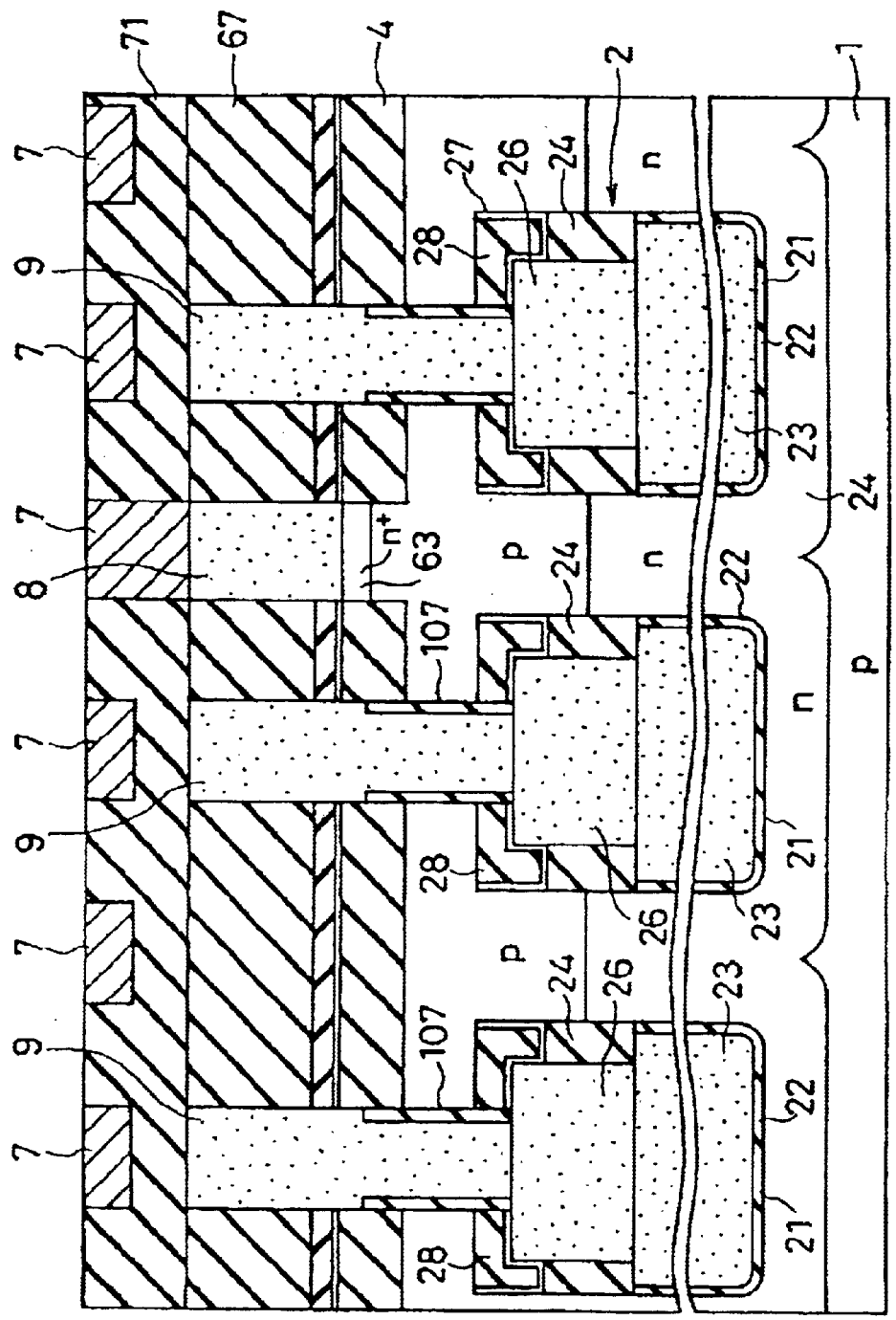
FIG. 12 is a cross-sectional view taken along line 12–12' of FIG. 10.

FIG. 10 shows the layout of a DRAM according to the fourth embodiment, and FIGS. 11 and 12 show cross-sectional views of FIG. 10. In this example, square trench capacitors (hereinafter simply called the "capacitor") 2 are arranged at a regular pitch on a silicon substrate 1, as indicated by broken lines in FIG. 10. The capacitors 2 have the size of 2F×2F, for example, where F is a minimum processing dimension, and are arranged in matrix at a regular pitch with a spacing of 1F between adjacent ones, such that their diagonal directions are coincident with two orthogonal directions of bit lines BL and word lines WL (hereinafter the direction of the bit lines BL is indicated by x, and the direction of the word lines WL is indicated by y), and in directions inclined 45° from the x-, y-directions (i.e., in directions in which two orthogonal sides of the capacitors extend). Actually, the spacing between the respective capacitors 2 may be 1F or less depending on work conditions in the formation of capacitor trenches, over-etching, and the like.

On the substrate 1 in which the capacitors 2 have been formed, a silicon layer 3 is epitaxially grown, and transistors 6 are formed in the silicon layer 3 such that each transistor 6 partially overlaps an associated capacitor 2. An active element area 5 in which a transistor 6 is formed, as surrounded by fat lines in FIG. 10, is defined by an element isolation insulating film 4 in an elongated island shape as having the dimension of 6F in the x-direction, such that the active element area 5 spreads over regions of two capacitors 2 adjoining in the x-direction. The active element areas 5 are arranged at a pitch of 2F in the x-direction and shifted sequentially at a one-quarter pitch in the y-direction.

The word lines WL are formed to provide gate electrodes 62 of the transistors 6 sequentially in the y-direction. Bit lines (BL) 7 are arranged orthogonal to the word lines WL.

The bit lines BL are connected to a common diffusion layer 63 of two adjacent transistors formed in a single element area 4 of source/drain diffusion layers 63 of the transistors 6 through a capacitor contact layer 8. The other diffusion layer 63 of the transistors is positioned in the region of the capacitor 2, and connected to a contact layer 9 buried on the capacitor 2. The contact layer 9 is self-aligned between the word lines and buried, as will be later described.

Specific steps of manufacturing the DRAM according to the fourth embodiment will be described with reference to a cross-sectional view of FIG. 11 and to FIGS. 13A to 13J corresponding to the cross-sectional view of FIG. 11.

First, a pad oxide film (silicon oxide film) 1101 having a thickness of approximately 5 nm is formed by thermal oxidization on a silicon substrate 1 (which is p-type at least in its memory cell array regions), and a pad nitride film (silicon nitride film) 1102 is deposited on the pad oxide film 1101 in a thickness of approximately 200 nm. A TEOS oxide film (not shown) is further deposited on the pad nitride film 1102. Then, a resist pattern for the trenches 2 as shown in FIG. 10 is formed on the TEOS oxide film by lithography, and the TEOS oxide film, the pad nitride film 1102, and the pad oxide film 1101 are etched by RIE (Reactive Ion Etching).

After the resist is stripped off, the pad nitride film 1102 and the pad oxide film 1101 are used as a mask to etch the silicon substrate 1 by RIE to form trenches 21 for capacitors. After the formation of the trenches 21, their interiors are slightly oxidized, and an n-type buried plate 24 is formed by solid-phase diffusion involving deposition of ASG and heat treatment, or by As vapor-phase diffusion. The n-type buried plate 24 is formed such that a p-type layer remains above the trenches, instead of the n-type. After the formation of the buried plate 24, a capacitor insulating film 22 is formed on trench sidewalls. The capacitor insulating film 22 is a silicon nitride film or a laminate of a silicon nitride film and a silicon oxide film, and has a thickness of approximately 3 nm oxide film equivalent.

Further, an As doped polycrystalline silicon is deposited, and recessed by CMP (Chemical Mechanical Polishing) or RIE such that the surface is positioned below the buried plate 24, to bury a capacitor node layer (storage node layer) 23 in the trenches 21. Subsequently, the capacitor node layer 23 is used as a mask to etch an upper portion of the capacitor insulating film 21 (see FIG. 13A up to this step).

Figure 13A:
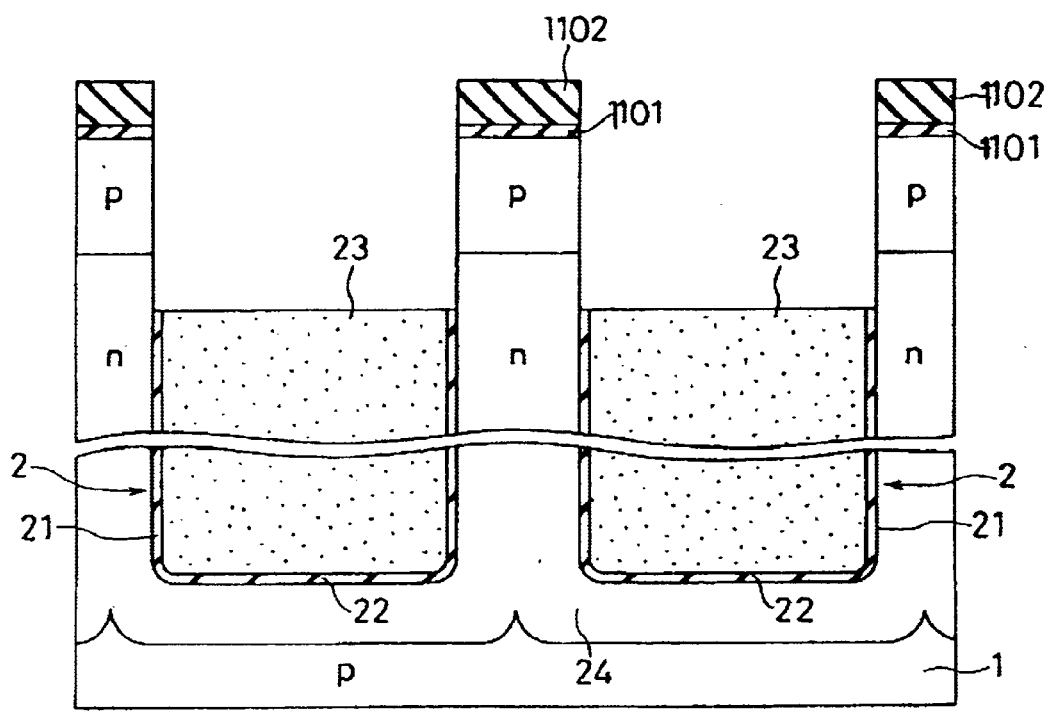
FIGS. 13A–13J are cross-sectional views which illustrate a method of manufacturing the semiconductor memory device of FIG. 10.
Figure 13B:
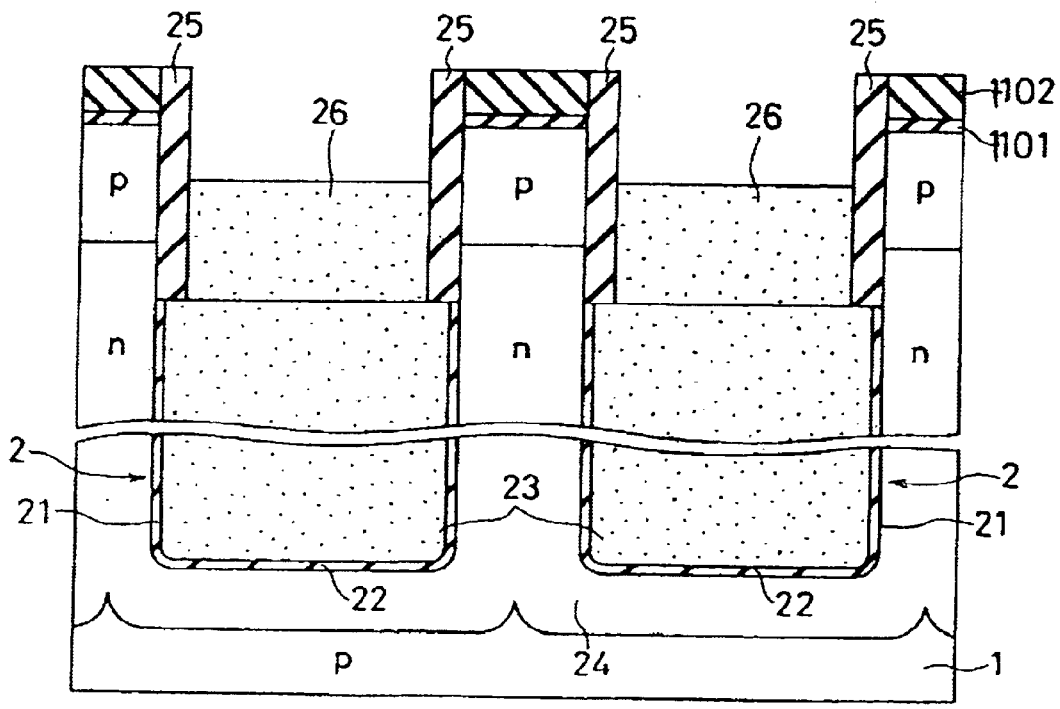

Next, after the portion above the trenches is lightly oxidized, a thick silicon oxide film 25 is deposited, and etched by RIE so that this is left on the sidewalls of the trenches 21. The silicon oxide film 25 acts to prevent a vertical parasitic transistor from operating between the buried plate 24 and an n-type diffusion layer of a subsequently formed transistor. Subsequently, an As doped polycrystalline silicon is again deposited and recessed by CMP and RIE such that the surface is positioned below the surface of the silicon substrate 1 to buried a second capacitor node layer 26 as shown in FIG. 13B.

Figure 13C:
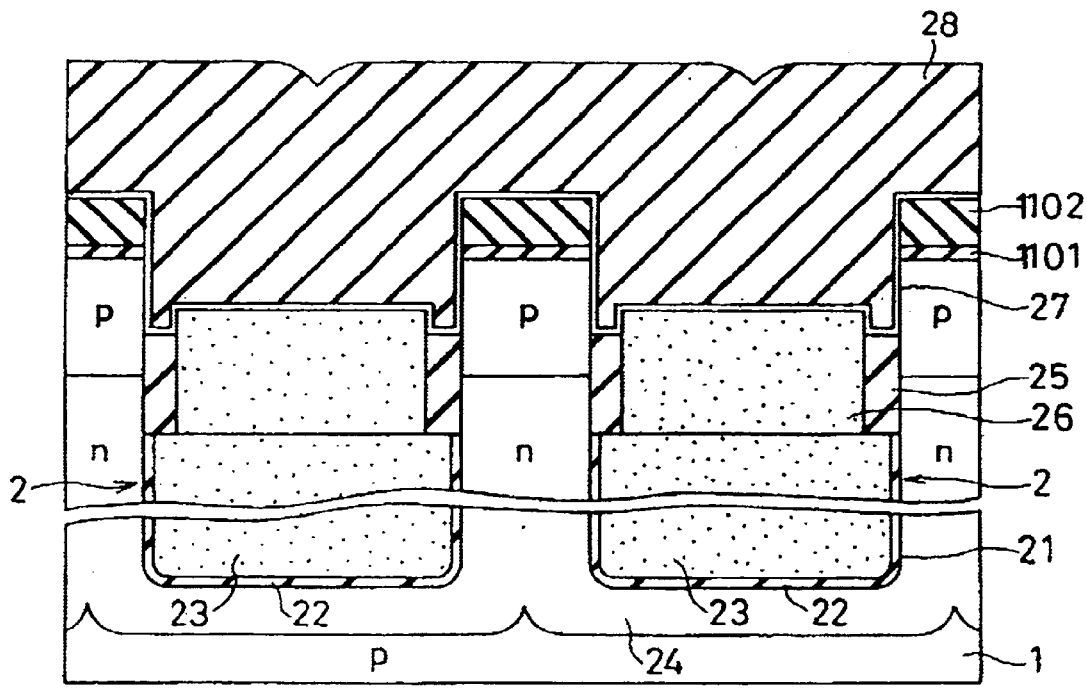
Figure 13D:
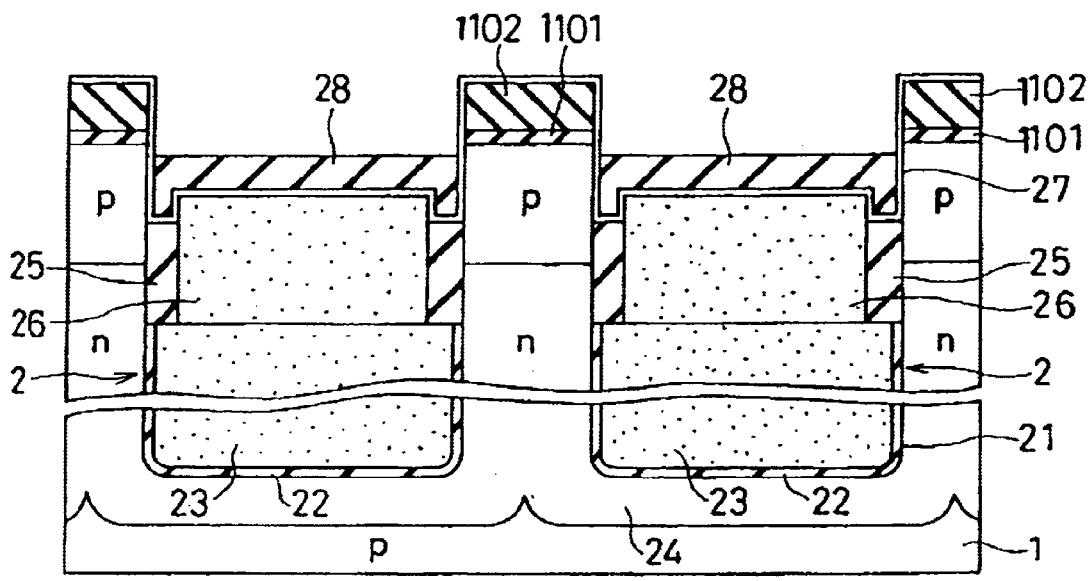
Figure 13E:
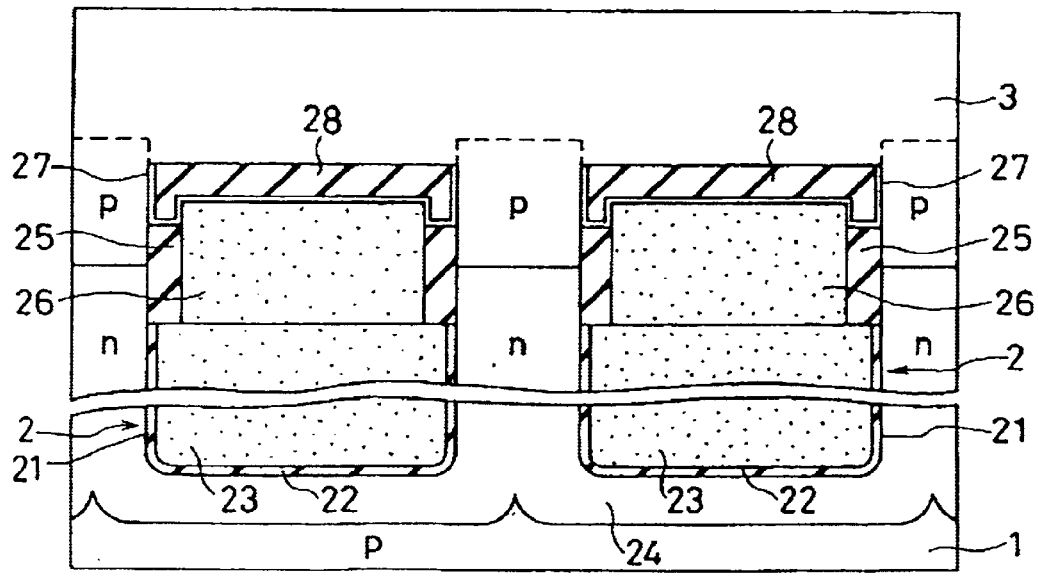

Next, for preventing the capacitor node layers 23, 26 in the trenches 21 formed of polycrystalline silicon from being oxidized in subsequent steps, a silicon nitride film 27 and a silicon oxide film 28 are formed in laminate as shown in FIG. 13C. Then, the silicon oxide film 28 is planarized by CMP processing, and the silicon oxide film 28 is etched by RIE such that the surface of the silicon oxide film 28 is positioned below the surface of the silicon substrate 1, as shown in FIG. 13D. This is required to obtain silicon crystals of high quality in a subsequent silicon layer epitaxial step. Also, the silicon oxide film 28 serves as a cap insulating film for covering the capacitor node layer 26 which isolates a subsequently formed silicon layer and the capacitor node layer 26.

Next, after the oxide film 1101 and the nitride film 1102 have been removed, a silicon layer 3 is epitaxially grown in a thickness of approximately 2 μm. Then, the CMP processing is performed for planarizing the surface to leave the silicon layer 3 of approximately 500 nm in thickness (see FIG. 13E up to this step). In this case, hydrogen anneal may be used in combination in order to reduce the burden of the planarization on the CMP processing. Since the silicon layer 3 grows into crystallization with the crystal surface of the silicon substrate 1 existing around the capacitors 2 as species, the silicon layer 3 will have the crystallinity of good quality suitable for the formation of transistors. The silicon layer 3 is undoped (i-type) during the growth, and is implanted with well ions to form a p-type well.

Figure 13F:
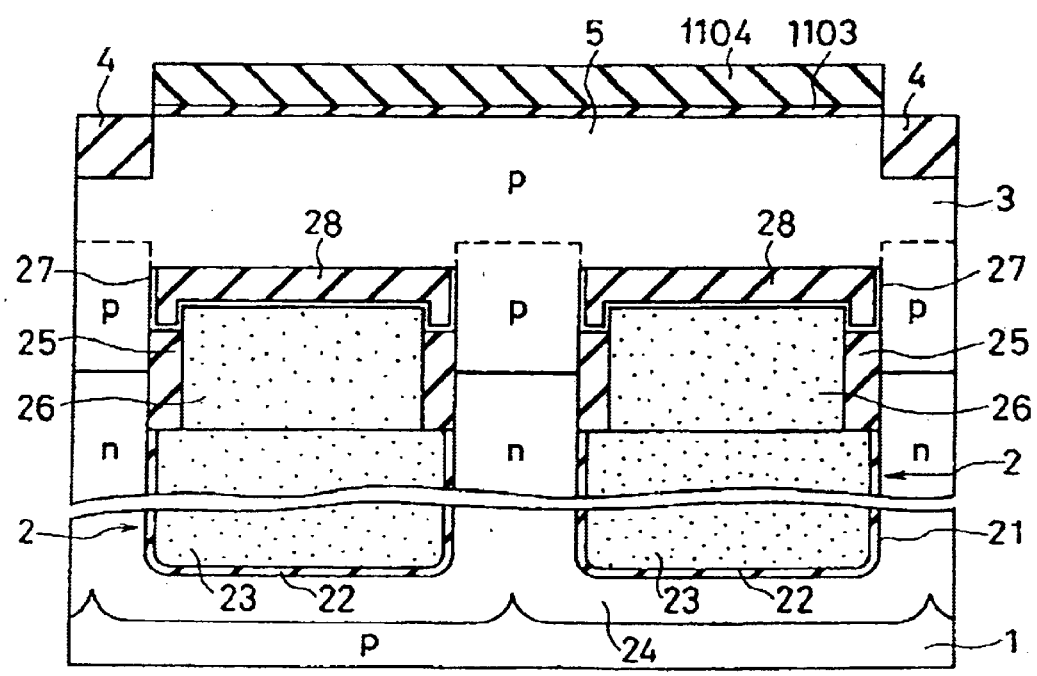

Next, an element isolation step is performed using the STI (Shallow Trench Isolation) technique. As shown in FIG. 13F, a silicon oxide film 1103 and a silicon nitride film 1104 are deposited, and a resist pattern (not shown) for active element areas 5 is formed thereon by lithography to etch the nitride film 1104 and the oxide film 1103. Then, these nitride film 1104 and oxide film 1103 are used as a mask to etch the silicon layer 3 by RIE to form element isolation grooves, followed by burying an element isolation film 4 formed of a CVD silicon oxide film, as shown in FIG. 13F. In this way, each active element area 5 spreads over two capacitors 2 adjoining in the x-direction as previously indicated by fat lines in FIG. 10. Consequently, the active element areas 5 are arranged as a pattern of elongated island regions spaced at a pitch of 2F and shifted at a one-quarter pitch in the y-direction.

Subsequently, the nitride film 1104 and the oxide film 1103 are removed, and a sacrifice oxide film (not shown) is formed in the element areas 5. Then, ions are implanted into the element areas 5 through the sacrifice oxide film for forming wells and for adjusting a threshold value. This results in p-type wells formed in the element areas 5. After the sacrifice oxide film has been stripped off, a step of forming transistors 6 follows. Specifically, a gate insulating film 61 is formed, for example, of a silicon oxide-nitride film, and gate electrodes 62 are patterned on the gate insulating film 61. The gate electrodes 62 are formed by laminating a polycrystalline silicon film 62a of 70 nm in thickness, a tungsten nitride/tungsten film 62b of 45 nm in thickness and a silicon nitride film 64 of 150 nm in thickness, and patterning these films by lithography.

Figure 13G:
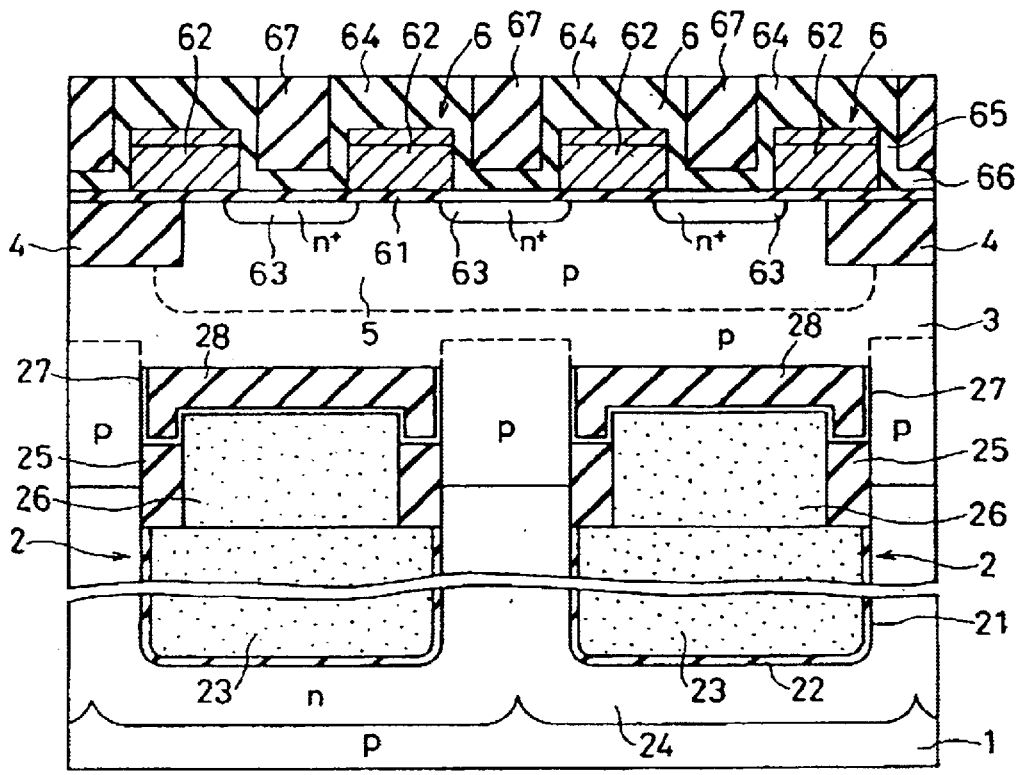

As shown in FIG. 10, the gate electrodes 62 are sequentially arranged, serving as word lines WL. Then, after a silicon nitride film 65 is formed on sidewalls of the gate electrodes 62, ions are implanted to form an n-type diffusion layer 63 which is formed into sources and drains. Further, a BPSG film 67, which later serves as an interlayer insulating film, is deposited through a thin silicon nitride film 66 for etch stop, and subjected to the CMP processing. This results in the BPSG film 67 buried between the gate electrodes 62 to planarize the overall top surface, as shown in FIG. 13G.

Figure 13H:
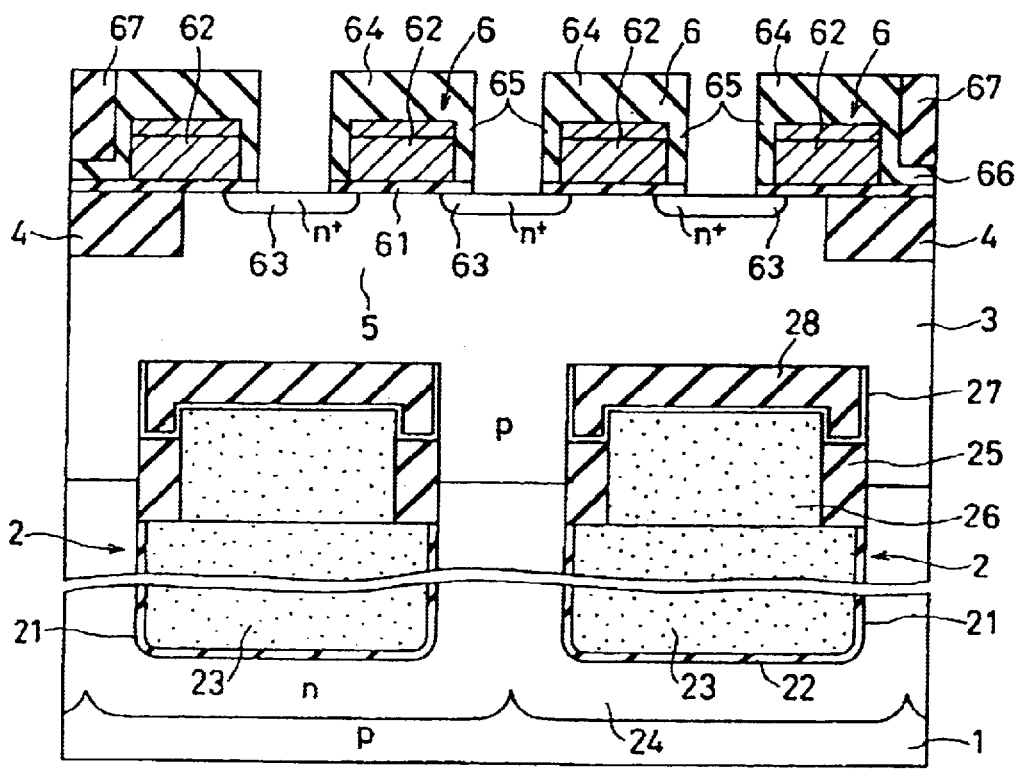
Figure 13:
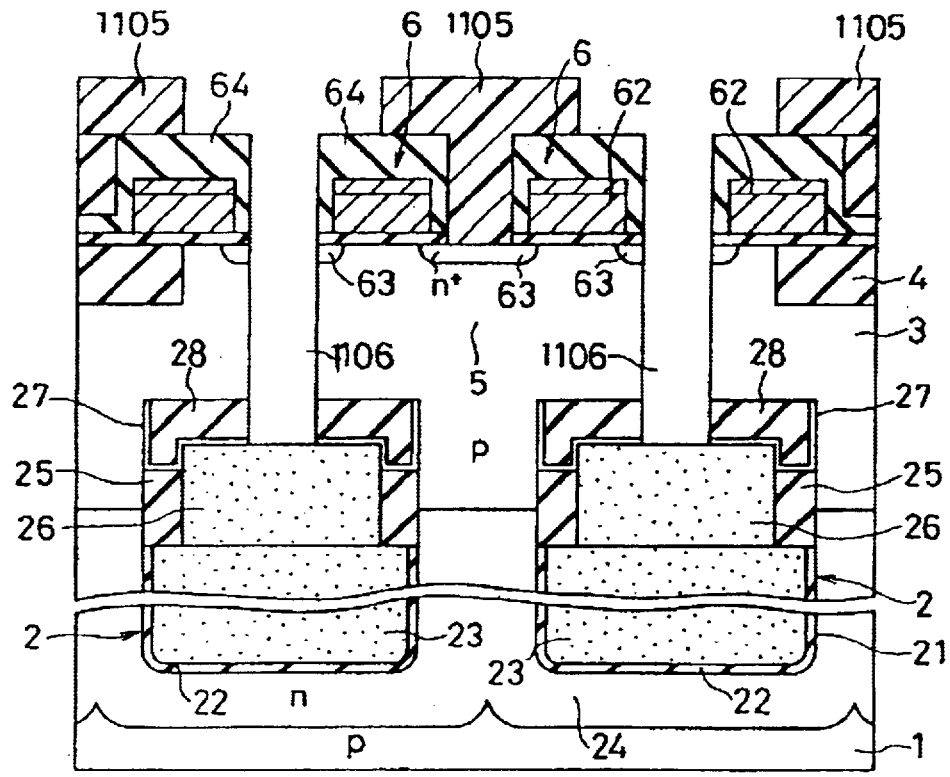
Figure 13:
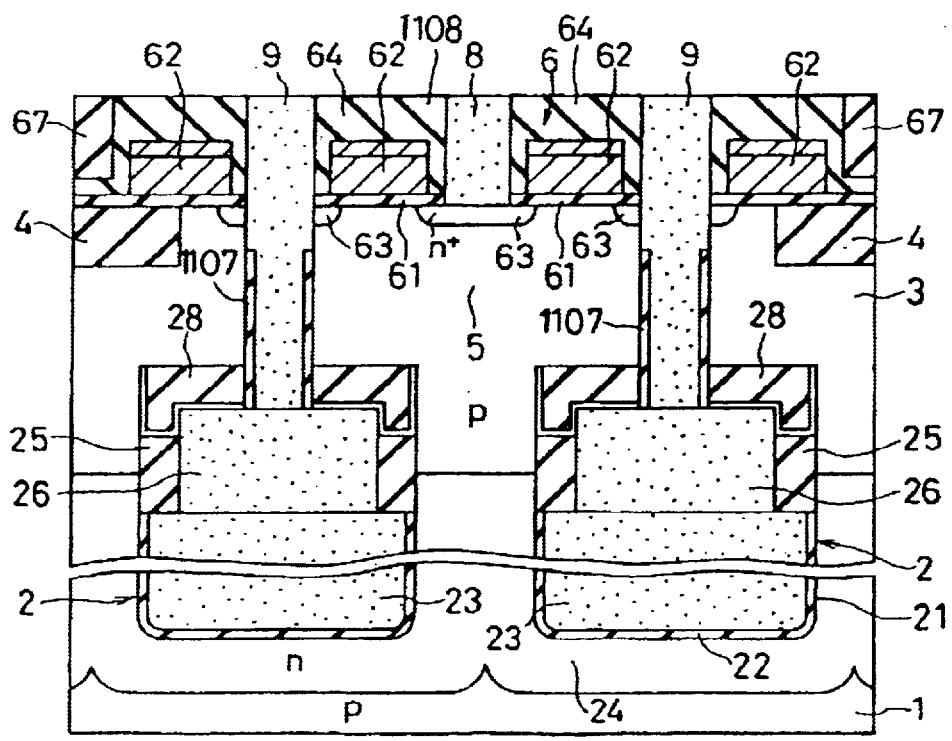

Next, a step is performed for simultaneously forming capacitor contacts and bit line contacts. First, a resist pattern (not shown) having a pattern reverse to that for the element areas 5 is formed, and the BPSG film 67 overlying the element areas 5 are etched as shown in FIG. 13H. Further, the thin silicon nitride film 66 below the BPSG film 67 is etched by RIE to expose the surface of the silicon layer 3, i.e., the surface of the n-type diffusion layer 63.

Next, as shown in FIG. 13I, a resist pattern 1105 having openings corresponding to the regions of the capacitors 2 is formed and used to etch the silicon layer 3 by an etching technique having a higher selection rate to the silicon nitride film. The exposed silicon oxide film 28 is also etched to form contact holes 1106 for the capacitor node layer 26. In this case, the positions of the contact holes 1106 are determined by the spaces between the respective gate electrodes 62, i.e., the alignment of the gate electrodes 62 to the capacitors 2 with respect to a 11–11' direction on the layout of FIG. 10. With respect to a 12–12' direction, in turn, the positions of the contact holes 1106 are determined by the alignment of the element areas 5 to the capacitors 2. Since a sufficient alignment allowance is ensured anyway, it is unlikely that the contact holes 1106 misalign to the capacitor node layer 26 to increase a contact resistance.

After the resist pattern 1105 has been removed, a collar insulating film 1107 is formed on sidewalls of the contact holes 1106 for preventing vertical parasitic transistors from operating, as shown in FIG. 13J. This step involves first depositing a TEOS oxide film in each contact hole 1106 approximately 20 nm in depth and etching the TEOS oxide film by RIE to leave the same only on the sidewall of the contact hole 1106. Further, a resist is buried in each contact hole 1106, and recessed to expose a connection of the sidewall insulating film with the source/drain diffusion layer 63. Consequently, the collar insulating film 1107 is formed with the connection with the n-type diffusion layer 63 being exposed.

In the foregoing step of forming the collar insulating film 1107, since no resist remains in bit line contact portions, the BPSG film 67 is removed to form contact holes 1108 in a wet etching step. Then, an As doped polycrystalline silicon is next deposited and etched by CMP or RIE for planarization to simultaneously form a capacitor contact layer 9 for connecting the diffusion layer 63 of the transistors 6 to the capacitor node layer 26, and a bit line contact layer 8, as shown in FIG. 13J. The transistor diffusion layer 63 is connected to an upper side surface of the buried contact layer 9.

It should be noted that very thin silicon nitride films may be effectively formed on the sidewalls of the contact holes 1106 before depositing polycrystalline silicon in order to reduce a junction leakage between the contact layer 9 formed of n-type polycrystalline silicon and the p-type silicon 3 and prevent the contact layer 9 from being crystallized from a portion which contacts the silicon layer 3.

Finally, a well-known Damascene process is used to form bit lines 7 through an interlayer insulating film 71 as shown in FIGS. 11 and 12. Though not shown, a well-known metal wiring technique is subsequently applied to complete the DRAM.

According to the fourth embodiment, the capacitors are maximally closely arranged at a regular pitch of 1F or less, resulting in maximally increased capacitor areas and a capacitor peripheral length with respect to the memory cell area and therefore a maximum capacitance of the capacitors. Further, since the capacitors have a larger area and a symmetrical shape, the aspect ratio can be reduced when the capacitor trenches are formed, thus facilitating the formation of the capacitors. Furthermore, the capacitors having one side equal to 2F result in a large alignment allowance for the formation of the contacts of the transistors to the capacitor node layer, thereby making it possible to form the contacts of low resistance.

Next, a fifth embodiment will be described.

Figure 14A:
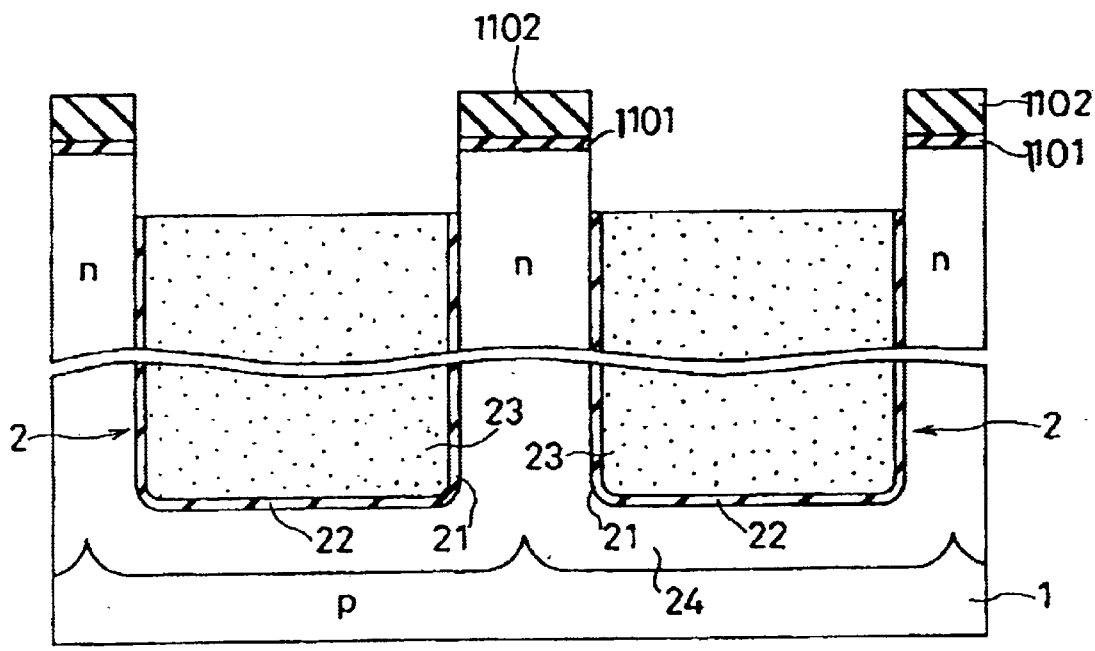
FIGS. 14A–14D are cross-sectional views which illustrate a method of manufacturing a semiconductor memory device in accordance with a fifth embodiment of the present invention.

In the fourth embodiment, the buried plate 24 made of an n-type layer is formed such that a p-type layer remains over the silicon substrate 1. On the other hand, in the fifth embodiment, a buried plate 24 is formed beyond the top of the silicon substrate 1. A cross-section of the fifth embodiment corresponding to FIG. 13A of the fourth embodiment is shown in FIG. 14A.

Similar to the fourth embodiment, after RIE is performed for forming capacitor trenches 21, ASG solid-phase diffusion or vapor-phase As diffusion is performed to form the buried plate 24. In this case, the buried plate 24 is formed beyond the top of the silicon substrate 1, as shown in FIG. 14A. The formation of such buried plate 24 eliminates the resist recess etching step (when the ASG solid-phase diffusion is employed) or the formation of a block layer (when the vapor-phase As diffusion is employed), which is required in the fourth embodiment, thereby reducing the number of required steps.

After the formation of the buried plate 24, a capacitor insulating film 22 is formed, and a capacitor node layer 23 made of As doped polycrystalline silicon is buried. An upper end of the capacitor node layer 23 is positioned below the top of the silicon substrate 1, and the capacitor insulating film 22 beyond the upper end of the capacitor node layer 23 is removed by wet etching. The resulting structure is depicted in FIG. 14A.

Figure 14B:
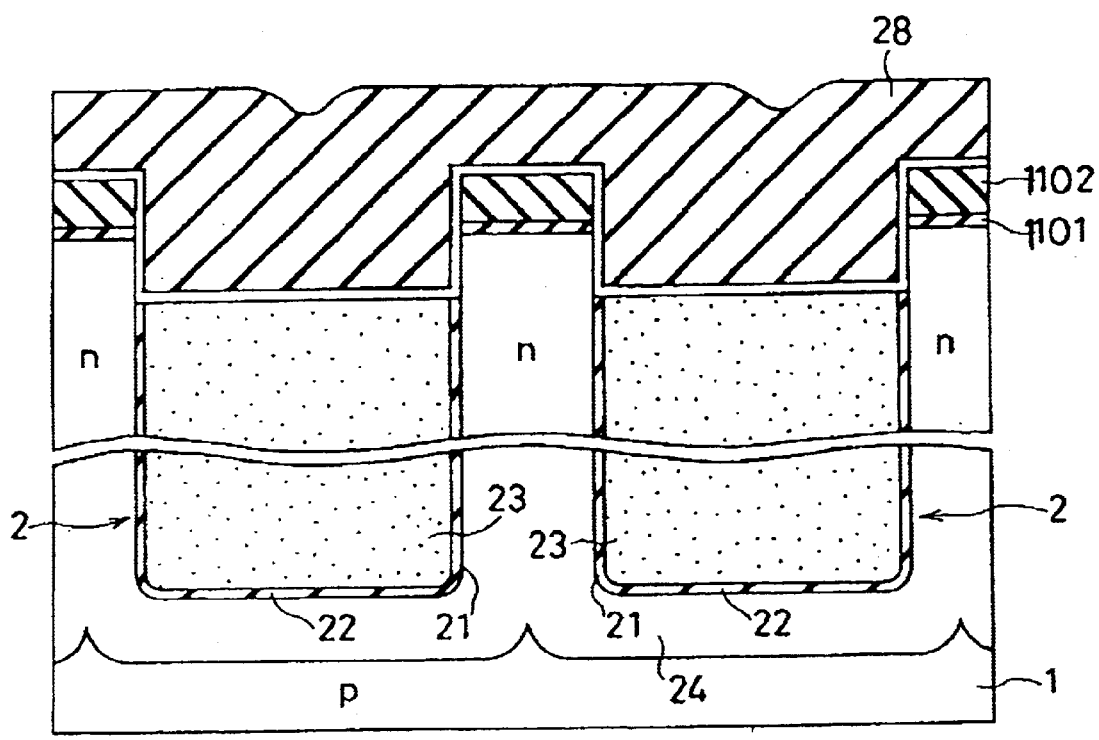
Figure 14C:
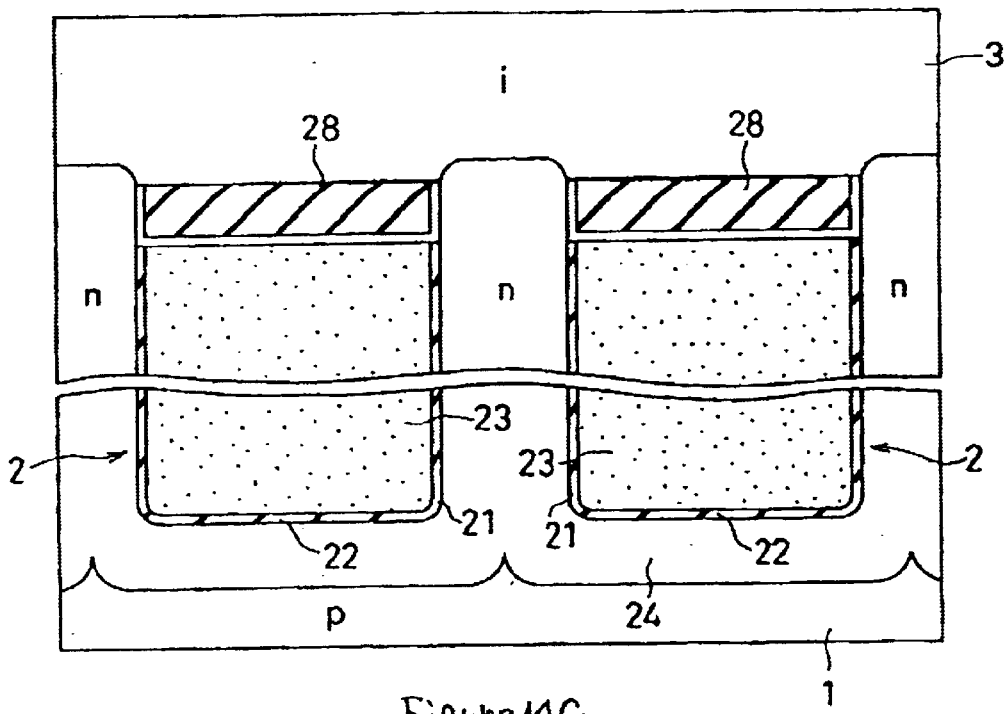

Subsequently, as shown in FIG. 14B, a silicon oxide film 28 is deposited for preventing oxidization of the capacitor node layer 23 and for isolation of the capacitor nodes 23 from the substrate 1. After the oxide film 28 is planarized by CMP, the oxide film 28 is recessed by RIE or the like such that the surface of the oxide film 28 is positioned below the top of the substrate 1. Then, after the oxide film 1101 and the nitride film 1102 are stripped off, a silicon layer 3 is epitaxially grown as shown in FIG. 14C. After the growth of approximately 2 μm, the silicon layer 3 is planarized by CMP such that it remains in a thickness of approximately 500 nm. In this case, hydrogen anneal may be used in combination in order to reduce the burden of the planarization on the CMP processing. Since the silicon layer 3 grows into crystallization with the crystal surface of the silicon substrate 1 existing around the capacitors 2 as species, the silicon layer will have the crystallinity of good quality suitable for the formation of transistors even on the regions of the capacitors 2.

Figure 14D:
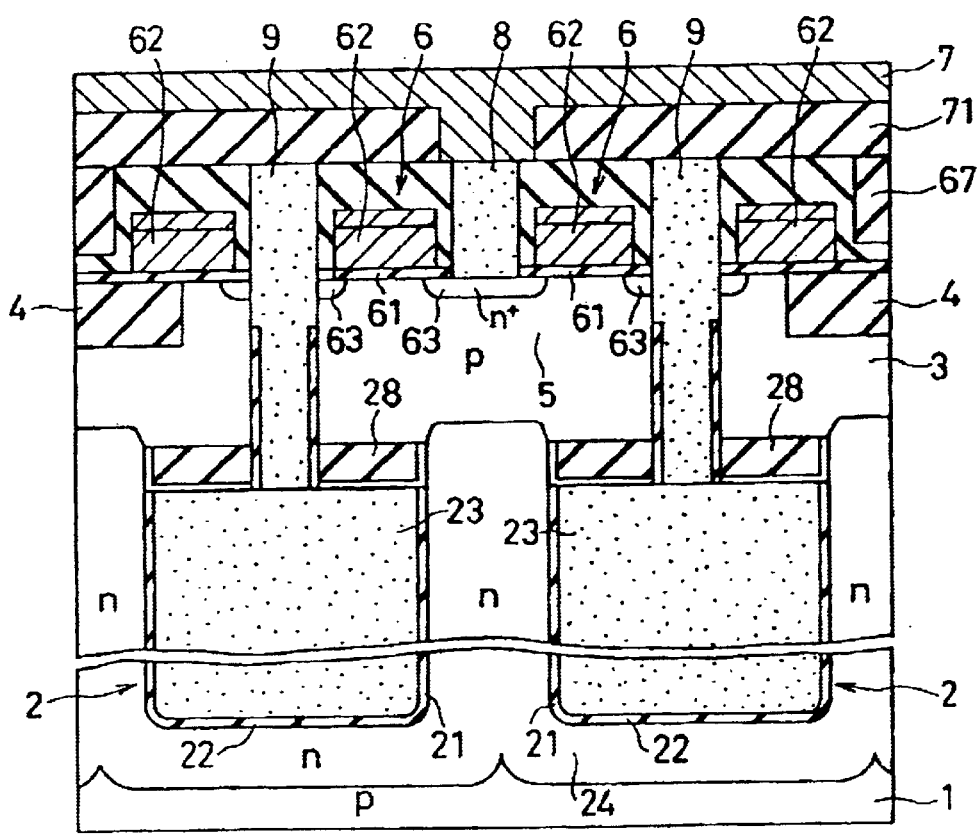

Subsequently, similar steps to those of the fourth embodiment are executed to complete the DRAM. FIG. 14D shows a cross-section corresponding to FIG. 11 after bit lines 7 have been formed.

According to the fifth embodiment, the formation of the buried plate beyond the top of the silicon substrate can result in the elimination of the resist recess etching step for determining the top of the buried plate. Also, in contract with the fourth embodiment which involves burying the two-step capacitor node layer, the fifth embodiment does not require the collar oxide film overlying the capacitors, thereby resulting in a larger area of the capacitor node layer and a larger allowance for the contact holes, as compared with the first embodiment.

Next, a sixth embodiment of the present invention will be described.

Figure 15:
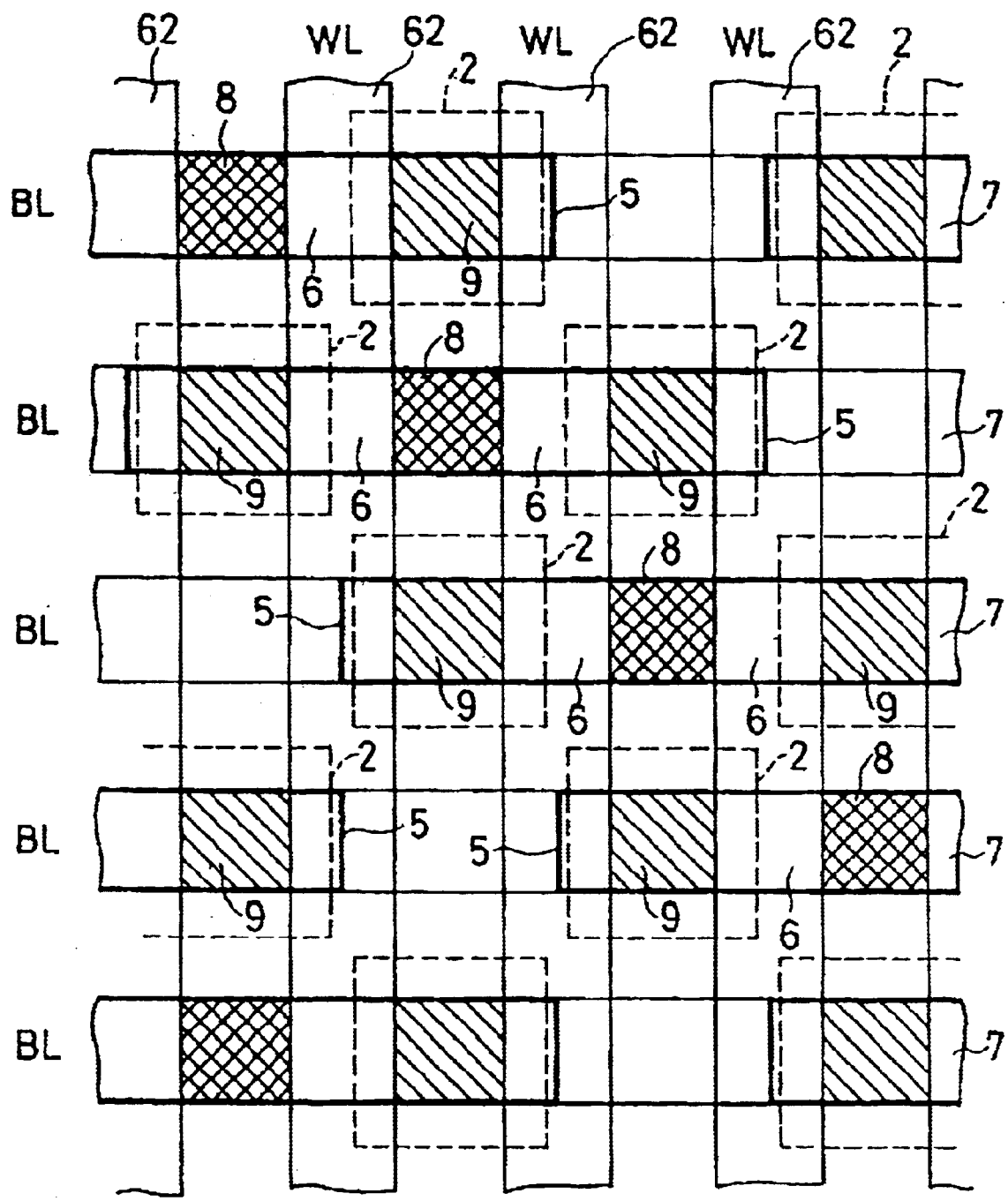
FIG. 15 is a top-down view of a semiconductor memory device in accordance with a sixth embodiment of the present invention.

FIG. 15 shows the layout of a DRAM according to the sixth embodiment, corresponding to FIG. 10. In the sixth embodiment, the capacitor 2 is arranged in a tessellation pattern. Specifically, the capacitors 2 are shaped substantially in a squire having one side equal to 2F. The capacitors 2 have two sides aligned to the x- and y-directions, and are arranged at a regular pitch of 2F or more and shifted sequentially by a one-half pitch on adjacent bit lines in the x-direction. Similarly in the y-direction, the capacitors 2 are spaced at a regular pitch of 2F or more, and shifted sequentially at a one-half pitch on adjacent word lines. Consequently, the capacitors 2 thus arranged appear as tessellation. The cross-sectional structure and the manufacturing steps of the sixth embodiment are similar to those of the fourth embodiment and the fifth embodiment.

According to the sixth embodiment, the capacitors have a maximally increased capacitor area and capacitor peripheral length with respect to the memory cell area so that a large capacitance can be provided. Also, since the aspect ratio can be reduced when the capacitor trenches are formed, the formation of the capacitors is facilitated. Furthermore, the use of capacitors having a larger area result in a larger alignment allowance for the contacts for connection of the transistor diffusion layers to the capacitors.

Next, a seventh embodiment of the present invention will be described, wherein a contact of a transistor diffusion layer for a capacitor node layer is improved. The seventh embodiment features in that a silicon layer 3 is formed through two epitaxial growth steps; transistors are formed after a contact layer is buried into a first silicon layer to reach a capacitor node layer, and a second silicon layer is formed; and a transistor diffusion layer has its bottom in contact with the contact layer for the capacitor node layer; and the like.

Since the layout of a DRAM according to the seventh embodiment is similar to that of the fourth embodiment or the sixth embodiment, description thereon is omitted, and manufacturing steps will be described below. The same steps are executed until the step of FIG. 13F in the fourth embodiment. Subsequent steps are shown in FIGS. 16A to 16F.

Figure 16A:
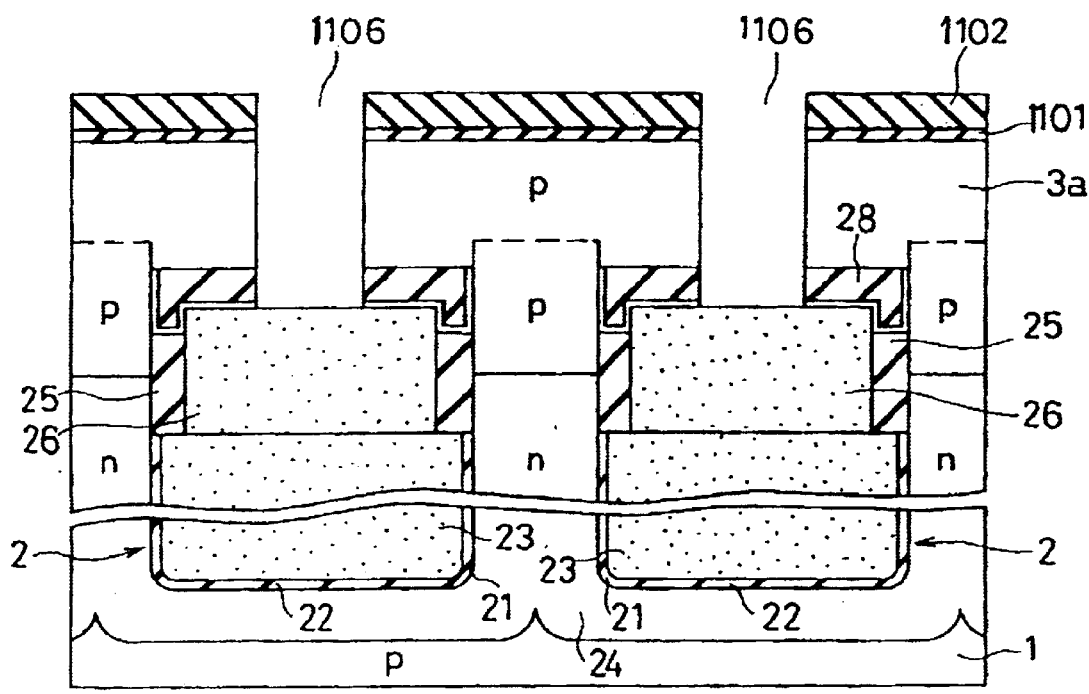
FIGS. 16A–16E are cross-sectional views which illustrate a method of manufacturing a semiconductor memory device in accordance with a seventh embodiment of the present invention.

FIG. 16A shows the structure after contact holes 1106 have been formed for a capacitor node layer 26 through a first silicon layer 3a epitaxially formed in a manner similar to the seventh embodiment.

Figure 16B:
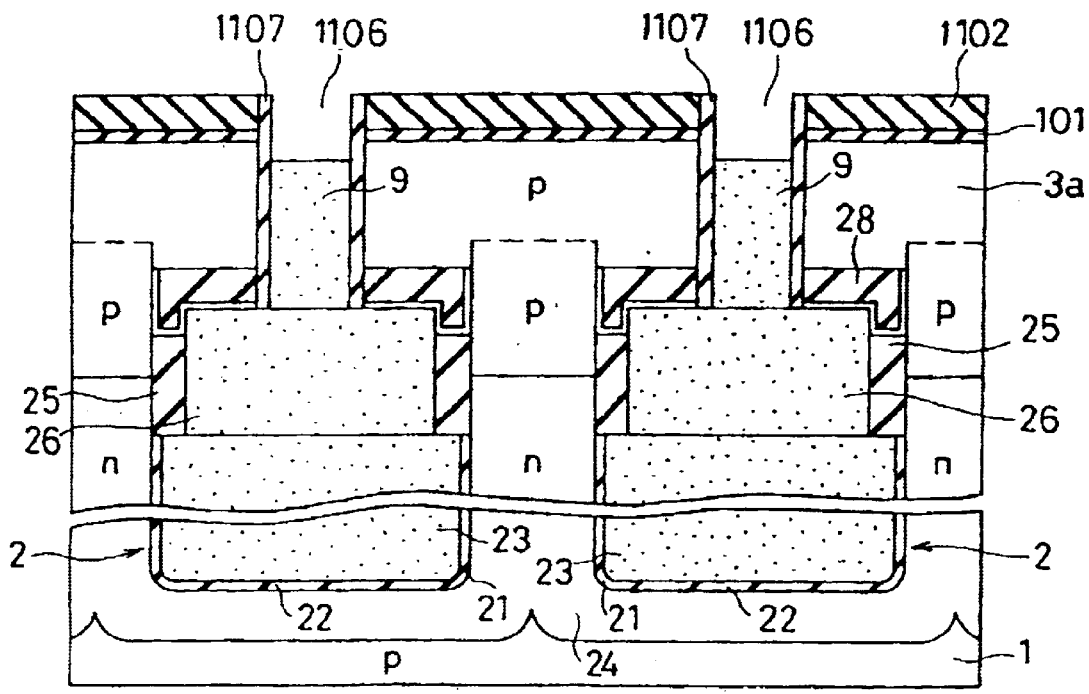

Subsequently, as shown in FIG. 16B, a collar oxide film 1107 is formed on the inner wall of each contact hole 1106. Specifically, a TEOS oxide film is deposited in each contact hole 1106 in a thickness of approximately 20 nm, and is etched by RIE such that the collar oxide film 1107 remains on the sidewall of the contact hole 1106. Next, a phosphor or arsenic doped polycrystalline silicon is deposited, etched by CMP and RIE, and buried as a capacitor contact layer 9 in the contact hole 1106. In this case, the contact layer 9 is buried such that its surface is positioned below the surface of the silicon layer 3a.

Figure 16C:
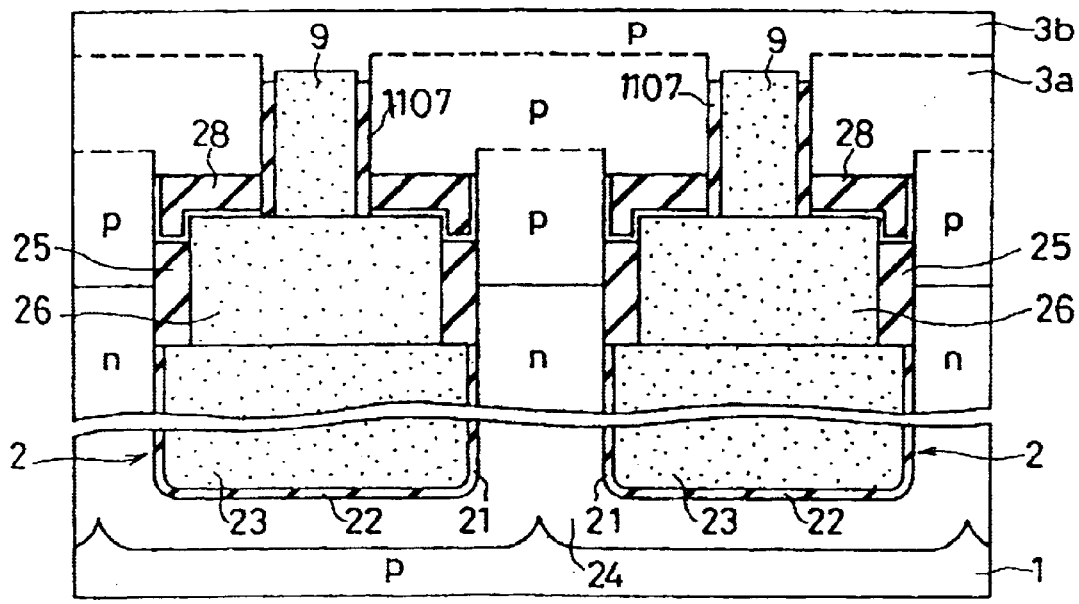

Next, after removing portions of the nitride film 1102, the oxide film 1101 and the collar oxide film 1107 which are exposed beyond the top of the contact layers 9, a second silicon layer 3b is epitaxially grown as shown in FIG. 16C. The surface of the second silicon layer 3b is planarized.

Figure 16D:
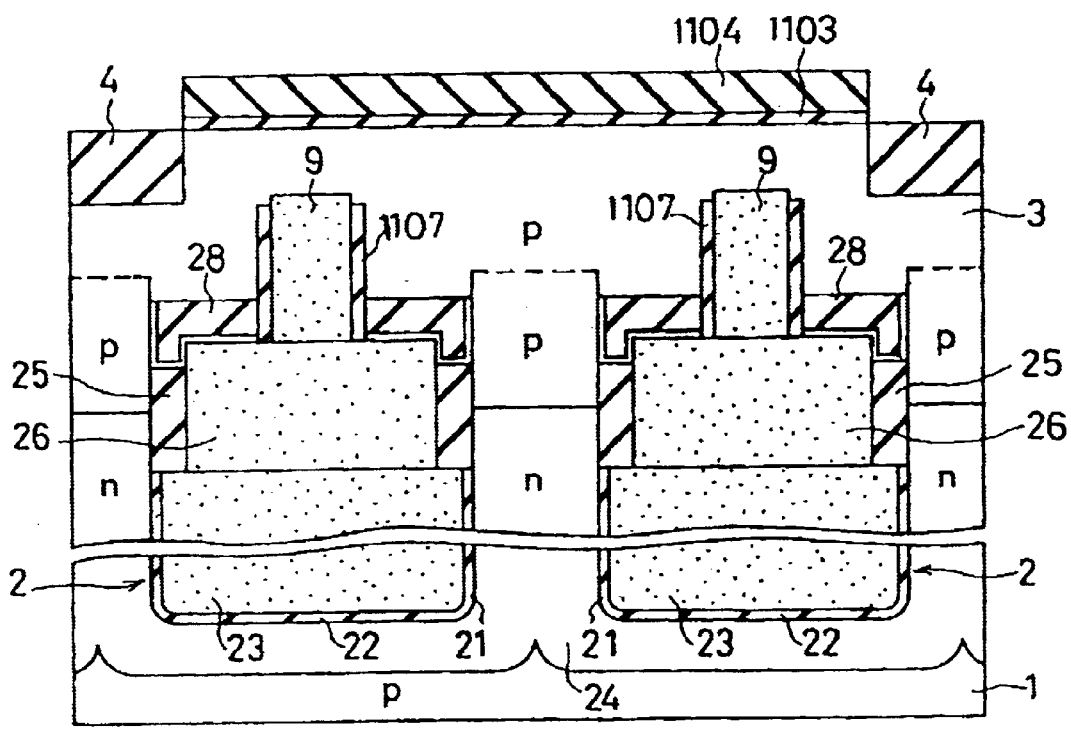

Subsequently, as shown in FIG. 16D, a silicon oxide film 1103 and a silicon nitride film 1104 are patterned to form a mask with which an element isolation insulating film 4 is formed by STI in a manner similar to the fourth embodiment. The element isolation insulating film 4 is preferably buried to a depth at which it reaches the first silicon layer 3a.

Figure 16E:
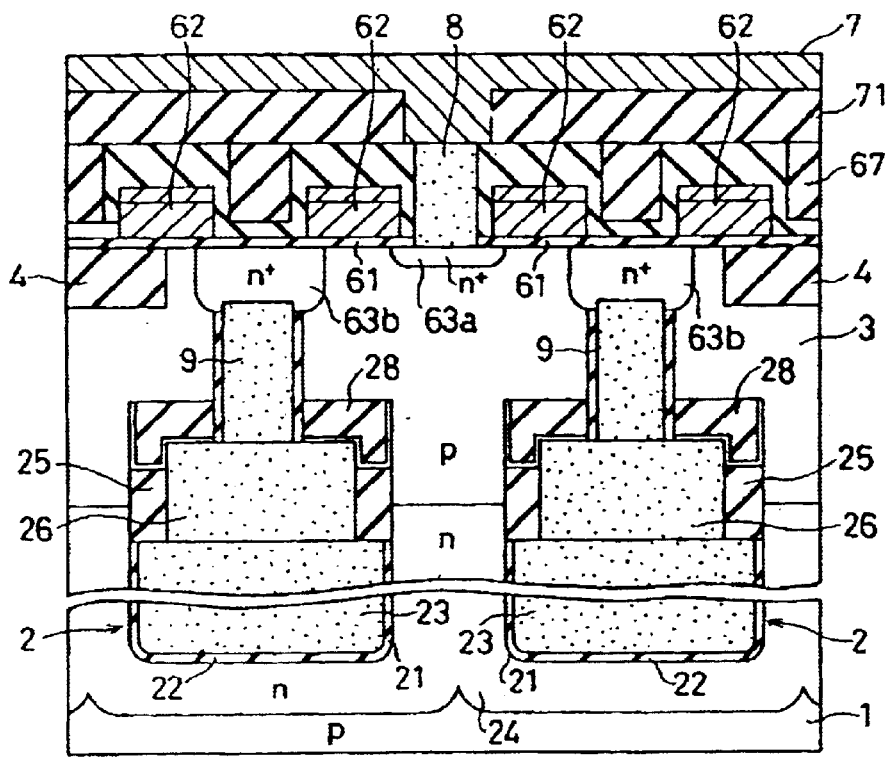

Then, the nitride film 1104 and the oxide film 1103 are removed, and ions are implanted for forming p-type wells and for adjusting a threshold value in a manner similar to the fourth embodiment. Next, as shown in FIG. 16E, gate electrodes 62 are formed through a gate insulating film 61, and ions are implanted for forming sources and drains. In this case, as shown in FIG. 16E, a source/drain diffusion layer 63a, connected to a bit line, of two diffusion layers 63a, 63b is similar to the previous embodiments. The n-type diffusion layer 63b on the capacitor node side is made substantially deep due to a combination of upward diffusion of impurities from the capacitor node layer 9 and the implanted ions or impurities from above, to such a degree that the bottom of the n-type diffusion layer 63b comes in contact with the top of the capacitor node layer 9.

Subsequently, a well-known self-alignment contact (SAC) technique is used to bury a bit line contact layer 8 for the n-type diffusion layer 63a, and bit lines 7 are formed by a well-known damascene process.

According to the seventh embodiment, the transistor diffusion layer is connected to the top surface of the contact layer buried on the capacitor node layer, so that a larger contact area is ensured to provide a stable and low resistant contact.

Figure 17:
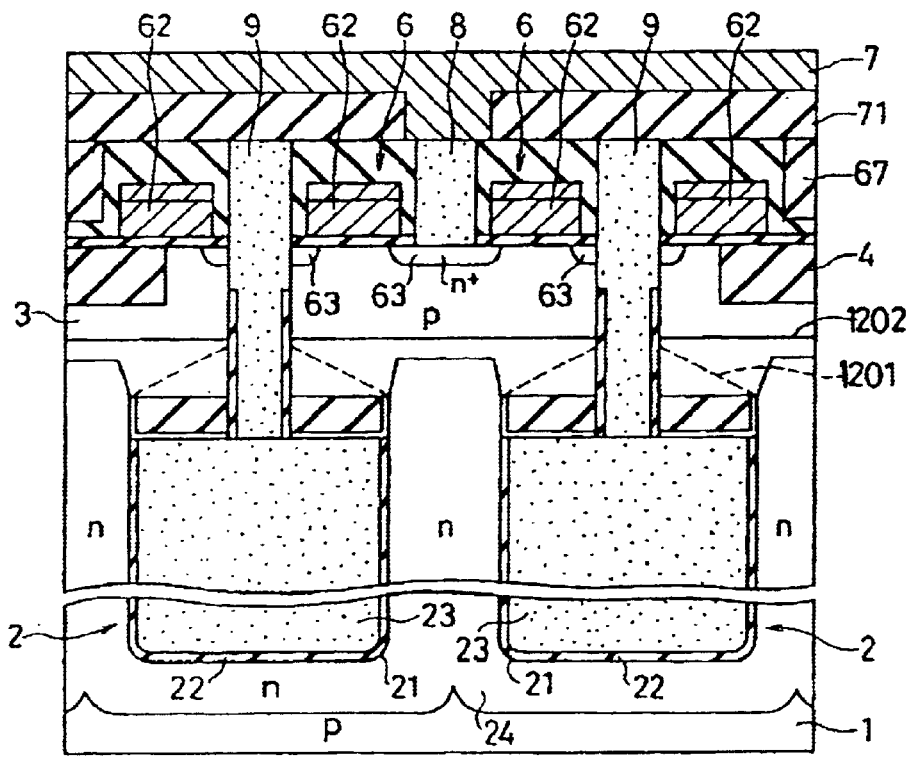
FIG. 17 is a cross-sectional view of a semiconductor memory device in accordance with an eighth embodiment of the present invention.

FIG. 17 shows the cross-section of a DRAM according to an eighth embodiment, corresponding to FIG. 14C of the fifth embodiment. When a silicon layer 3 is epitaxially grown, its portions positioned on capacitors 2, which are not single crystals, become polycrystal, resulting in facets 1201 as indicated by broken lines in FIG. 17. When a boundary 1202 of a p-type well overlaps this facet 1201, this causes a leak current. Particularly, when a buried plate 24, which is an n-type layer, overlaps the boundary 1202 and its junction surface overlaps the facet 1201, a leak current increases in a pn-junction between the p-type well and the buried plate 24.

To solve this problem, the eighth embodiment resorts to an expedient to prevent the well boundary 1202 from overlapping the facet 1201, as shown in FIG. 17. Specifically, the depth of the p-type well is controlled such that an abrupt impurity concentration distribution is exhibited by high acceleration ion implantation during the formation of the p-wells. This enables the prevention of an increased leak current.

Next, a ninth embodiment of the present invention will be described, wherein a buried strap feature is applied to a connection of a capacitor node layer with a transistor diffusion layer, using a capacitor structure similar to that of the fifth embodiment.

Figure 18:
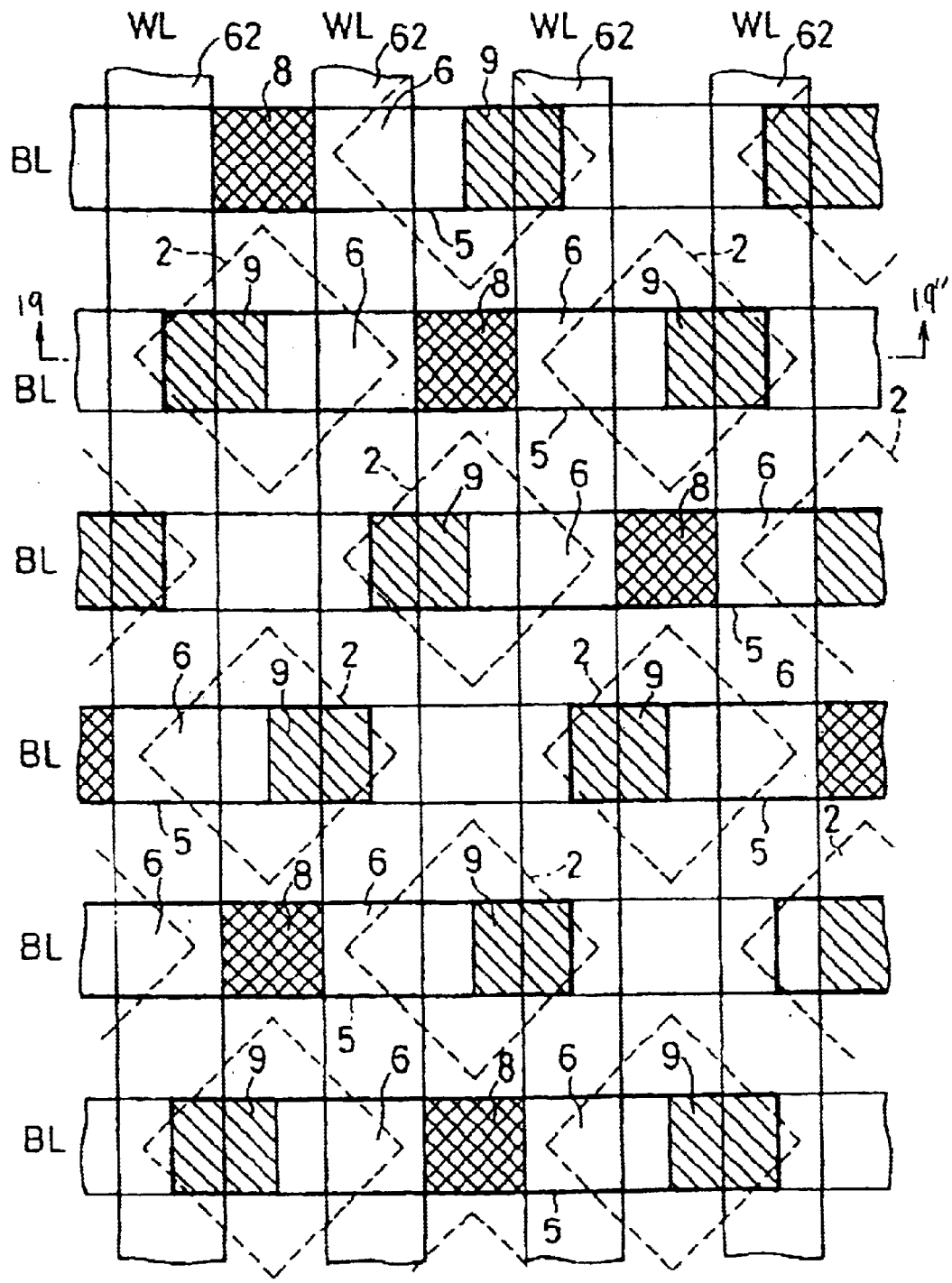
FIG. 18 is a top-down view of a semiconductor memory device in accordance with a ninth embodiment of the present invention.

FIG. 18 shows the layout of a DRAM according to the ninth embodiment corresponding to FIG. 10. While the layout of FIG. 18 is basically similar to FIG. 10, the two layouts differ in that the layout of FIG. 10 has the contact layer 9 positioned at substantially the center of the capacitor 2 for connecting the transistor diffusion layer to the capacitor node, whereas the ninth embodiment has a contact layer 9 positioned near an element isolation region, shifted from the center of each capacitor 2 in the x-direction. This is a consideration for ensuring a connection through a buried strap.

Figure 19A:
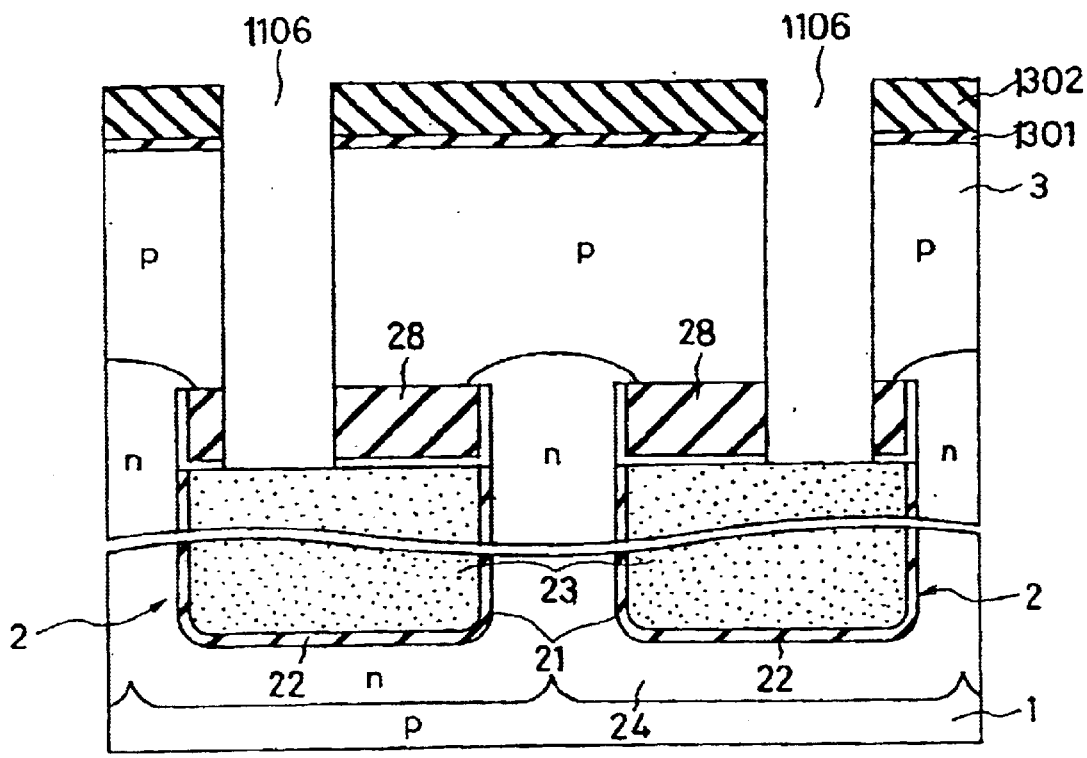
FIGS. 19A–19F are cross-sectional views which illustrate a method of manufacturing the semiconductor memory device of FIG. 18.

FIGS. 19A to 19F show steps of manufacturing the DRAM according to the ninth embodiment, using the cross-sectional view taken along a line 19–19' in FIG. 18. Steps until FIG. 14C are identical to the fifth embodiment, and subsequently, as shown in FIG. 19A, a mask made of a silicon oxide film 1301 and a silicon nitride film 1302 is used to form contact holes 1106 for a capacitor node layer 23. As shown, each contact hole 1106 is shifted from the center of the associated capacitor 2 toward the outside.

Figure 19B:
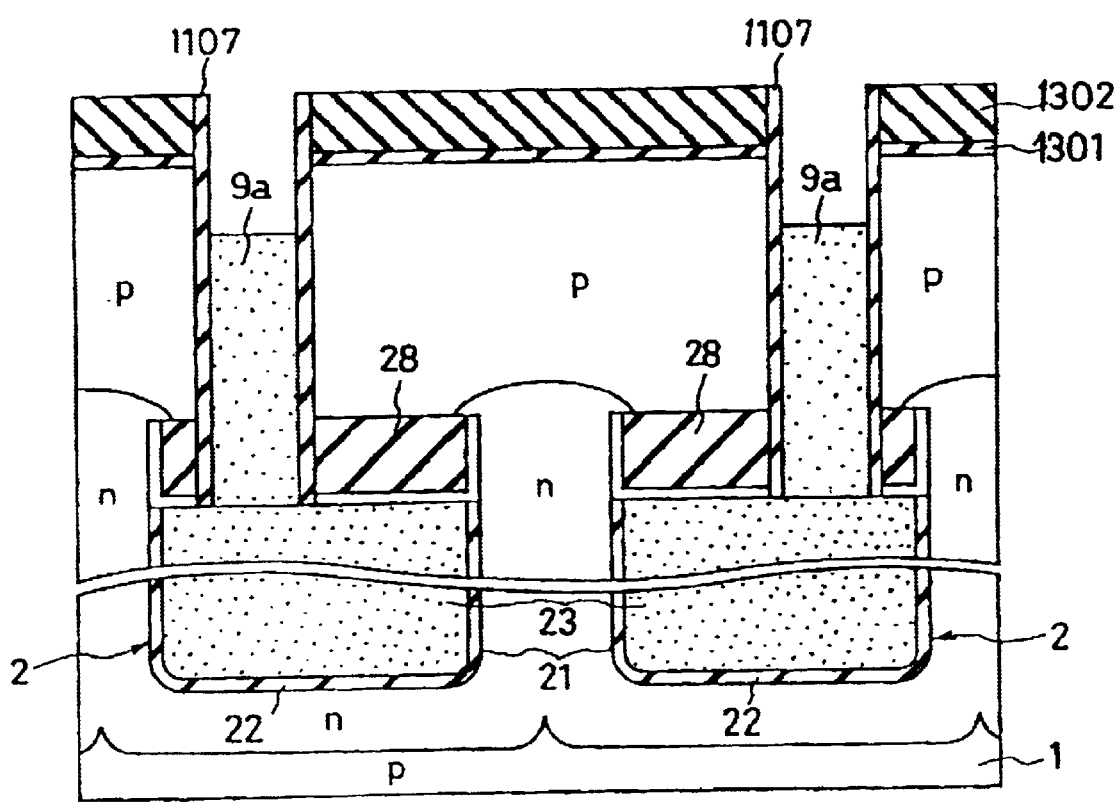

Next, as shown in FIG. 19B, a collar oxide film 1107 is formed on the inner wall of each contact holes 1106. Specifically, a TEOS oxide film is deposited in each contact hole 1106 in a thickness of approximately 20 nm, and etched by RIE such that the TEOS oxide film remains as the collar oxide film 1107 on the sidewall. Next, a phosphor or arsenic doped polycrystalline silicon is deposited and etched by CMP and RIE, and buried as a contact layer 9a. In this case, the contact layer 9a is buried such that its surface is positioned approximately 150 nm below the surface of a silicon layer 3a.

Figure 19C:
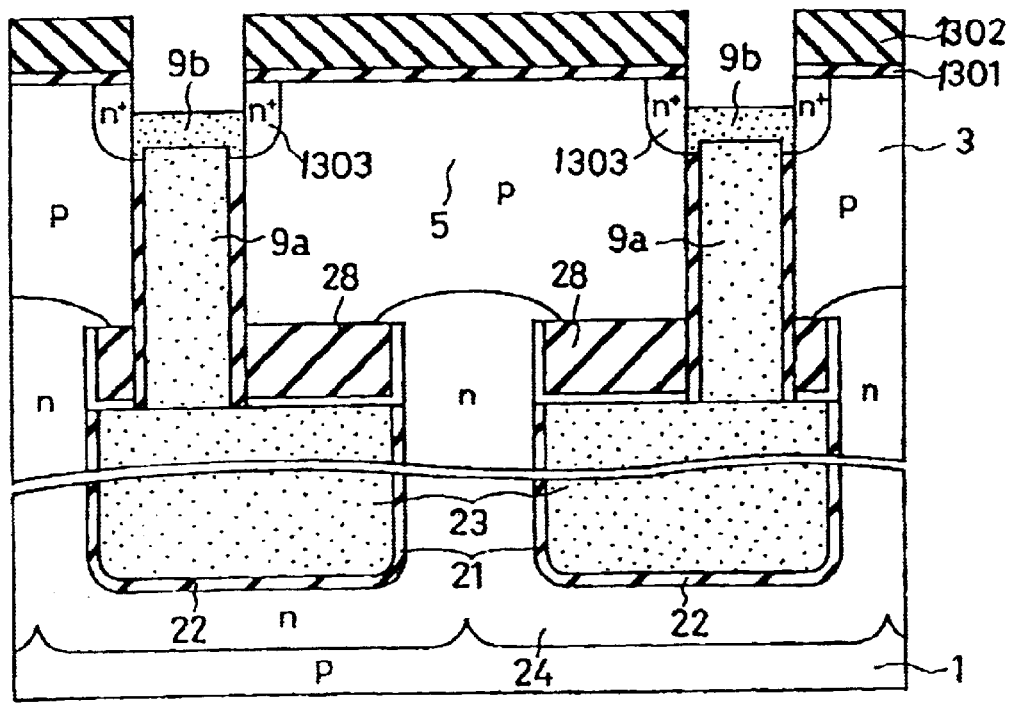

Subsequently, portions of the collar oxide film 1107 exposed beyond the contact layer 9a are removed by wet etching, and ions are obliquely implanted to form an n-type diffusion layer (buried strap) 1303, which is connected to a subsequently formed transistor diffusion layer, over the sidewalls of the contact holes 1106, as shown in FIG. 19C. Next, an arsenic or phosphor doped polycrystalline silicon is again deposited and recessed by CMP and RIE to bury second contact layers 9b on the contact holes 1106. The second contact layers 9b are buried such that their surfaces are positioned approximately 70 nm below the top surface of the silicon substrate.

Figure 19D:
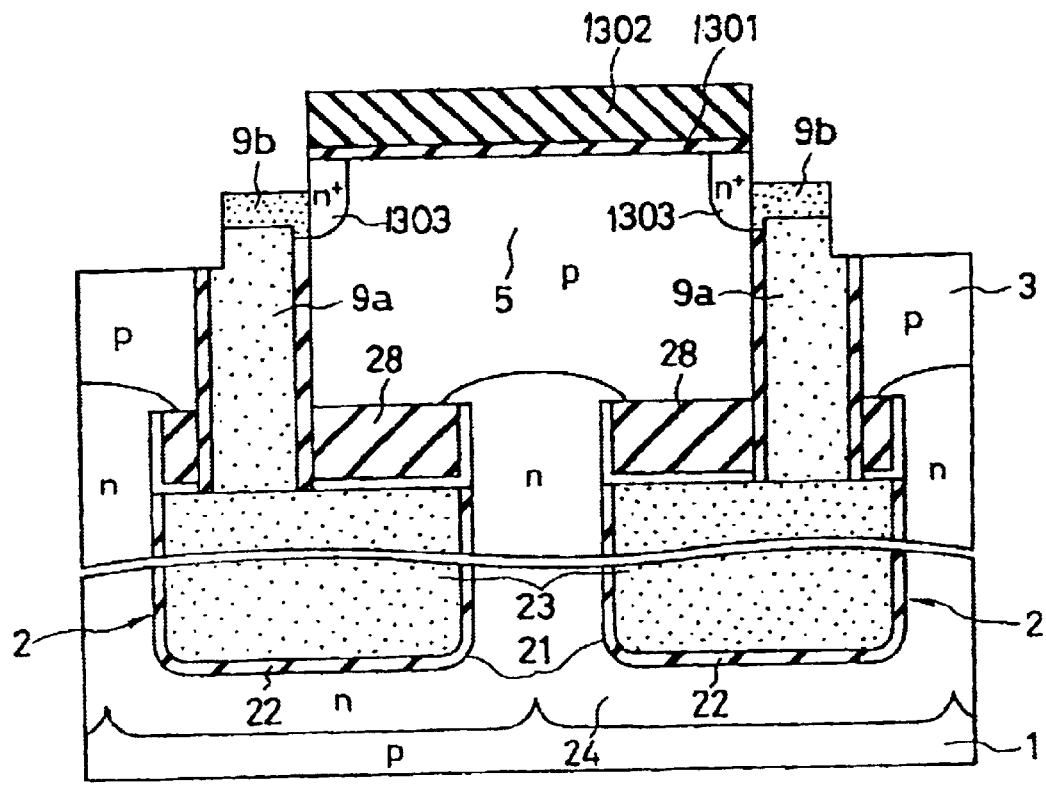
Figure 19E:
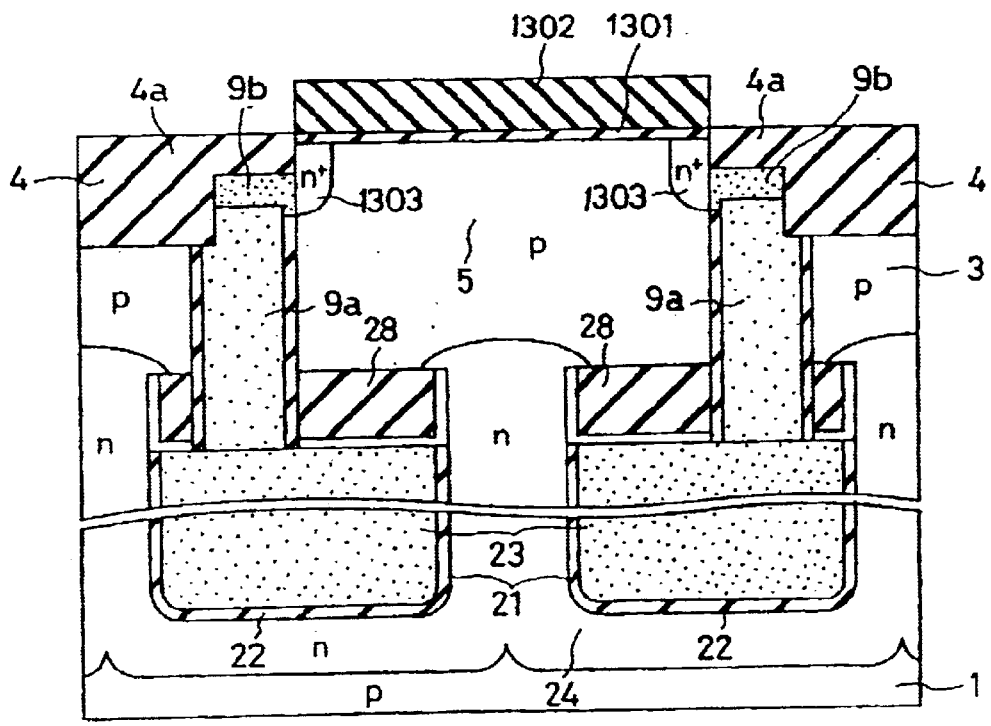

Subsequently, element isolation grooves are formed by the STI technique as shown in FIG. 19D, and an element isolation insulating film 4 is buried in the element isolation grooves as shown in FIG. 19E. The element isolation grooves are formed to also remove outer upper portions of the contact layers 9b, 9a so as to cut away useless buried straps 1303 which are formed outside the active element areas 5. The element isolation insulating film 4 is buried such that its surface is substantially coplanar with the surface of the silicon layer, to cover the surface of the contact layer 9a with an insulating film 4a.

Figure 19F:
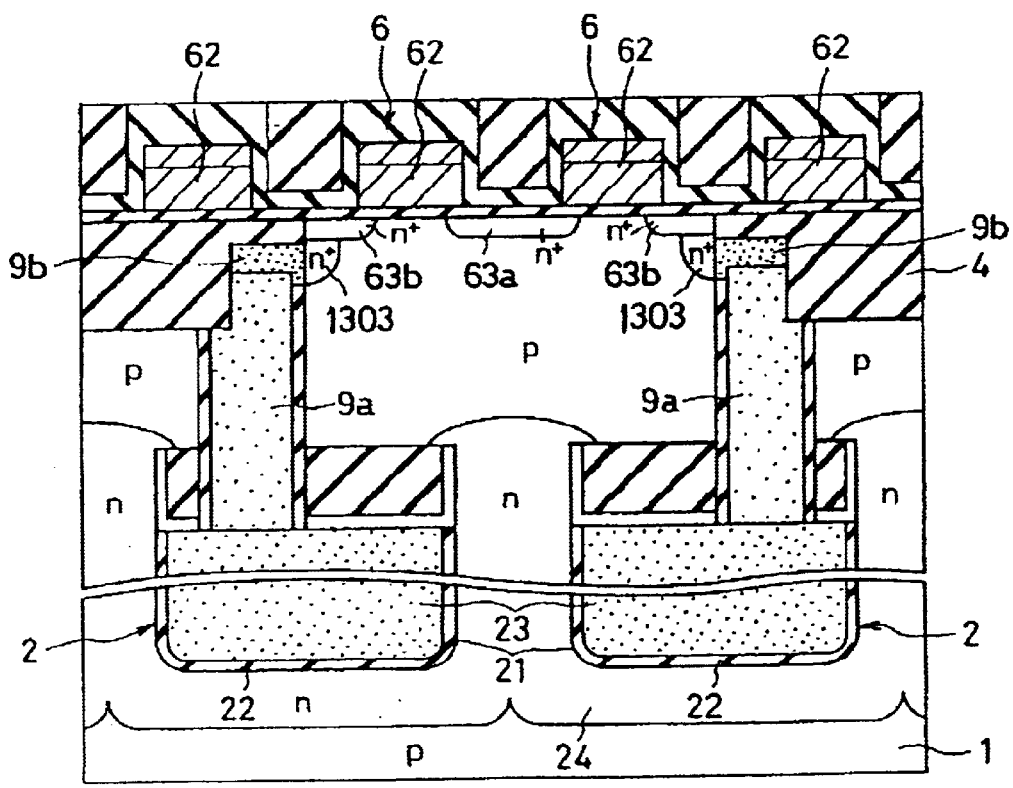

Subsequently, after executing an ion implanting step for forming wells and adjusting a threshold value, transistors 6 are formed in a manner similar to the eighth embodiment, as shown in FIG. 19F. In a source/drain diffusion layer 63 of each transistor 6, a diffusion layer 63b on the capacitor node side is connected to a capacitor node layer 23 through the buried strap 1303 and further through the contact layers 9a, 9b. Subsequently, though not shown, a bit line contact is buried using the self-alignment contact (SAC) technique, and bit lines are formed by the damascene process.

According to the ninth embodiment, the transistor diffusion layer 63b can be connected to the contact layer 9 buried on the capacitor 2 through the buried strap 1303. In this case, since the position of the contact layer 9 is shifted from the center of the associated capacitor 2 in the x-direction, it is possible to ensure a sufficient alignment allowance with the transistor diffusion layer.

It should be noted that the buried strap feature employed in the ninth embodiment can also be applied to the capacitor layout shown in FIG. 15.

Figure 20:
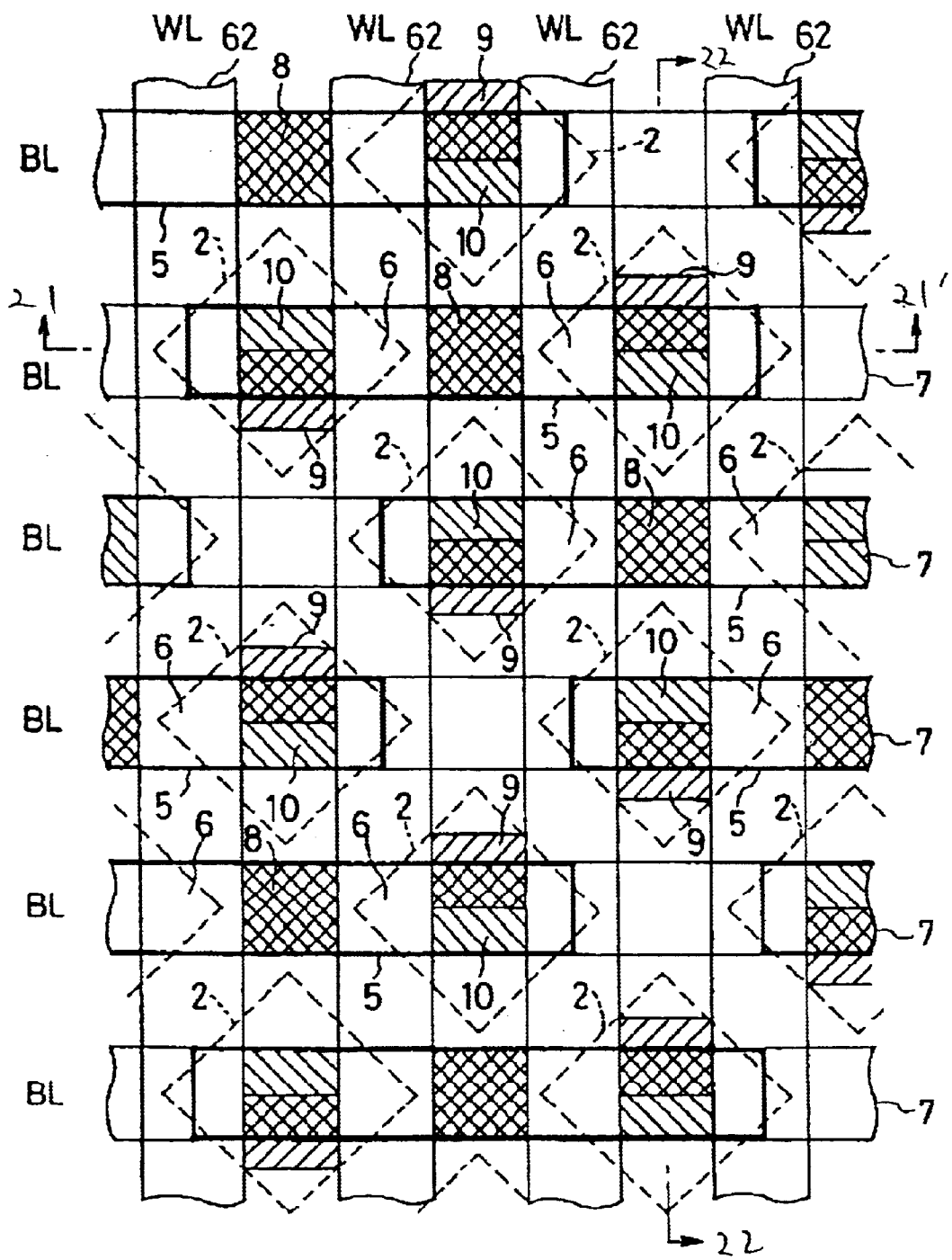
FIG. 20 is a top-down view of a semiconductor memory device in accordance with a tenth embodiment of the present invention.
Figure 21:
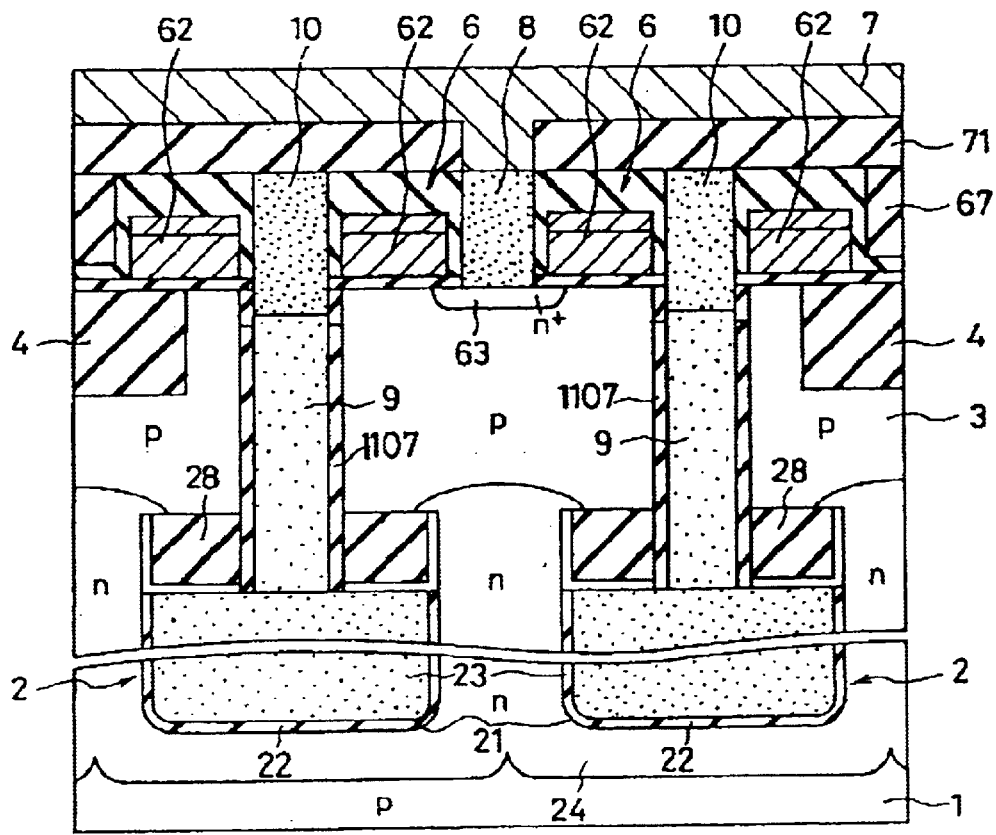
FIG. 21 is a cross-sectional view taken along line 21–21' of FIG. 20.
Figure 22:
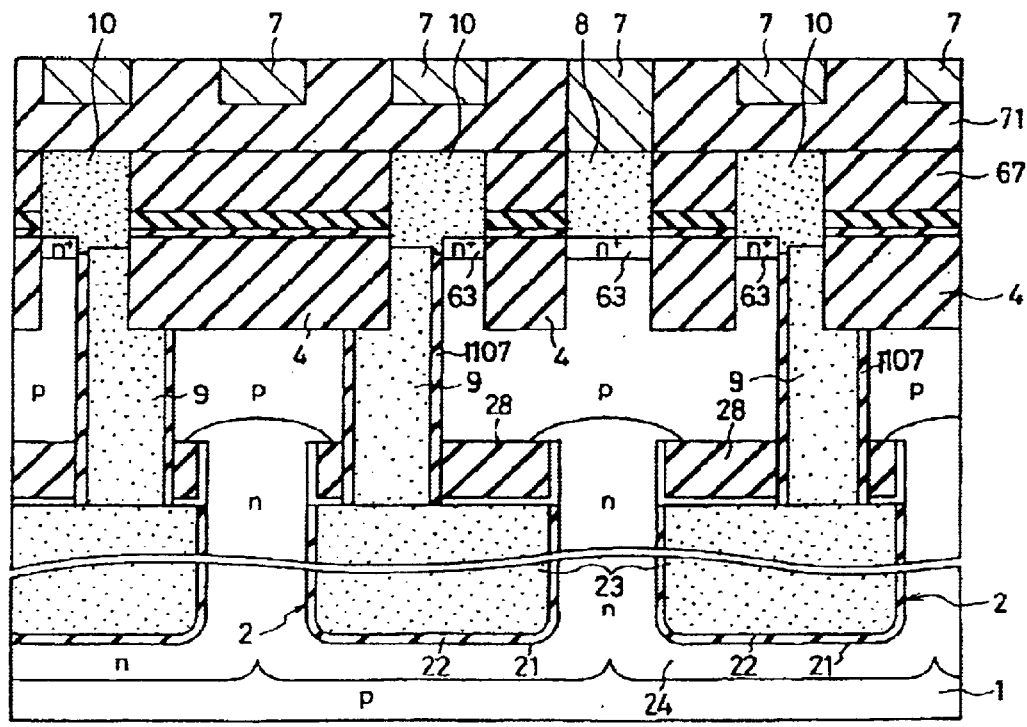
FIG. 22 is a cross-sectional view taken along line 22–22' of FIG. 20.

FIG. 20 shows the layout of a DRAM according to a tenth embodiment of the present invention which employs a surface strap feature for a connection between a transistor and a capacitor, and FIGS. 21 and 22 show cross-sectional views of FIG. 20, respectively. The tenth embodiment employs a similar layout for capacitors to that of the fourth embodiment, and a capacitor structure similar to that of the fifth embodiment.

The layout in FIG. 20 differs from the layout in FIG. 10 in that a buried contact layer 9 for connecting a transistor 6 to anode of a capacitor 2 is formed at a position shifted from the center of the capacitor 2 toward a word line WL. Stated another way, the contact layer 9 is formed such that it overlaps substantially one half of an active element area 5 formed on a diagonal of the square capacitor 2. Then, as shown in FIGS. 21 and 22, a diffusion layer 63 of the transistor 6 to be connected to the capacitor 2 is connected to the contact layer 9 through a connection conductor 10 formed on the surface thereof.

Figure 23A:
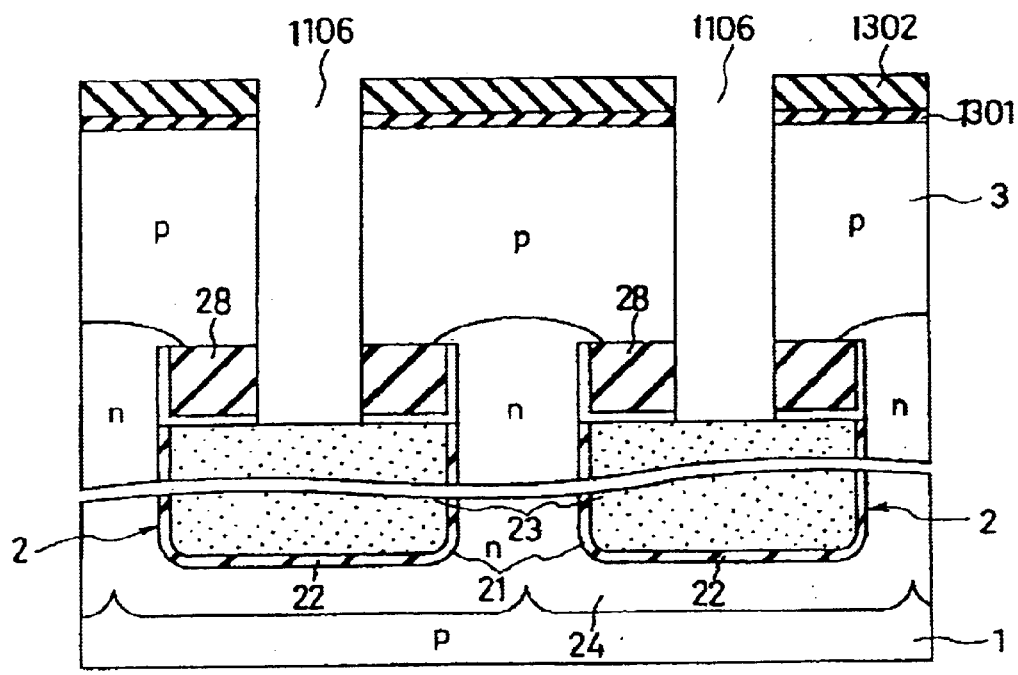
FIGS. 23A–23H are cross-sectional views which illustrate a method of manufacturing the semiconductor memory device of FIGS. 20, 21, and 22.

Specific steps of manufacturing the DRAM according to the tenth embodiment will be described with reference to cross-sectional views of FIGS. 23A to 23H which show the manufacturing steps corresponding to the cross-section shown in FIG. 21. FIG. 23A, which is basically similar to FIG. 21, shows that contact holes 1106 are formed for capacitors 2 through a silicon layer 3 which has been epitaxially grown on a substrate in which the capacitors 2 had been formed. While the contact hole 1106 appears substantially at the center of the associated capacitor 2 in the cross-section shown in FIG. 23A, the contact hole 1106 is formed at a position shown as the contact layer 9 in FIG. 20, shifted from the center of the capacitor 2, when viewed in the cross-section in a WL direction orthogonal to FIG. 23A.

Figure 23B:
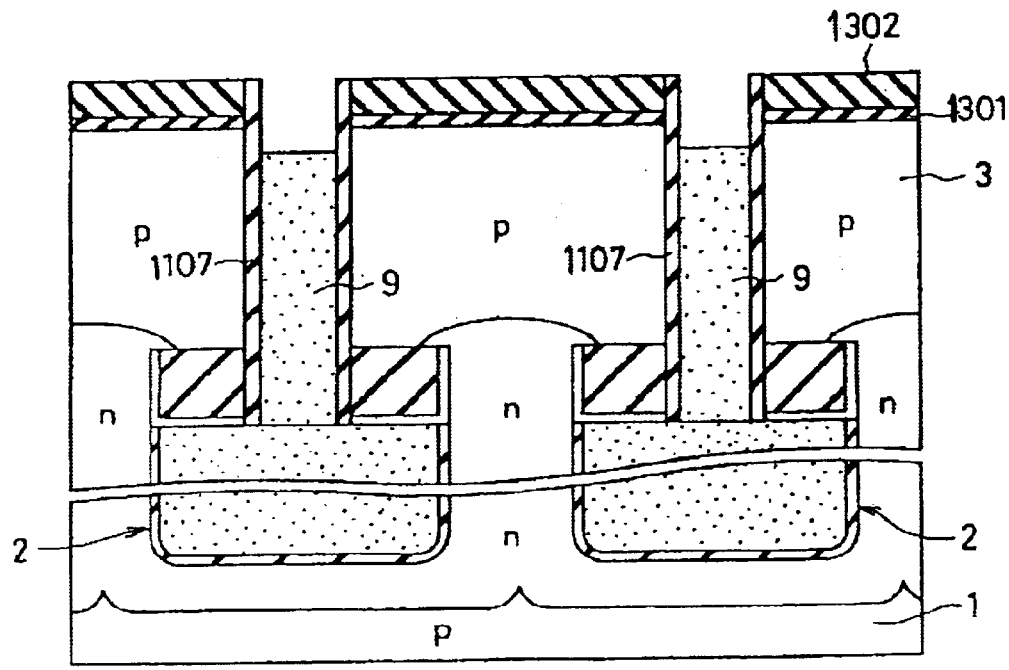

Subsequently, as shown in FIG. 23B, a collar oxide film 1107 is formed in each contact hole 1106, and a contact layer 9 formed of an arsenic or phosphor doped polysilicon is buried in a manner similar to the previous embodiments. The contact layer 9 is buried such that its surface is positioned approximately 50 nm below the surface of the silicon layer 3.

Figure 23C:
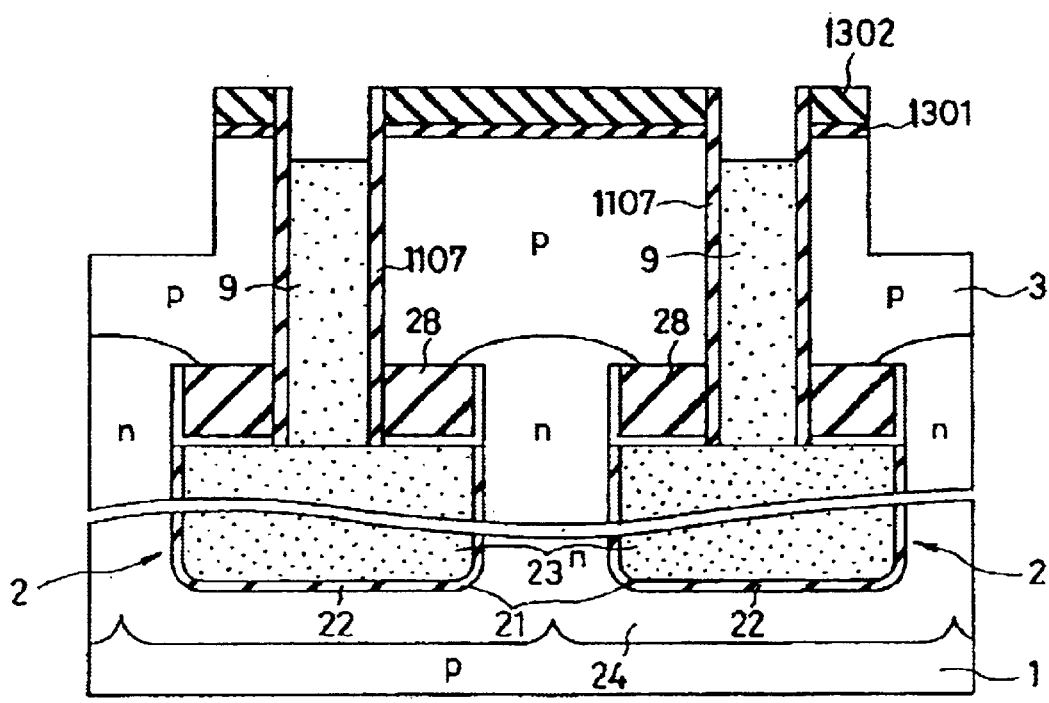
Figure 23D:
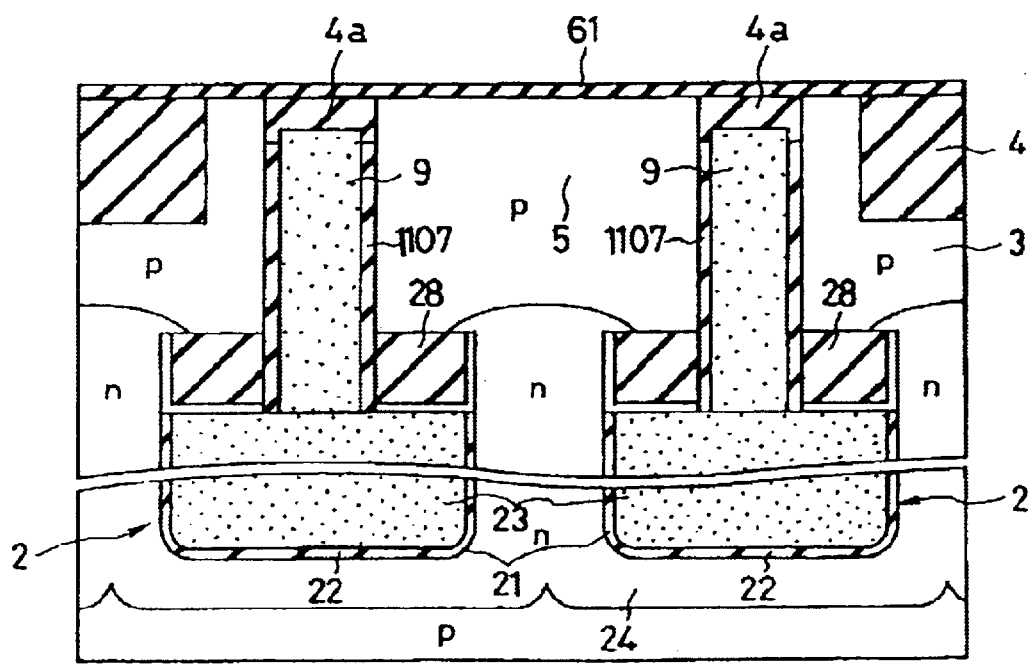

Subsequently, element isolation grooves are formed by the STI technique as shown in FIG. 23C, and an element isolation insulating film 4 is buried as shown in FIG. 23D. The element isolation insulating film 4 is buried so as to have a surface substantially coplanar with the surface of the silicon layer, thereby covering the surface of the contact layer 9 with an insulating film 4a.

Subsequently, a silicon oxide film 1301 and a silicon nitride film 1302 are stripped off, a sacrifice oxide film is formed, and ions are implanted for forming wells and adjusting a threshold value. Then, the sacrifice oxide layer is stripped off, and a gate oxide film 61 is formed as shown in FIG. 23D.

Figure 23E:
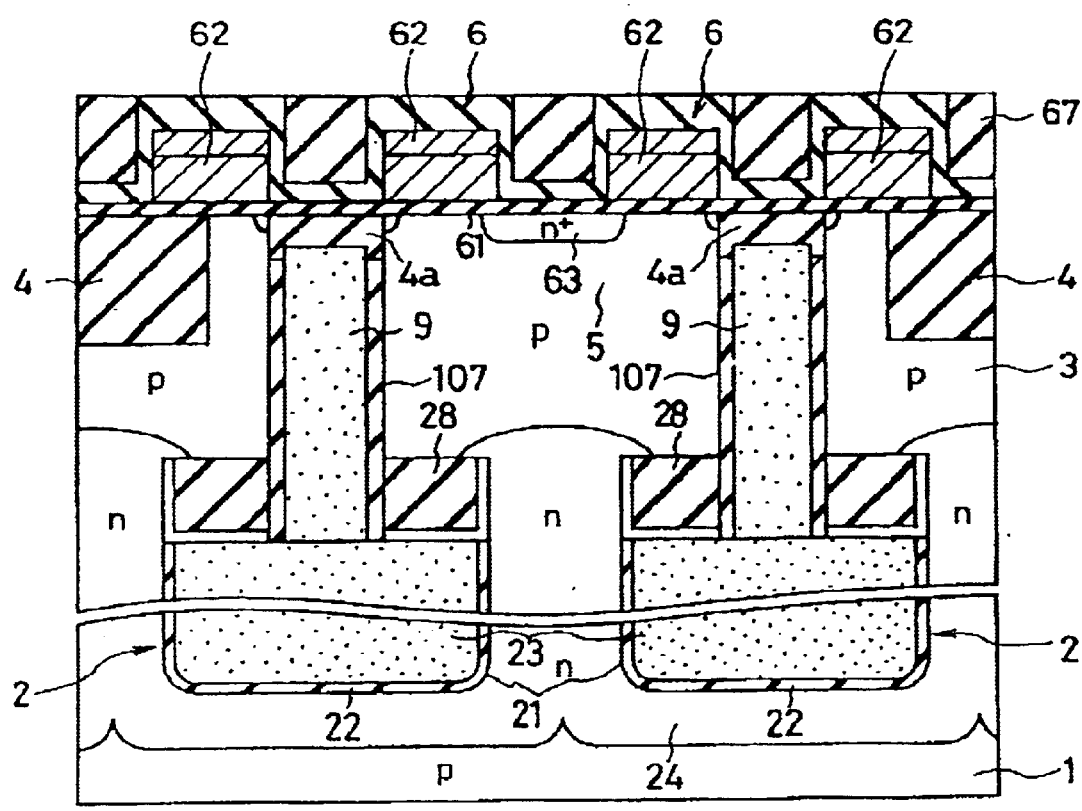

Then, as shown in FIG. 23E, transistors 6 are formed in steps similar to those employed in the aforementioned fourth through ninth embodiments. An interlayer insulating film 67 is filled between gate electrodes 62 of the transistors 6 for planarization.

Figure 23F:
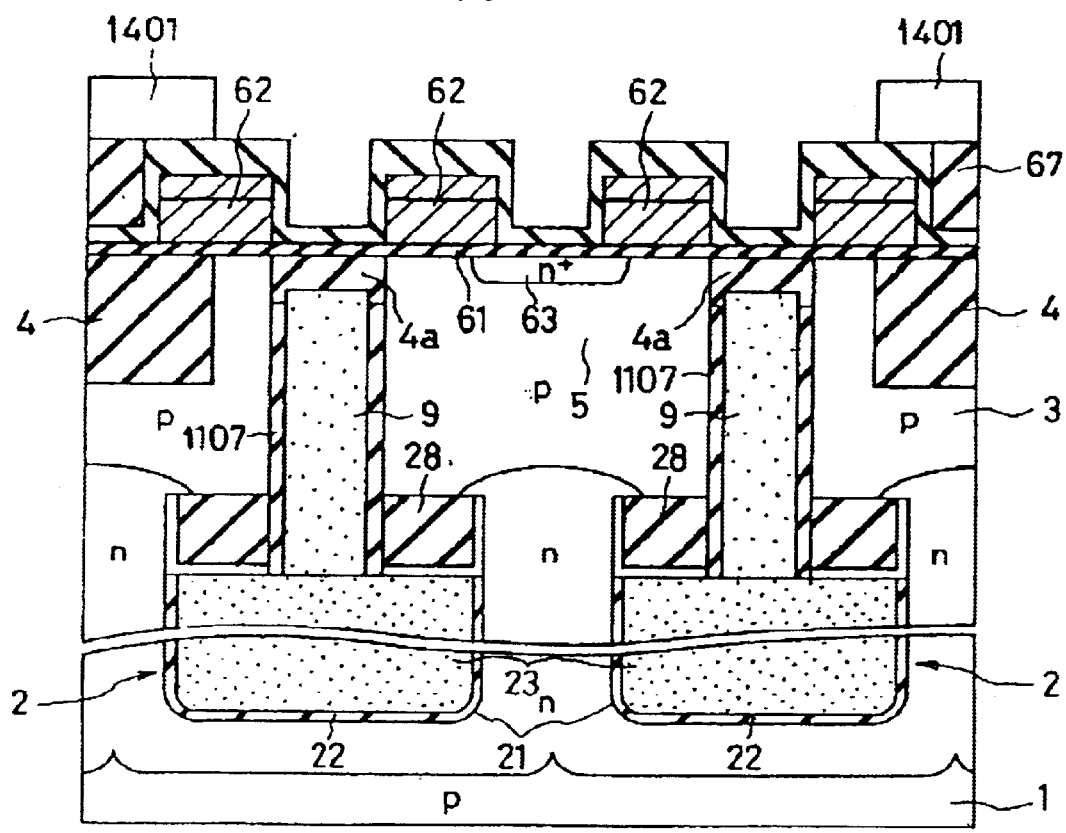
Figure 23G:
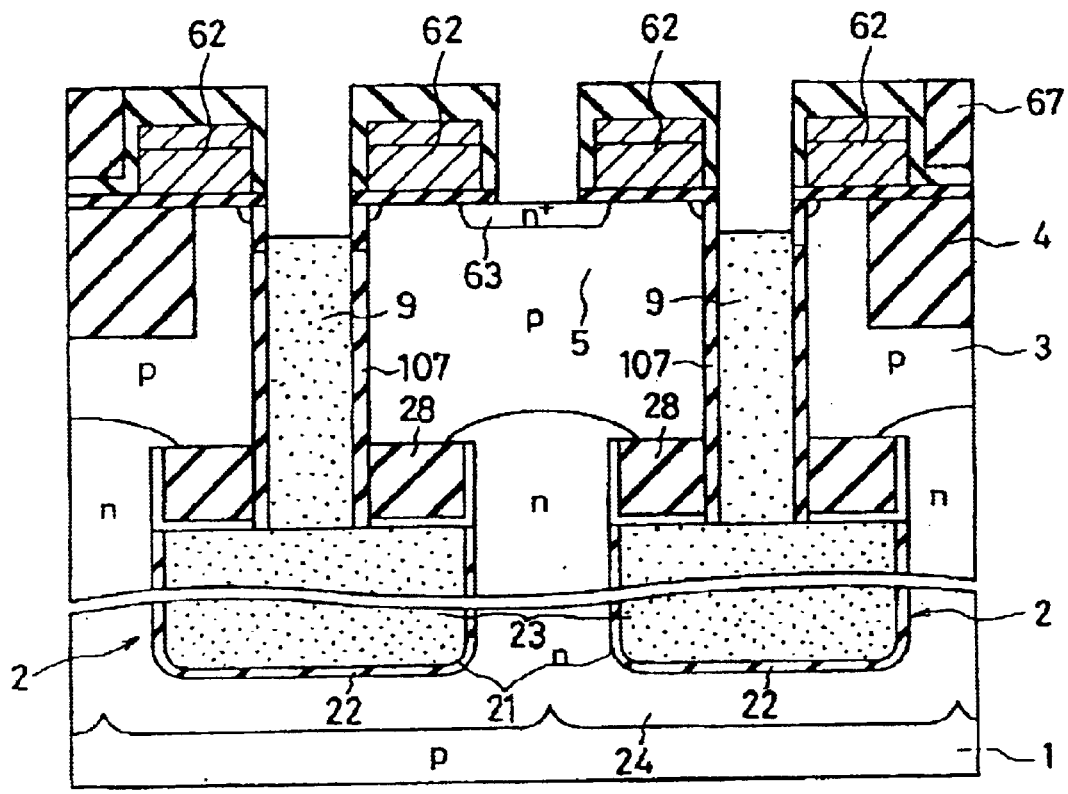

Next, a resist 1401 having a pattern reverse to that for active element areas 5 is formed as shown in FIG. 23F to simultaneously form bit line contacts and surface straps, and is used to etch or remove a BPSG film 67 which is an interlayer insulating film existing between the gate electrodes 62 on the active element areas 5. Further, a silicon nitride film 66 exposed below the removed interlayer insulating film 67, the gate oxide film 61, and the insulating film 4a overlying the contact layer 9 are etched to expose the surface of the diffusion layer 63, as shown in FIG. 23G, to which the contact layer 9 and bit lines are connected. In this case, since openings on the contact layer 9 is aligned to the active element areas 5, upper half of the contact layer 9 is exposed in the word line direction orthogonal to the cross-section shown in the figures, as is apparent from FIG. 20.

Figure 23H:
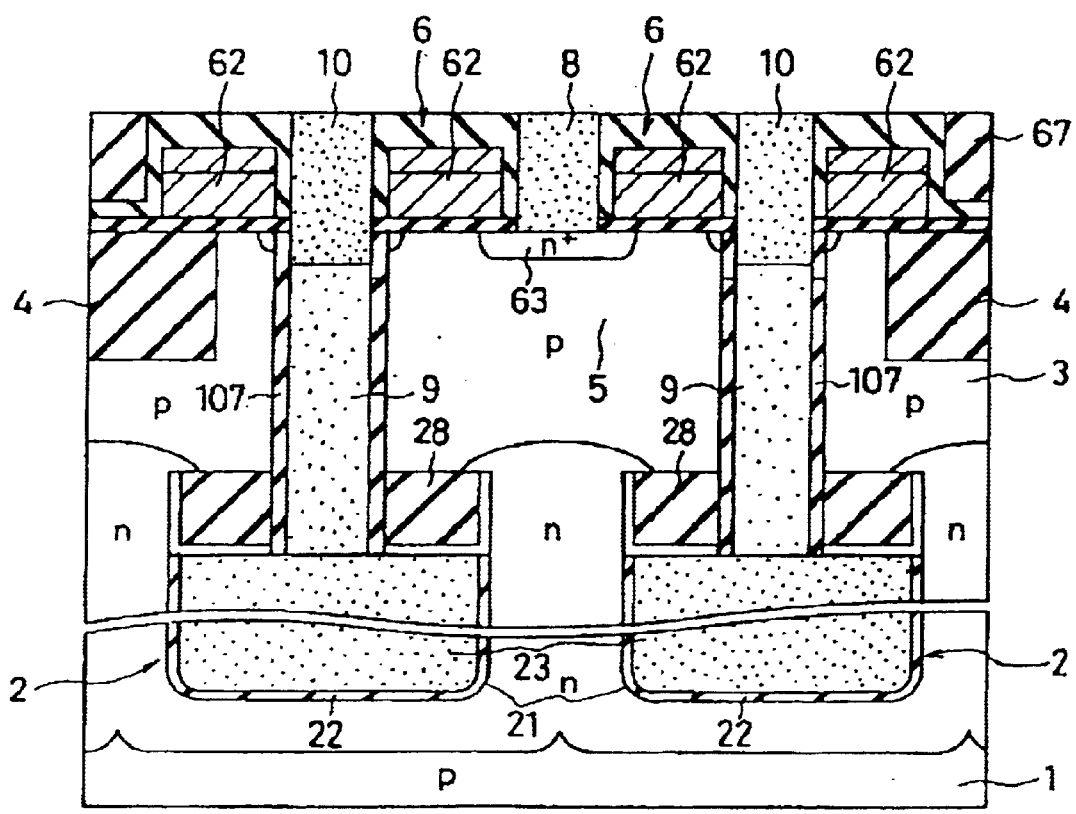

Subsequently, a phosphor or arsenic doped polycrystalline silicon is deposited and planarized by CMP. Then, as shown in FIG. 23H, surface straps 10 are buried as connection conductors each for connecting a capacitor to a transistor, simultaneously with a bit line contact layer 8. In the word line direction, each surface strap 10 is formed spreading over the diffusion layer 63 of the transistor 6 and the contact layer 9 for connecting them, as shown in the cross-sectional view of FIG. 22.

Subsequently, though not shown, bit lines 7 are formed by the damascene process in a manner similar to the previous embodiments.

In the tenth embodiment, since the capacitors and transistors are connected through the surface straps after the formation of the transistors, less thermal steps are performed after the formation of the surface straps, so that the silicon layer 3 is less susceptible to crystal defects. Also, the use of the surface straps results in a smaller contact area of the contact layer 9 made of polycrystalline silicon with the silicon layer 3 in the active area, thereby further preventing the crystal defects from introducing. Furthermore, as previously shown in FIG. 20, while the contact layer 9 is buried at a position shifted from the center of the associated capacitor 2, a large capacitor area enables the surface strap 10 to connect the contact layer 9 to the diffusion layer 63 with a low resistance.

Figure 24:
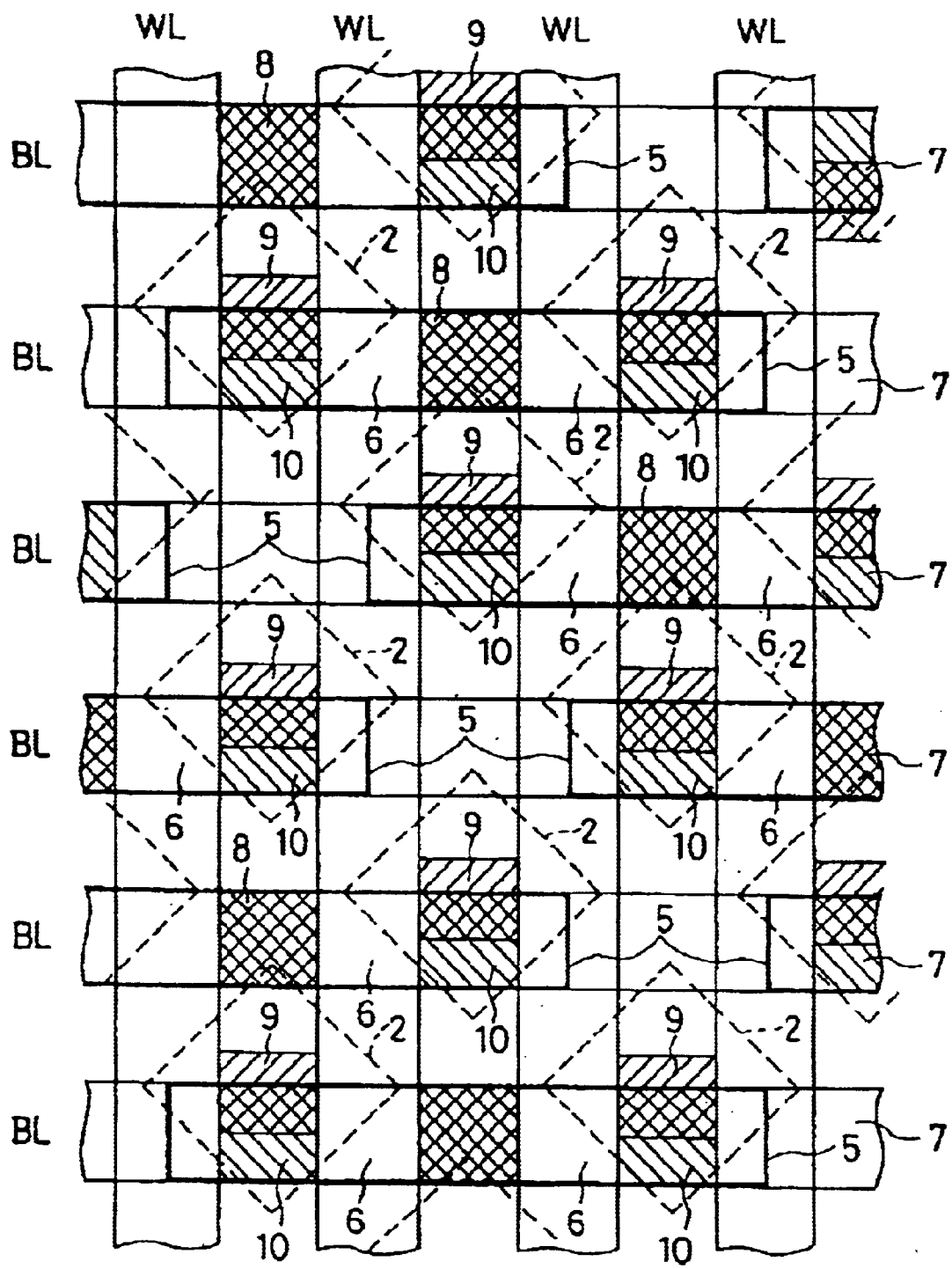
FIG. 24 is a top-down view of a semiconductor memory device in accordance with an eleventh embodiment of the present invention.

FIG. 24 shows the layout of an eleventh embodiment which modifies the layout of the tenth embodiment. The layout shown in the tenth embodiment is such that the center of the active element area 5 intersects a diagonal of the capacitor 2, i.e., passes the center of the capacitor 2. For this reason, the contact layer 9 for connecting the capacitor 2 to the transistor 6 is at a position shifted from the center of the capacitor 2. As a result, the active element area 5 deviates from the diagonal of the capacitor 2 in the y-direction to interrupt the contact layer 9.

The employment of such a layout provides for a larger allowance for misalignment of the contact layer 9 to the capacitor 2. In other words, even if the misalignment is present more or less, it is ensured to prevent the contact layer 9 from short-circuiting the silicon layer out of the region of the capacitor 2.

Figure 25:
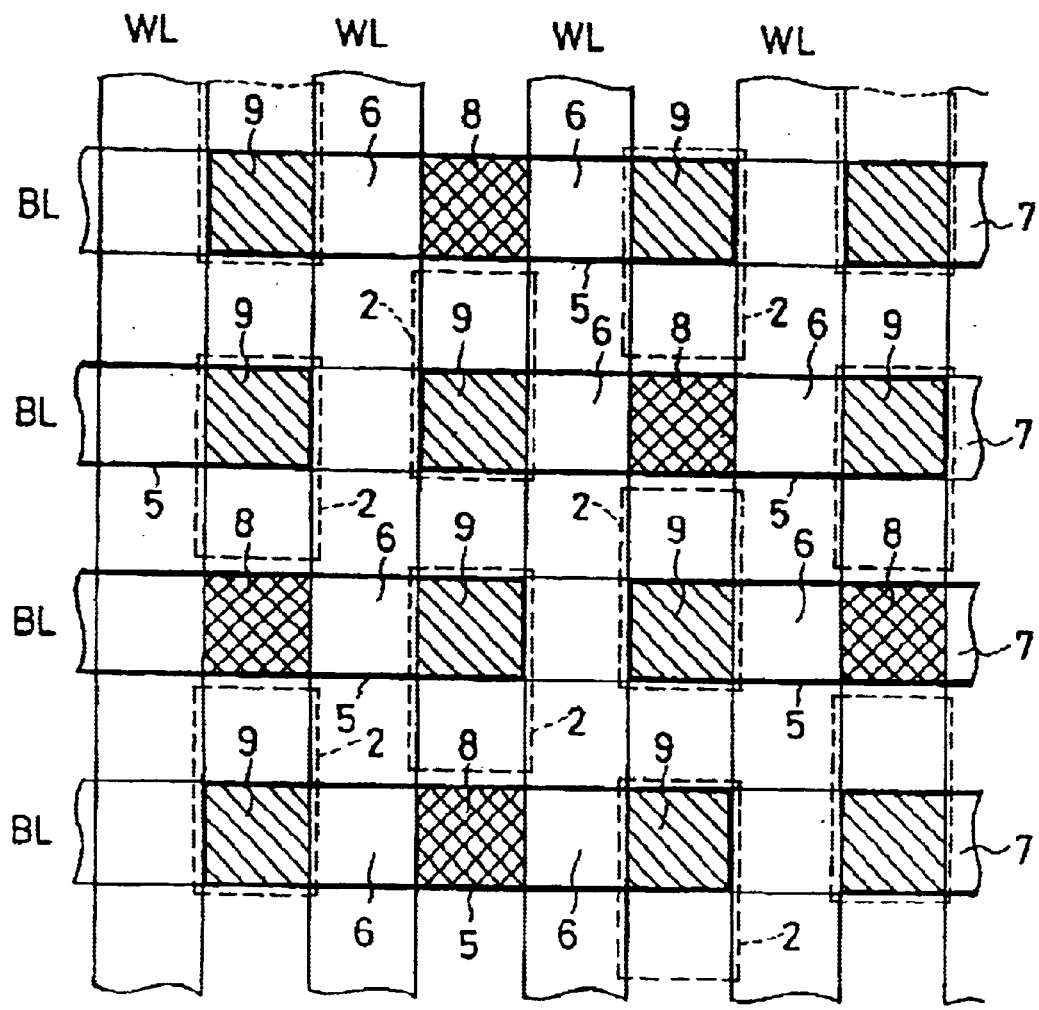
FIG. 25 is a top-down view of a semiconductor memory device in accordance with a twelfth embodiment of the present invention.

FIG. 25 shows the layout of a DRAM according to a twelfth embodiment of the present invention, where the area of a unit cell is reduced. In the previous embodiments, the active element areas 5 have a dimension of 6F in the x-direction, whereas in the twelfth embodiment, active element areas 5 have a dimension of 5F in the x-direction, and arranged at a pitch of 1F. In the y-direction, the active element areas are shifted at a one-third pitch.

Assuming that bit lines BL and word lines WL formed to have a width of 1F and are arranged at a pitch of 1F, capacitors 2 are arranged as rectangles each having a dimension of 1F in the x-direction and a dimension of 2F in the y-direction, at both end portions of each active element area 5, as indicated by broken lines. Though description is omitted for the cross-sectional structure and the manufacturing steps, the twelfth embodiment may employ either the fourth embodiment or the fifth embodiment in these respects.

In the twelfth embodiment, an inspection on the arrangement of the word lines WL in the direction of the bit lines BL reveals that there are two active word lines for driving a transistor 6 for one passing word line. A unit cell is sized to span 3F in the bit line direction and 2F in the word line direction, and has an area of $6F^2$. DRAM cell arrays currently used in general have the dimensions of 4F in the word line direction and 2F in the bit line direction. In comparison with the current DRAM cell arrays, the memory cell area of this embodiment can be reduced when the same design rule is used, and the design rule can be relaxed when the memory cell has the same area.

Since the prior art requires an alignment allowance for a contact between a transistor and a capacitor and a word line, it is difficult to realize a perfect $6F^2$ memory cell. The present invention, on the other hand, can form the word lines and capacitor contacts in a self-alignment configuration, thereby readily realizing a memory cell having the size of $6F^2$.

Next, a thirteenth embodiment of the present invention will be described.

In the fourth embodiment, the capacitor contact layer 9 and the bit line contact layer 8 are buried in separate steps, whereas the thirteenth embodiment employs a self-aligned contact technique to simultaneously bury these layers, and relies on the surface strap feature to connect a capacitor contact layer 9 to an n-type diffusion layer. Associated manufacturing steps will be described below with reference to FIGS. 26A to 26D.

While the thirteenth embodiment employs the capacitor structure identical to that of the fifth embodiment, the capacitor structure of the fourth embodiment may also be used.

Figure 26A:
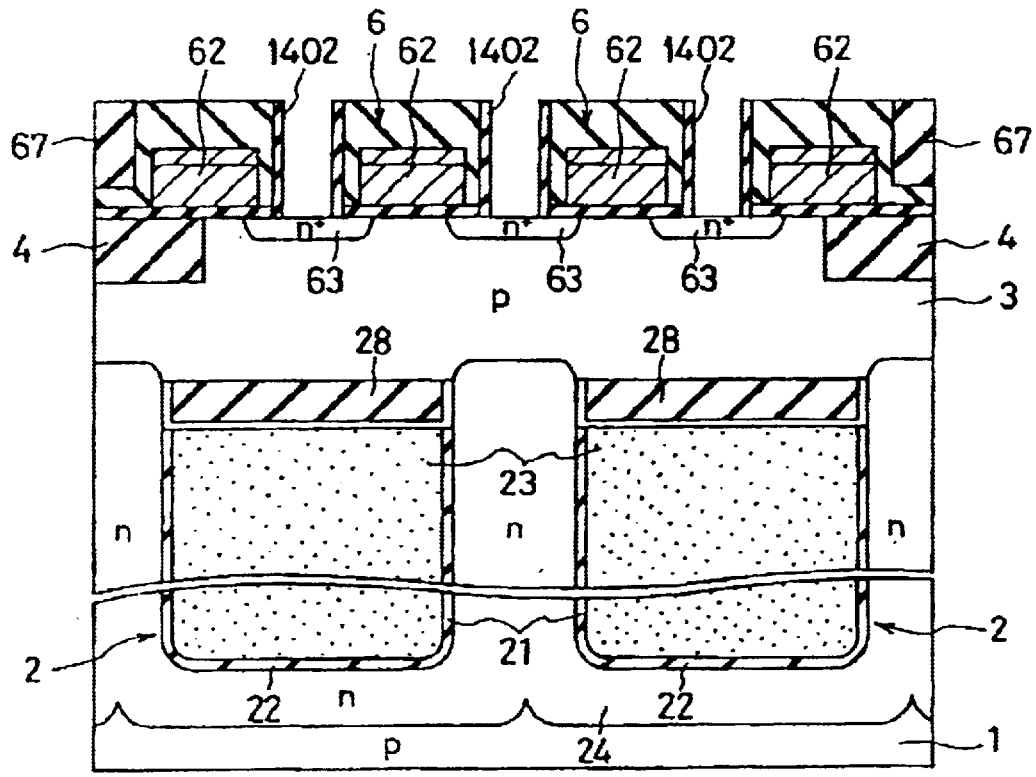
FIGS. 26A–26D are cross-sectional views which illustrate a method of manufacturing a semiconductor memory device in accordance with a thirteenth embodiment of the present invention.

As is the case of the fourth embodiment or the fifth embodiment, capacitors 2 are formed in a substrate 1, a silicon layer 3 is epitaxially grown on the substrate 1, and element isolation is performed to form transistors 6. Then, a resist having a pattern reverse to that for element areas 5 is used to etch or remove an interlayer insulating film 67 by RIE. A silicon nitride film exposed between gate electrodes is also removed to expose an n-type diffusion layer 63. Then, a thin silicon oxide film 1402 of 20–30 nm in thickness is deposited, and left on gate sidewalls. This state is shown in FIG. 26A.

Figure 26B:
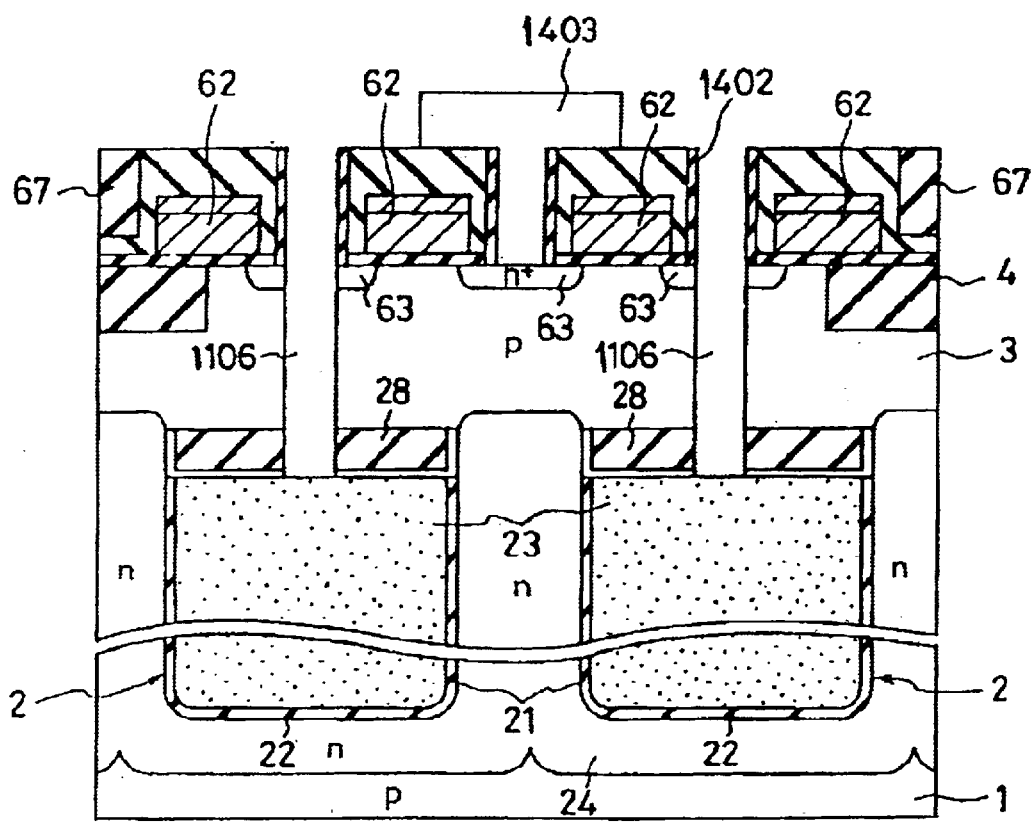

Subsequently, a resist 1403 is formed and patterned to have openings at positions corresponding to contacts to the capacitors by lithography. The silicon layer 3 is etched by an etching method having a larger selection ratio for a silicon nitride film to form contact holes 1106 for the capacitors 2 as shown in FIG. 26B. An oxide film 28 exposed on the bottom of each contact hole 1106 is etched to expose a capacitor node layer 23 on the bottom of the contact hole 1106.

Figure 26C:
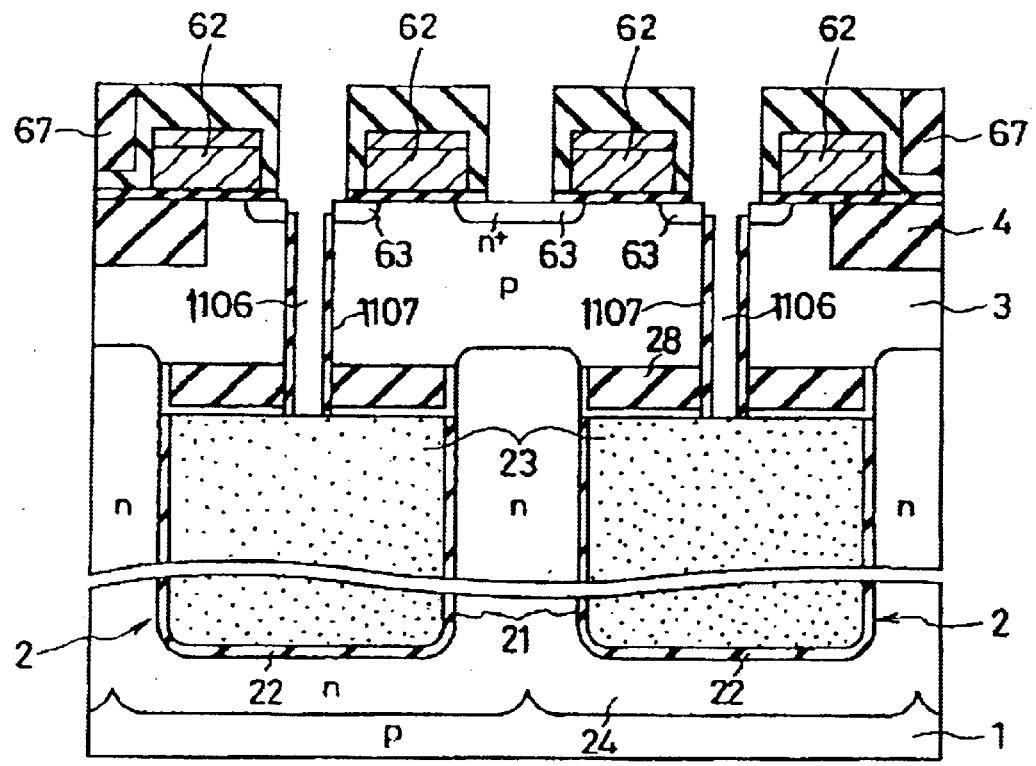

Next, after the silicon oxide film 1402 on the gate sidewalls is removed by wet etching, a collar oxide film 1107 having a thickness of approximately 15 nm is formed by thermal oxidization within each contact hole 1106. Further, upper portions of the collar oxide films 1107 are etched, and oxide films are simultaneously removed from the surfaces of the element areas of the capacitor contacts and bit line contacts. This state is shown in FIG. 26C. In this case, as shown, the surface of the n-type diffusion layer 63 in the element area is exposed around an upper portion of each contact hole 1106.

Figure 26D:
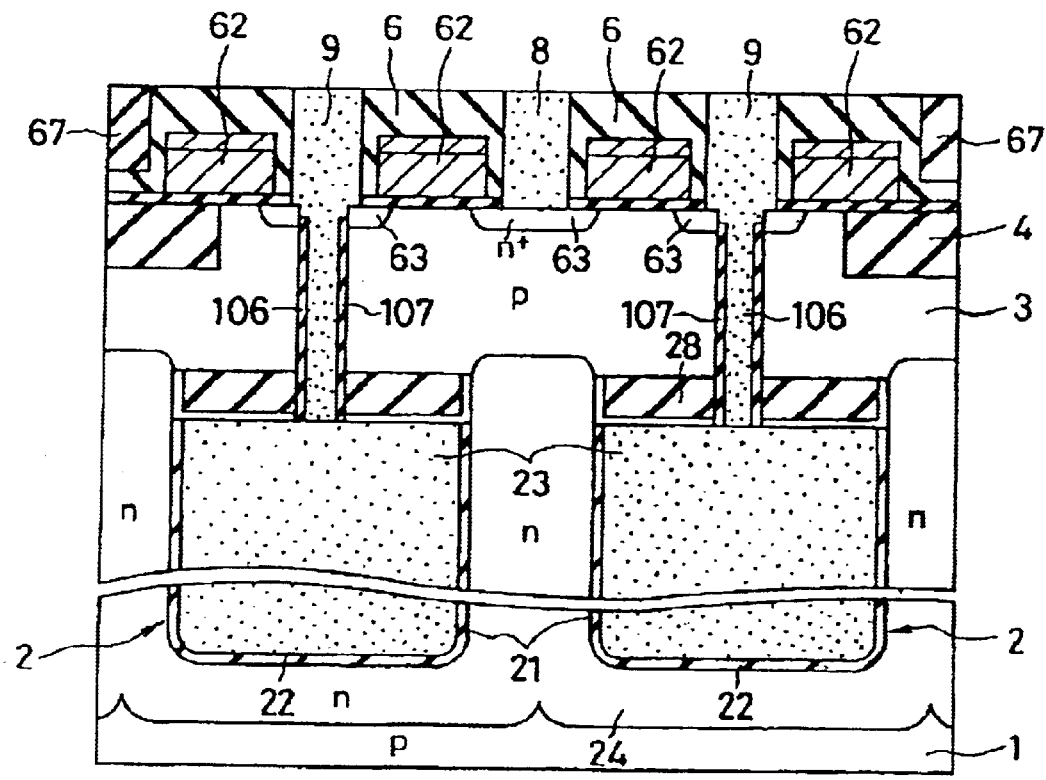

Subsequently, arsenic doped or phosphor doped polycrystalline silicon is deposited and planarized by CMP, and a capacitor contact layer 9 and a bit line contact layer 8 are simultaneously buried as shown in FIG. 26D.

Then, bit lines and metal wirings are formed to complete the DRAM in a manner similar to the previous embodiments.

According to the thirteenth embodiment, the capacitor contact layer 9 has its upper portion in contact with the surface of the n-type diffusion layer 63 exposed in the sidewall oxide film removing step after the contact holes have been opened, and serves as a surface strap. Specifically, the element areas have empty regions formed around the contact holes, and the surface straps are formed simultaneously with the bit line contacts.

Next, a fourteenth embodiment of the present invention will be described.

The previous embodiments employ the silicon layer 3 epitaxially formed on the substrate in which the capacitors have been formed, as a semiconductor layer for forming the active element areas. On the other hand, the fourteenth embodiment employs a direct bonding technique for bonding a silicon substrate on a silicon substrate in which capacitors have been formed, in order to use a semiconductor layer exhibiting an improved crystallinity as active element areas. A contact layer is buried in a SOI substrate resulting from the bonding, for connection to capacitor nodes. A silicon layer is further epitaxially grown on the SOI substrate to form active element areas.

Figure 27:
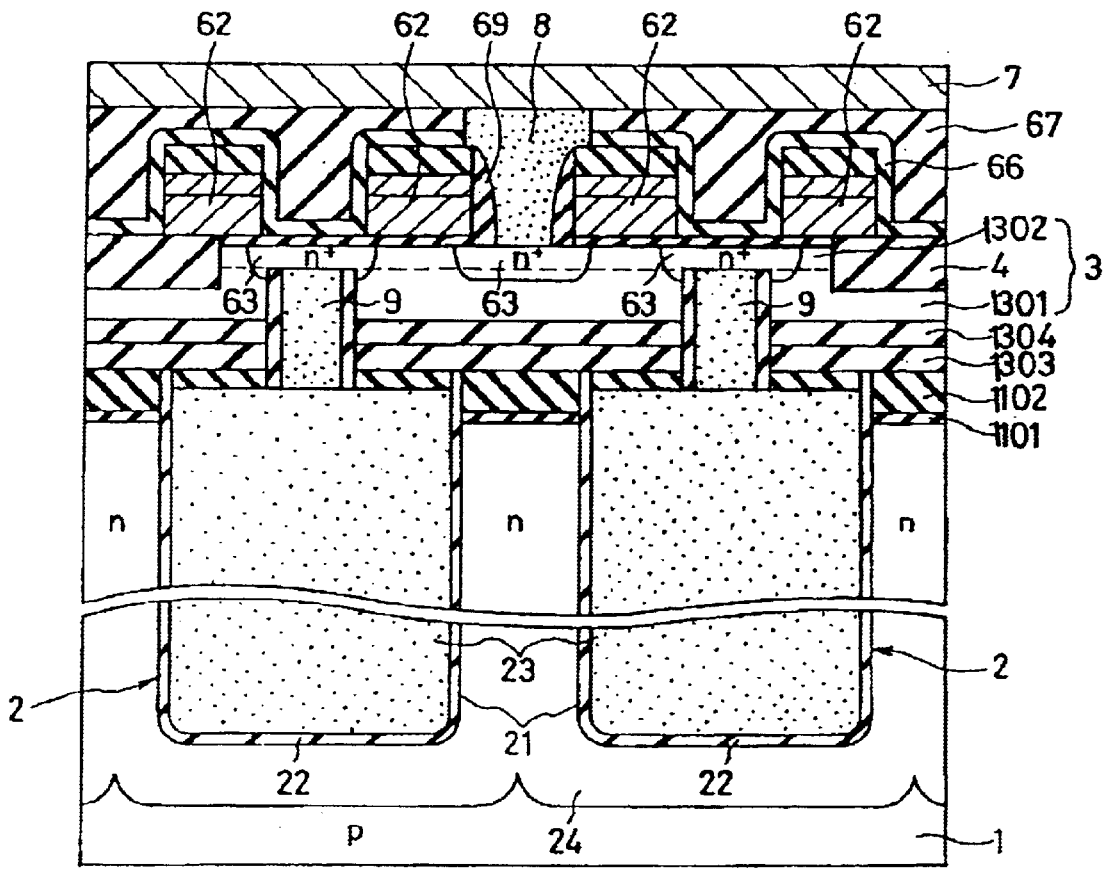
FIG. 27 is a cross-sectional view which illustrate a semiconductor memory device in accordance with a fourteenth embodiment of the present invention.

FIG. 27 shows the cross-sectional structure of a DRAM according to the fourteenth embodiment. The layout for capacitors 2 is identical to that of the fourth embodiment or the sixth embodiment. While the shown capacitor structure is similar to that of the fifth embodiment, the capacitor structure as shown in the fourth embodiment may be employed.

In the structure of FIG. 27, the boundary between oxide films 1303, 1304 is a substrate bonding surface, and a silicon layer (SOI layer) 1301 on the oxide films is a bulk silicon layer which is left after a bonded substrate has been ground. The oxide films 1303, 1304 serve as a substrate isolation insulating film. Specific manufacturing steps for forming this structure will be described below with reference to FIGS. 28A to 28F.

Figure 28A:
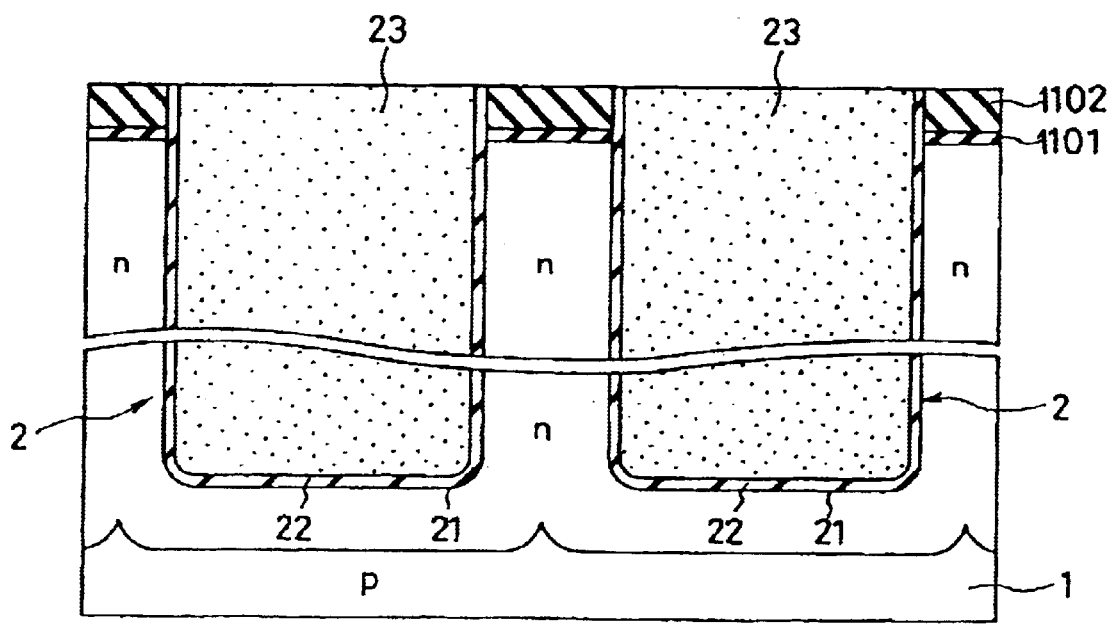
FIGS. 28A–28F are cross-sectional views which illustrate a method of manufacturing the semiconductor memory device of FIG. 27.

A silicon substrate 1 is a p-type silicon substrate having a (100) orientation, and an impurity concentration approximately in a range of 1 to $5\times10^{15}$ cm$^{-3}$ (or an epitaxial substrate with a p-type epitaxial layer grown on the surface in a thickness of approximately 1 $\mu$m). A peripheral circuit region, not shown, of the substrate 1 is formed with an n-type well and a p-type well in a PMOS transistor area and an NMOS transistor area, respectively. Then, capacitors 2 are formed in a memory cell array region, as shown in FIG. 28A, in a manner similar to the previous embodiments. A capacitor node layer 23 of each capacitor 2 is buried up to a surface position coplanar with the surface of a silicon nitride film 1102 used as a mask for forming trenches.

Figure 28B:
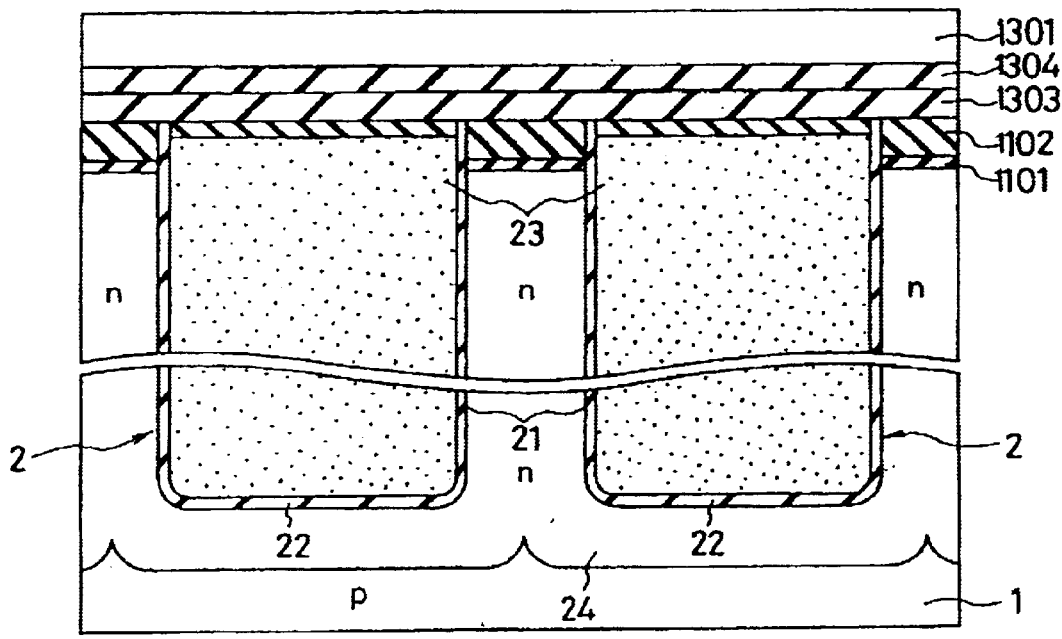

Subsequently, as shown in FIG. 28B, the surface of the capacitor node layer 23 is covered with a cap insulating film 28. The cap insulating film 28 may be formed using a CVD oxide film, a thermally oxidized film or a silicon nitride film. Next, a CVD silicon oxide film 1303 is formed for planarizing the substrate covered with the cap insulating film 28. Specifically, a silicon oxide film is deposited in a thickness of approximately 300 nm, and planarized by CMP.

Subsequently, the SOI layer is formed. Specifically, a second silicon substrate is provided, and a thermally oxidized film is formed on the surface of the second silicon substrate in a thickness of approximately 10 nm as an insulating film (the oxide film 1304 shown in FIG. 28B) for bonding. Further, a BPSG (or CVD SiO$_2$) film is further preferably deposited in a thickness of approximately 200 nm and planarized. Then, the second silicon substrate is put on the first silicon substrate 1 such that the oxide film 1304 formed on the second silicon substrate is brought into contact with the oxide film 1303, and the two silicon substrates are directly bonded under a heating condition at approximately 900° C. The BPSG film is preferably used as the oxide film 1304 because a good adhesivity is provided at a relatively low temperature, etch stop is readily controlled in the subsequent contact hole forming step when a silicon nitride film is used for the cap insulating film 28, and the like.

Subsequently, the bonded second silicon substrate is ground, and etched to remain as the silicon layer 1301 of approximately 150 nm in thickness, thereby resulting in the SOI substrate. FIG. 28B shows the resulting structure. The surface of the silicon layer 1301 of the SOI substrate is mirror polished so as to endure the subsequent formation of transistors. It should be noted that the method of forming the SOI substrate is not limited to the foregoing example, but any other suitable method may be employed such as a method using ion implantation, and the like.

Figure 28C:
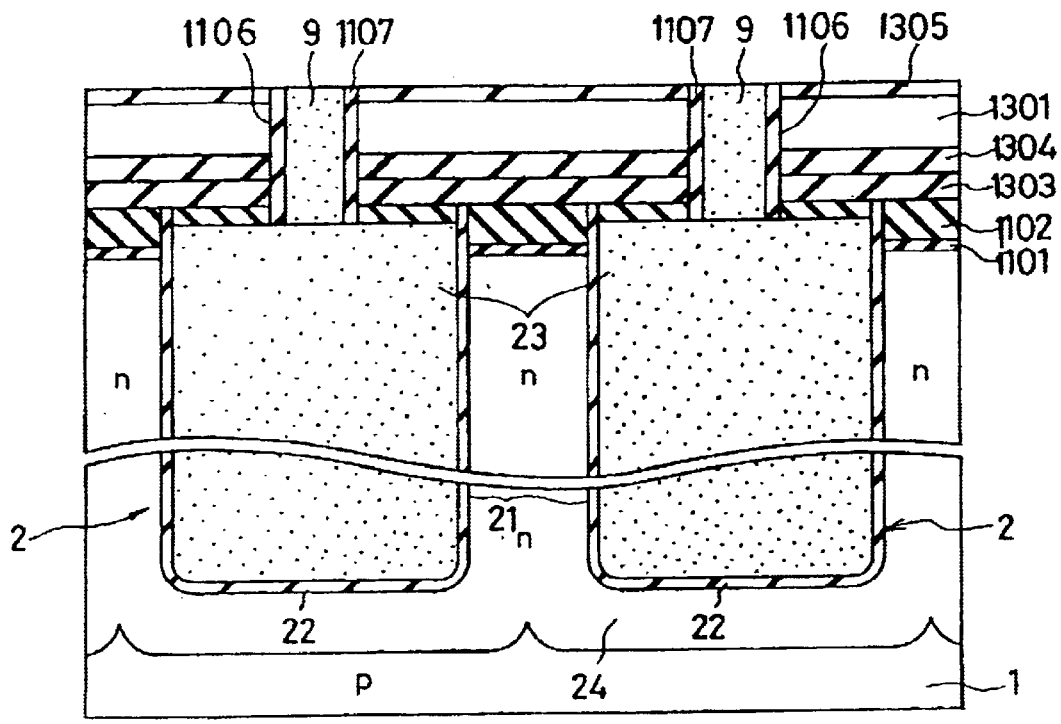

Next, as shown in FIG. 28C, a silicon oxide film 1305 is formed on the surface of the silicon layer 1301 in a thickness of approximately 50 nm, for example, by a thermal oxidization method. Then, contact holes 1106 for the capacitor node layer 23 are formed in the regions of the capacitors 2 through lithography and RIE-based etching. The oxidized layer 1305 prevents contamination on the surface of the silicon layer 1301 in a resist process and an etching process. The contact holes 1106 are formed by first etching the silicon layer 1301, etching the exposed oxide films 1304, 1303, and further etching the cap insulating film 28 to expose the surface of the capacitor node layer 23. When a silicon nitride film is used as the cap insulating film 28 in this step, this silicon nitride film serves as a stopper when the oxide films 1304, 1303 are etched.

Next, a CVD silicon oxide film 1107 having a thickness of approximately 30 nm formed on the sidewall of each of the formed contact holes 1106. This is formed by depositing a CVD silicon oxide film in the overall contact hole 1106 and leaving it only on the sidewall by RIE. Then, an arsenic doped polycrystalline silicon is deposited, and buried as a contact layer 9 in each contact hole 1106 by CMP and RIE. During the CMP and RIE, the oxide film 1305 protects the silicon layer 1301. The resulting structure is shown in FIG. 28C. The contact layer 9 is formed to protrude, for example, approximately 0.4 $\mu$m from the surface of the silicon substrate 1.

Figure 28D:
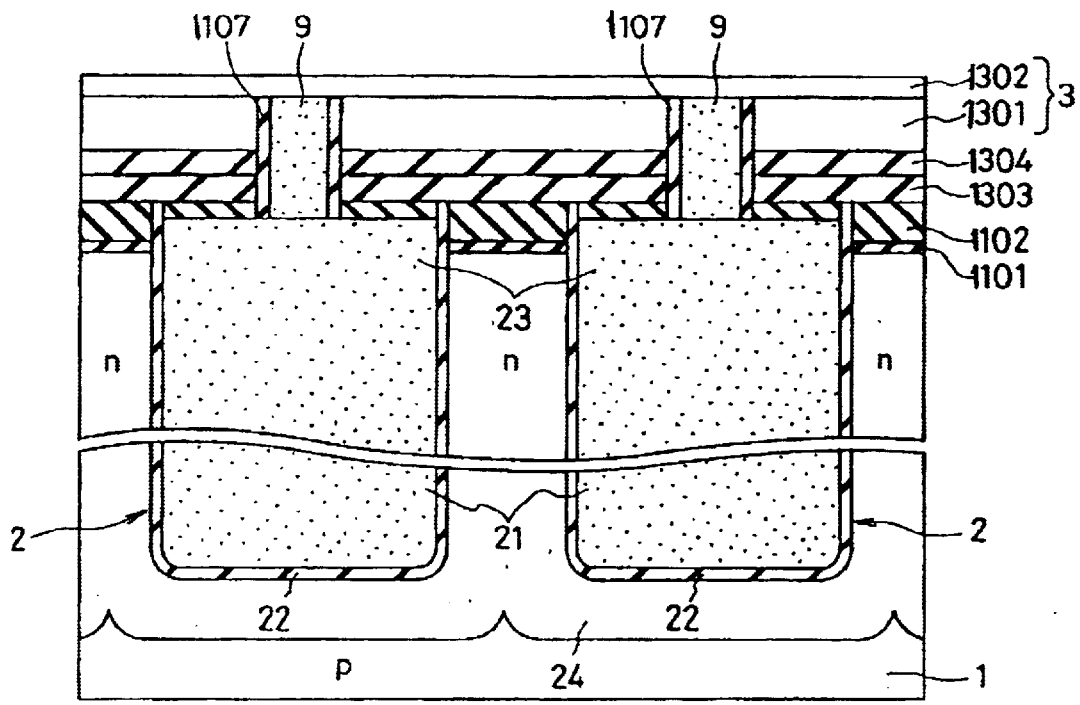

Subsequently, the oxide film 1305 is etched or removed, and a silicon layer 1302 is epitaxially grown on the silicon layer 1301 in a thickness of approximately 60 nm, as shown in FIG. 28D. The silicon layer 1301 on the SOI substrate, and the silicon layer 1302 epitaxially grown on the silicon layer 1301 correspond to the silicon layer 3 for forming active elements in the respective embodiments described above.

The silicon layer 1302 may be ground by an appropriate method such as CMP to have a planar surface without ruggedness. The planar silicon layer 1302 can eliminate the ruggedness due to the difference in thickness between portions grown on the contact layers 9, which are polycrystalline silicon, in the contact holes 1106 and a portion grown on the single crystal silicon layer 1301, thereby improving the quality of transistors subsequently formed therein.

Also, though not shown, channel ions may be deeply implanted to prevent punch-through of transistors before the step of growing the silicon layer 1302. This can form an ideal channel impurity profile for preventing the punch-through in transistor areas.

Figure 28E:
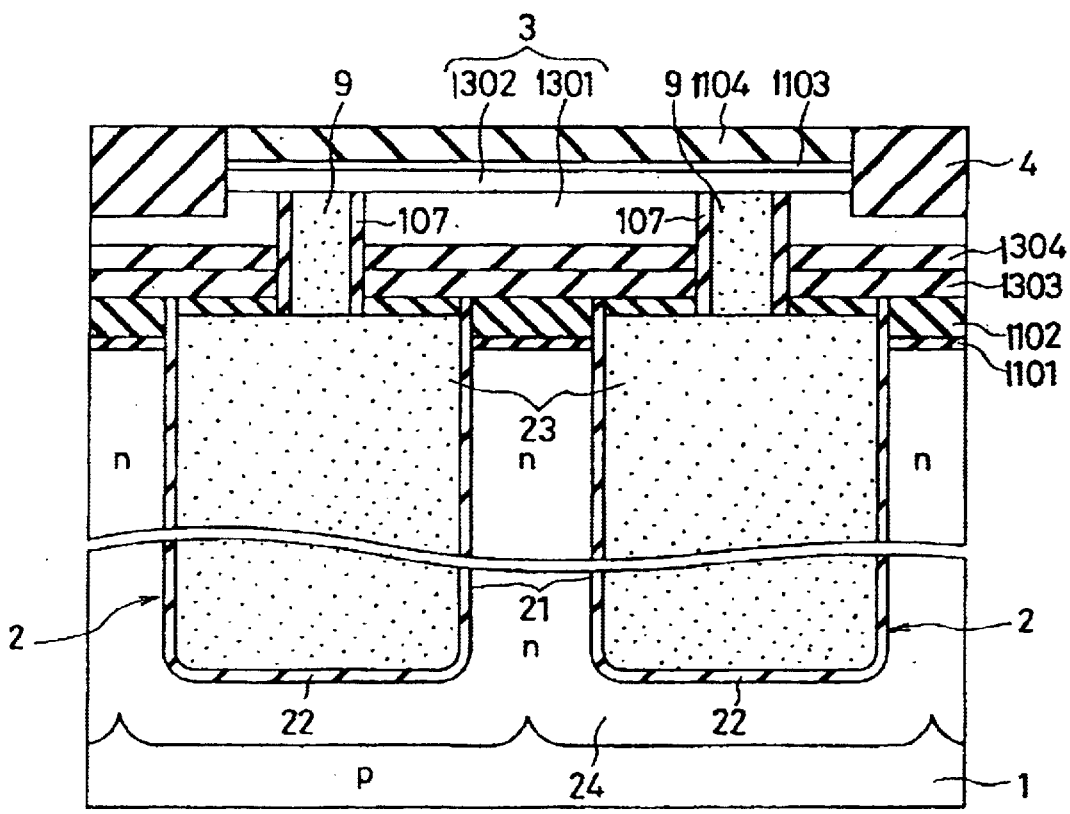

Subsequently, as shown in FIG. 28E, an element isolation insulating film 4 is formed by the STI technique. More specifically, a mask is formed of a laminate of a silicon oxide film 1103 and a silicon nitride film 1104, and patterned. After trenches are formed to a depth of approximately 20 nm into the silicon layers 1301, 1302 by RIE, a CVD-TEOS oxide film is deposited and planarized to bury the element isolation insulating film 4.

Figure 28F:
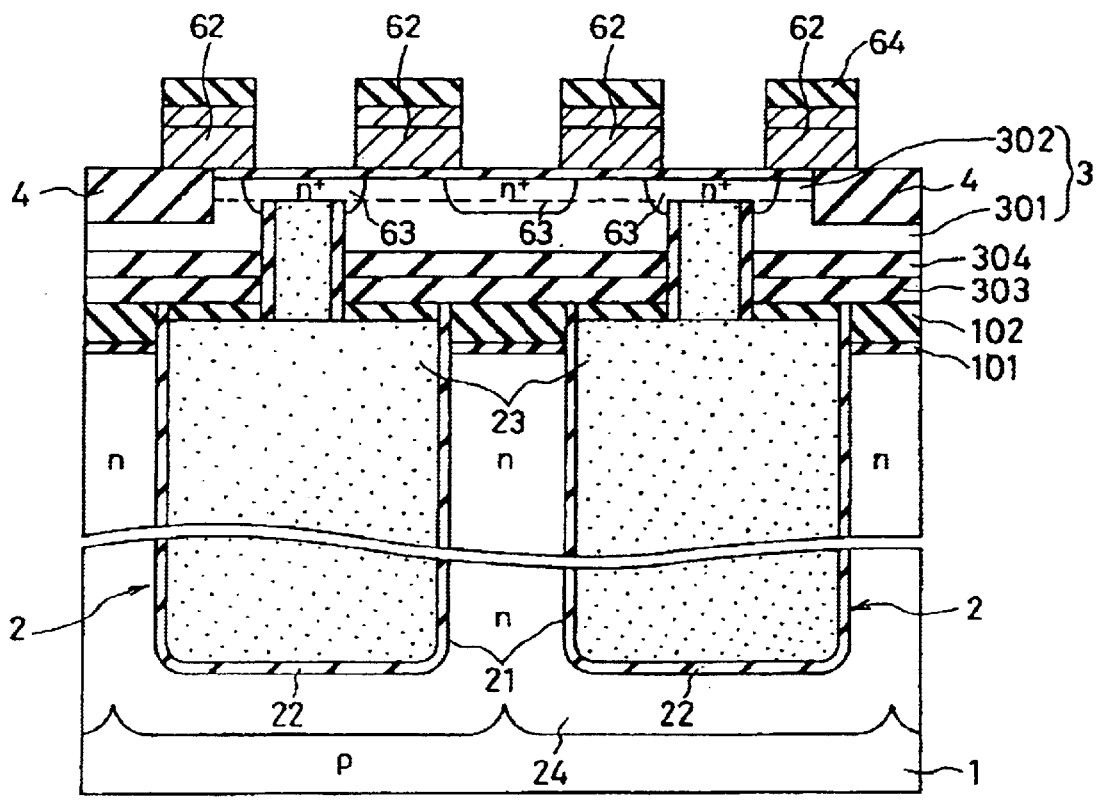

Next, the removal of the silicon nitride film 1104 and the oxide film 1103 is followed by normal transistor manufacturing steps. Specifically, as shown in FIG. 28F, gate electrodes 62 are formed through a gate insulating film, and an n-type diffusion layer 63, which is subsequently formed into sources and drains, is formed. Each of the gate electrodes 62 is a laminate of a polycrystalline silicon film (50 nm in thickness) and a tungsten silicide film (50 nm in thickness). Specifically, a silicon nitride film 64 is formed on the laminated films and patterned as a cap insulating film, and used as a mask to sequentially etch the tungsten silicide film and the polycrystalline silicon film. However, the gate electrode may be made of a single polycrystalline silicon layer, or another laminate structure.

While FIG. 28F shows a normal single source/drain structure, this structure may be replaced with an LDD structure. In this case, in the state shown in FIG. 28F, phosphor ions are implanted, for example, at acceleration voltages of 70 keV and a dose of about $4 \times 10^{13}$ cm$^{-2}$, to form a low concentration n-type diffusion layer. Then, as shown in FIG. 27, with sidewall insulating films 69 formed on sidewalls of the gate electrodes 62, arsenic ions are implanted, for example, at acceleration voltages of 30 KeV and a dose of $5 \times 10^{15}$ cm$^{-2}$ to form a high concentration n-type diffusion layer.

In this transistor forming step, the diffusion layer 63 connected to an associated capacitor, of two diffusion layers 63 formed in one element area, is positioned at the contact layer 9 just above the capacitor 2, so that its bottom is connected to the contact layer 9. Actually, upward diffusion of n-type impurities from the contact layer 9, in combination of the source/drain n-type diffusion layer, allows for a low resistance connection.

After the formation of the transistors, as shown in FIG. 27, a CVD silicon nitride film 66 is deposited over the entire surface in a thickness of 30 nm, and a BPSG film is deposited as an interlayer insulating film 67. After depositing these films, a densifying heat treatment is performed at 800° C. for approximately 30 minutes in an $N_2$ atmosphere. This thermal process may be performed for additional purposes of activating impurities for the sources and drains. When the diffusion depth is limited for the sources and drains, the heat treatment is conducted at a low temperature of approximately 750° C., and a RTA (Rapid Thermal Anneal) process for 950° C. ten seconds is used in combination. Subsequently, the interlayer insulating film 67 is planarized by CMP.

Next, contact holes are opened in bit line contact regions, and arsenic doped polycrystalline silicon is buried for use as a bit line contact layer 8. Then, though not shown, contact holes are formed for source, drain and gate electrodes, and bit lines 7 are formed. Further, an interlayer insulating film is deposited, metal wirings are formed, and then a passivation film is formed over the entire surface to complete the DRAM.

According to the fourteenth embodiment, a combination of the SOI substrate and the epitaxial growth technique can reduce crystal defects in the active element areas in which the transistors are formed overlying the capacitors. More specifically, defects in the gate oxide film of the transistors formed on the capacitors can be suppressed to provide a highly reliable DRAM.

Next, a fifteenth embodiment of the present invention will be described.

In the fourteenth embodiment, the element isolation insulating film 4 is a single-layer buried insulating film which is formed after the silicon layer 1302 has been grown. The fifteenth embodiment, on the other hand, employs an element isolation structure implemented by an STI-based two-stage burying technique.

Figure 29:
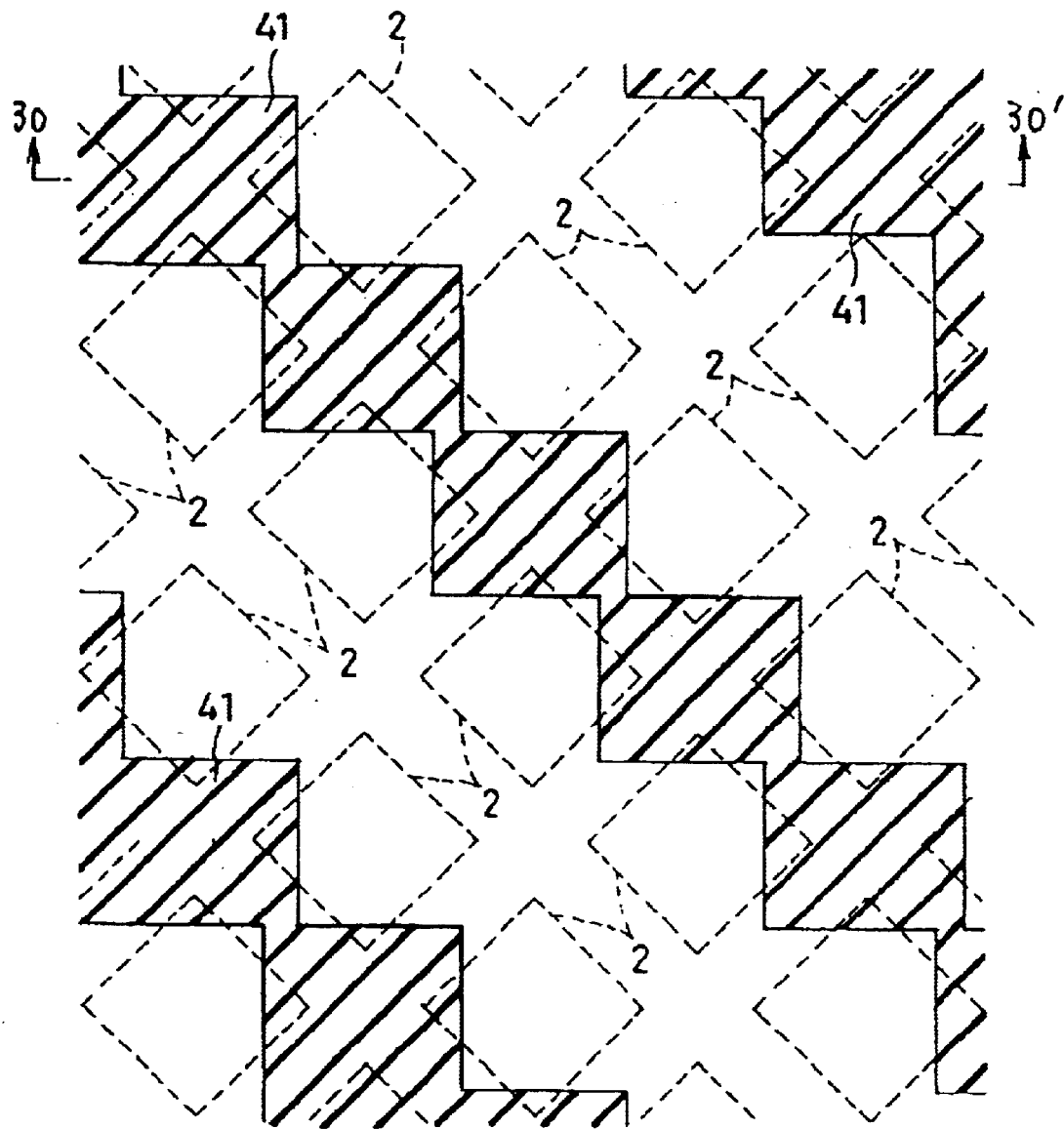
FIG. 29 is a top-down view of a semiconductor memory device in accordance with a fifteenth embodiment of the present invention.
Figure 30:
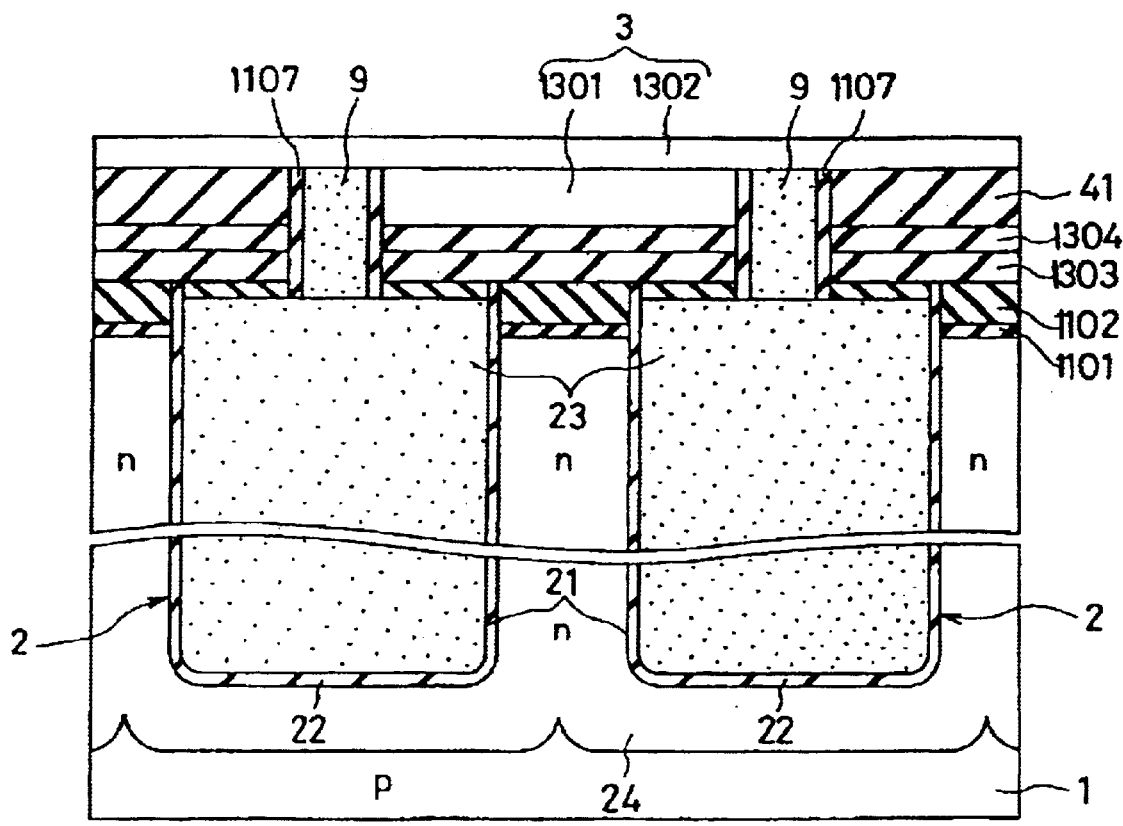
FIG. 30 is a cross-sectional view taken along line 30–30' of FIG. 29.

FIG. 29 is the layout showing how a first element isolation insulating film 41 is buried when the layout of DRAM shown in FIG. 10 is employed, and FIG. 30 is a cross-sectional view showing a silicon layer 1302 which is epitaxially grown after the first element isolation insulating film 41 is formed.

As illustrated in FIG. 29, the first element isolation insulating film 41 is only buried in the element isolation regions in the x-direction, so that the elements are not isolated in the y-direction at this stage. As shown in FIG. 30, the first element isolation insulating film 41 is buried to such a depth that it reaches an oxide film 1304 on the bottom of the silicon layer 1301. Then, contact holes for connection to a capacitor node layer is formed extending through a portion of the first element isolation insulating film 41. After sidewall insulating films 1107 are formed, a contact layer 9 is buried in each contact holes. Then, a silicon layer 1302 is epitaxially grown.

Figure 31:
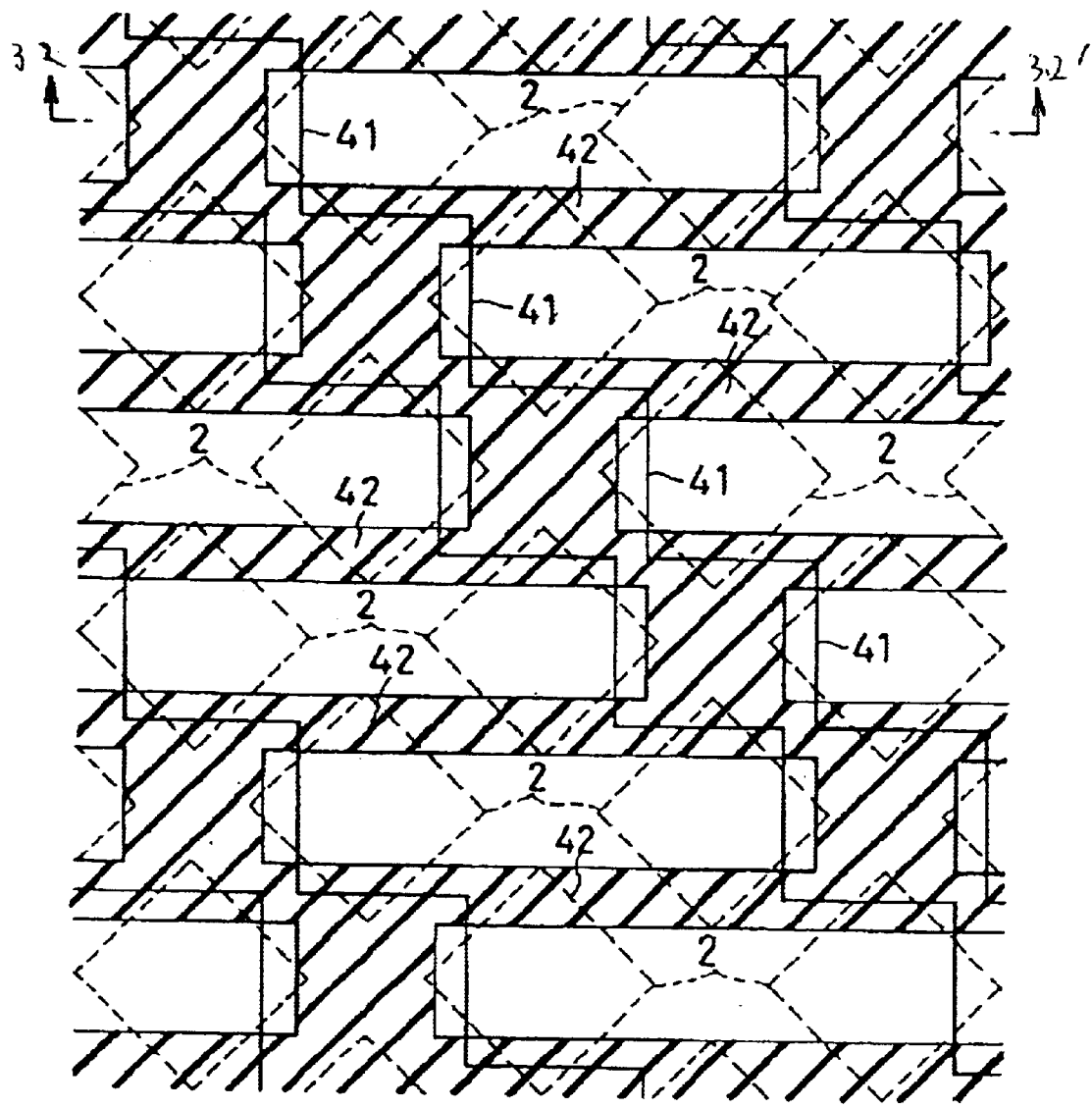
FIG. 31 is another top-down view of the semiconductor memory device in accordance with the fifteenth embodiment of the present invention.
Figure 32:
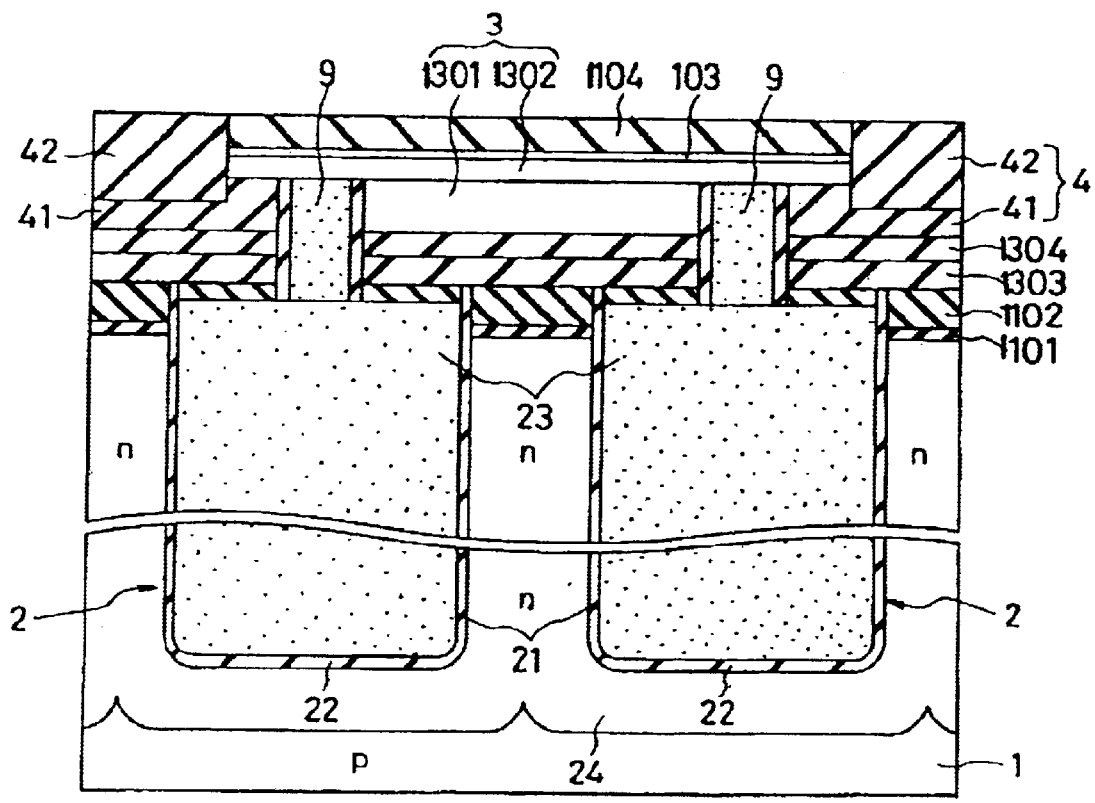
FIG. 32 is a cross-sectional view which illustrate the semiconductor memory device of FIG. 29.

Subsequently, a second element isolation insulating film 42 is buried likewise by the STI technique. FIG. 31 shows the layout of the second element isolation insulating film 42. Specifically, the second element isolation insulating film 42 is buried to exist outside the edges of the first element isolation insulating film 41 in the element isolation regions in the x-direction, with all the element isolation regions joined in the x- and y-directions. FIG. 32 shows a cross-sectional view of FIG. 31, wherein the second element isolation insulating film 42 is buried shallower than the first element isolation insulating film 41.

Figure 33:
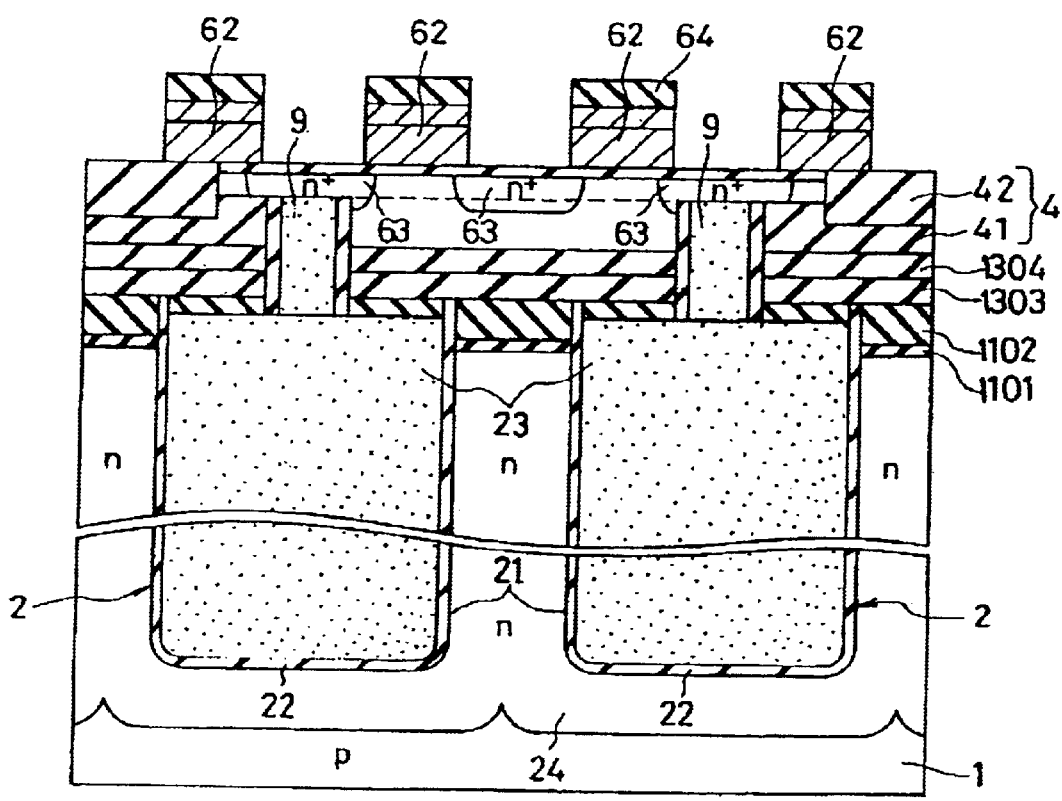
FIG. 33 is a cross-sectional view which illustrate the semiconductor memory device of FIG. 29.

FIG. 33 is a cross-sectional view showing transistors formed on a substrate which employs a two-step element isolation insulating film structure as described above.

According to the fifteenth embodiment, the deep first element isolation insulating film 41, which reaches the oxide film on the bottom, is formed in the element isolation regions in the x-direction opposite to capacitor nodes of adjacent memory cells, thereby making it possible to reliably prevent short-circuiting between capacitor nodes adjoining in the x-direction, and a leakage. Also, since the second element isolation insulating film 42 is formed outside the edges of the first element isolation insulating film 41 in the x-direction, as is apparent from FIG. 32, a large area can be ensured for connection of an n-type diffusion layer 63 of the transistor with the contact layer 9. Thus, even with variations in the manufacturing steps, a connection of a capacitor to a transistor can be made with a low resistance and stability.

It should be noted that the two-stage STI-based element isolation structure as described above is not limited to the DRAM but may be applied to a variety of other semiconductor integrated circuits. Specifically, an integrated circuit exhibiting desired characteristics can be provided by forming a shallow STI isolation film in regions in which elements are isolated while a constant electric conduction is maintained, and forming a deep STI isolation film reaching an insulating film on the bottom in regions in which the electric conduction is desirably shut off completely for preventing leakage and latch-up.

While the invention has been described in detail with reference to the appended drawings, the invention is limited in scope only by the claims. Moreover, any patent or publication cited herein should be construed to be incorporated by reference as to any subject matter deemed essential to the present disclosure.

What is claimed is:

1. A semiconductor memory device comprising:
   a semiconductor substrate;
   a plurality of trench capacitors formed in said semiconductor substrate and arranged at a regular pitch;
   a semiconductor layer formed on said semiconductor substrate in which said trench capacitors are formed;
   an element isolation insulating film buried in said semiconductor layer to define a plurality of active element areas each spreading over two adjacent trench capacitors;
   a plurality of transistors formed two by two in each of said plurality of active element areas, such that two transistors share one of source/drain diffusion layers, and the other of said source/drain diffusion layers is positioned over trenches of two adjacent trench capacitors, said transistors each having a gate connected to a word line continuous in one direction, each of said trenches of two adjacent trench capacitors is located under the gate of a corresponding transistor;
   a first contact layer for connecting the other of said source/drain diffusion layers of each of said transistors to a capacitor node layer of corresponding one of said trench capacitors;
   a bit line provided to intersect said word lines; and
   a second contact layer for connecting one of said source/drain diffusion layers to said bit line.

2. The semiconductor memory device according to claim 1, wherein said trench capacitors are each shaped substantially in a square having one side equal to 2F, where F is a minimum processing dimension, the diagonals of said squares are oriented in two orthogonal directions of said word line and said bit line, and said trench capacitors are arranged at a regular pitch of 1F or less in directions of two orthogonal sides of said squares.

3. The semiconductor memory device according to claim 1, wherein said trench capacitors are each shaped substantially in a square having one side equal to 2F, where F is a minimum processing dimension, the sides of said squares are oriented in two orthogonal directions of said word line and said bit line, and said trench capacitors are arranged at a regular pitch of 2F in the bit line direction, and shifted sequentially at a one-half pitch on adjacent bit lines.

4. The semiconductor memory device according to claim 2, wherein said active element areas are arranged at a regular pitch in said bit line direction and shifted sequentially by a one-quarter pitch on adjacent bit lines.

5. The semiconductor memory device according to claim 1, wherein said contact layer is buried such that said contact layer extends through the other of said source/drain diffusion layers to reach said capacitor node layer.

6. The semiconductor memory device according to claim 1, wherein:
   said semiconductor layer comprises a first epitaxially grown layer and a second epitaxially grown layer formed on said first epitaxially grown layer;
   said contact layer is formed such that said contact layer is buried in said first epitaxially grown layer to reach said capacitor node layer; and
   the other of said source/drain diffusion layers has a bottom surface connected to a top surface of said contact layer.

7. The semiconductor memory device according to claim 1, wherein said contact layer is formed such that said contact layer is buried in said semiconductor layer to reach said capacitor node layer, and the other of said source/drain diffusion layers is connected to said contact layer through a buried diffusion layer formed in an upper side portion of said contact layer.

8. The semiconductor memory device according to claim 1, wherein said contact layer is formed such that said contact layer is buried in said semiconductor layer to reach said capacitor node, and the other of said source/drain diffusion layers is connected to a top surface of said contact layer through a connection conductor formed on a surface thereof.

9. The semiconductor memory device according to claim 1, wherein:
   said semiconductor layer comprises a bulk semiconductor layer of another semiconductor substrate bonded to said semiconductor substrate in which said capacitors are formed, and an epitaxially grown layer formed on said bulk semiconductor layer;

said contact layer is formed such that said contact layer is buried in said bulk semiconductor layer to reach said capacitor node layer; and the other of said source/drain diffusion layers has a bottom surface connected to a top surface of said contact layer.

10. The semiconductor memory device according to claim 9, wherein:

a substrate isolation insulating film is interposed on a bonding surface of said semiconductor substrate and said other semiconductor substrate bonded thereto;

said element isolation insulating film includes a first element isolation insulating film buried in element isolation regions in the bit line direction to a depth at which said first element isolation insulating film reaches said substrate isolation insulating film; and a second element isolation insulating film partially overlapping said first element isolation insulating film and buried in element isolation regions in the bit line direction and word line direction to a depth shallower than said first element isolation insulating film.

11. A semiconductor device comprising:

a semiconductor substrate;

an element isolation insulating film including a first insulating film buried to define active element areas inside said semiconductor substrate, and a second insulating film shallower and wider than said first insulating film, said second insulating film buried inside said semiconductor substrate and positioned over the first insulating film; and elements formed in said active element areas defined by said element isolation insulating film, said elements including a capacitor node formed in a trench in said semiconductor substrate, and a contact layer contacting an upper surface of said capacitor node, wherein said contact layer is formed in a contact hole in said semiconductor substrate.

12. The device of claim 11, wherein said contact layer contacts an underside of second insulating film, and a side of the first insulating film.

* * * * *